United States Patent
Poznanovic et al.

(10) Patent No.: US 7,703,085 B2
(45) Date of Patent: *Apr. 20, 2010

(54) PROCESS FOR CONVERTING PROGRAMS IN HIGH-LEVEL PROGRAMMING LANGUAGES TO A UNIFIED EXECUTABLE FOR HYBRID COMPUTING PLATFORMS

(75) Inventors: Daniel Poznanovic, Colorado Springs, CO (US); Jeffrey Hammes, Colorado Springs, CO (US); Lisa Krause, Minneapolis, MN (US); Jon Steidel, Minneapolis, MN (US); David Barker, Salinas, CA (US); Jeffrey Paul Brooks, St. Louis, MN (US)

(73) Assignee: SRC Computers, Inc., Colorado Springs, CO (US)

( * ) Notice: Subject to any disclaimer, the term of this patent is extended or adjusted under 35 U.S.C. 154(b) by 1206 days.

This patent is subject to a terminal disclaimer.

(21) Appl. No.: 11/243,498

(22) Filed: Oct. 4, 2005

(65) Prior Publication Data

US 2006/0041872 A1 Feb. 23, 2006

Related U.S. Application Data

(63) Continuation of application No. 10/285,299, filed on Oct. 31, 2002, now Pat. No. 6,983,456.

(51) Int. Cl.
*G06F 9/45* (2006.01)
*G00O 9/44* (2006.01)
(52) U.S. Cl. .................. 717/140; 717/141; 717/154
(58) Field of Classification Search ......... 717/140–146, 717/154–156
See application file for complete search history.

(56) References Cited

U.S. PATENT DOCUMENTS 4,885,684 A * 12/1989 Austin et al. ................. 717/149

5,175,856 A  12/1992 Van Dyke et al.

(Continued)

FOREIGN PATENT DOCUMENTS

WO        WO 00/38087 A    6/2000

OTHER PUBLICATIONS

Burnim et al, "Heuristic for scalable dynamic test generation", IEEE, pp. 443-446, 2008.*

(Continued)

*Primary Examiner*—Anil Khatri
(74) *Attorney, Agent, or Firm*—William J. Kubida; Michael C. Martensen; Hogan & Hartson LLP

(57) ABSTRACT

A system and method for compiling computer code written to conform to a high-level language standard to generate a unified executable containing the hardware logic for a reconfigurable processor, the instructions for a traditional processor (instruction processor), and the associated support code for managing execution on a hybrid hardware platform. Explicit knowledge of writing hardware-level design code is not required since the problem can be represented in a high-level language syntax. A top-level driver invokes a standard-conforming compiler that provides syntactic and semantic analysis. The driver invokes a compilation phase that translates the CFG representation being generated into a hybrid control-flow-dataflow graph representation representing optimized pipelined logic which may be processed into a hardware description representation. The driver invokes a hardware description language (HDL) compiler to produce a netlist file that can be used to start the place-and-route compilation needed to produce a bitstream for the reconfigurable computer. The programming environment then provides support for taking the output from the compilation driver and combining all the necessary components together to produce a unified executable capable of running on both the instruction processor and reconfigurable processor.

5 Claims, 36 Drawing Sheets

U.S. PATENT DOCUMENTS

| | | | |
|---|---|---|---|
| 5,230,057 A | | 7/1993 | Shido et al. |
| 5,293,631 A | * | 3/1994 | Rau et al. ............... 717/154 |
| 5,570,040 A | | 10/1996 | Lytle et al. |
| 5,655,122 A | | 8/1997 | Wu |
| 5,675,803 A | | 10/1997 | Preisler et al. |
| 5,737,766 A | | 4/1998 | Tan |
| 5,892,962 A | | 4/1999 | Cloutier |
| 5,903,771 A | | 5/1999 | Sgro et al. |
| 5,926,636 A | | 7/1999 | Lam et al. |
| 5,933,642 A | | 8/1999 | Greenbaum et al. |
| 5,937,196 A | * | 8/1999 | Schmidt et al. ........... 717/155 |
| 5,946,492 A | * | 8/1999 | Bates ..................... 717/156 |
| 5,991,539 A | * | 11/1999 | Williams ................. 717/143 |
| 6,023,755 A | | 2/2000 | Casselman |
| 6,052,773 A | | 4/2000 | DeHon et al. |
| 6,076,152 A | | 6/2000 | Huppenthal et al. |
| 6,077,315 A | * | 6/2000 | Greenbaum et al. ........ 717/157 |
| 6,079,032 A | | 6/2000 | Peri |
| 6,175,948 B1 | * | 1/2001 | Miller et al. ............. 716/7 |
| 6,192,439 B1 | | 2/2001 | Grunewald et al. |
| 6,226,776 B1 | | 5/2001 | Panchul et al. |
| 6,226,789 B1 | * | 5/2001 | Tye et al. ................ 717/138 |
| 6,286,135 B1 | | 9/2001 | Santhanam |
| 6,360,355 B1 | | 3/2002 | Nishida et al. |
| 6,526,572 B1 | | 2/2003 | Brauch et al. |
| 6,567,975 B1 | * | 5/2003 | Damron ................... 717/155 |
| 6,594,822 B1 | | 7/2003 | Schweitz et al. |
| 6,631,518 B1 | | 10/2003 | Bortnikov et al. |
| 6,751,792 B1 | * | 6/2004 | Nair ...................... 717/161 |
| 6,839,893 B2 | | 1/2005 | Bates et al. |
| 6,922,830 B1 | * | 7/2005 | Schmidt .................. 717/155 |
| 6,983,456 B2 | * | 1/2006 | Poznanovic et al. ........ 717/133 |
| 7,043,721 B2 | * | 5/2006 | Bates et al. .............. 717/140 |
| 7,100,156 B2 | * | 8/2006 | Archambault ............. 717/159 |
| 7,155,708 B2 | * | 12/2006 | Hammes et al. ........... 717/155 |
| 7,299,458 B2 | * | 11/2007 | Hammes .................. 717/133 |
| 7,500,230 B2 | * | 3/2009 | Edwards et al. ........... 717/141 |

OTHER PUBLICATIONS

Abadi et al,"Control flow integrity", ACM CCS, pp. 340-353, 2005.*

Cota et al, "Control flow graphs as a representation langugaes", ACM, pp. 555-559, 1994.*

Fritz et al, "An overview of hierarchical control flow graph models", IEEE, pp. 1347-1355, 1995.*

Examination Report for EPO Application No. 03759616.0, mailing date Dec. 11, 2008, pp. 3.

W. Bohm, J. Hammes, B. Draper, M. Chawathe, C. Ross, R. Rinker, W. Najjar, Mapping a Single Assignment Programming Language to Reconfigurable Systems, The Journal of Supercomputing, 21, 2002, Kluwer Academic Publishers, Manufactured in The Netherlands, XP007904067, 117-130.

Agarwal, A., et al., "The Raw Compiler Project", pp. 1-12, http://cag-www.lcs.mit.edu/raw, Proceedings of the Second SUIF Compiler Workshop, Aug. 21-23, 1997.

Albaharna, Osama, et al., "On the viability of FPGA-based integrated coprocessors", © 1996 IEEE, Publ. No. 0-8186-7548-9/96, pp. 206-215.

Amerson, Rick, et al., "Teramac—Configurable Custom Computing", © 1995 IEEE, Publ. No. 0-8186-7086-X/95, pp. 32-38.

Barthel, Dominique Aug. 25-26, 1997, "PVP a Parallel Video coProcessor", Hot Chips IX, pp. 203-210.

Bertin, Patrice, et al., "Programmable active memories: a performance assessment", © 1993 Massachusetts Institute of Technology, pp. 88-102.

Bittner, Ray, et al., "Computing kernels implemented with a wormhole RTR CCM", © 1997 IEEE, Publ. No. 0-8186-8159-4/97, pp. 98-105.

Buell, D., et al. "Splash 2: FPGAs in a Custom Computing Machine—Chapter 1—Custom Computing Machines: An Introduction", pp. 1-11, http://www.computer.org/espress/catalog/bp07413/spls-ch1.html (originally believed published in J. of Supercomputing, vol. IX, 1995, pp. 219-230.

Casselman, Steven, "Virtual Computing and The Virtual Computer", © 1993 IEEE, Publ. No. 0-8186-3890-7/93, pp. 43-48.

Chan, Pak, et al., "Architectural tradeoffs in field-programmable-device-based computing systems", © 1993 IEEE, Publ. No. 0-8186-3890-7/93, pp. 152-161.

Clark, David, et al., "Supporting FPGA microprocessors through retargetable software tools", © 1996 IEEE, Publ. No. 0-8186-7548-9/96, pp. 195-103.

Cuccaro, Steven, et al., "The CM-2X: a hybrid CM-2/Xilink prototype", © 1993 IEEE, Publ. No. 0-8186-3890-7/93, pp. 121-130.

Culbertson, W. Bruce, et al., "Exploring architectures for volume visualization on the Teramac custom computer", © 1996 IEEE, Publ. No. 0-8186-7548-9/96, pp. 80-88.

Culbertson, W. Bruce, et al., "Defect tolerance on the Teramac custom computer", © 1997 IEEE, Publ. No. 0-8186-8159-4/97, pp. 116-123.

Dehon, Andre, "DPGA-Coupled microprocessors: commodity IC for the early $21^{st}$ century", © 1994 IEEE, Publ. No. 0-8186-5490-2/94, pp. 31-39.

Dehon, A., et al., "MATRIX A Reconfigurable Computing Device with Configurable Instruction Distribution", Hot Chips IX, Aug. 25-26, 1997, Stanford, California, MIT Artificial Intelligence Laboratory.

Dhaussy, Philippe, et al., "Global control synthesis for an MIMD/FPGA machine", © 1994 IEEE, Publ. No. 0-8186-5490-2/94, pp. 72-81.

Elliott, Duncan, et al., "Computational Ram: a memory-SIMD hybrid and its application to DSP", © 1992 IEEE, Publ. No. 0-7803-0246-X/92, pp. 30.6.1-30.6.4.

Fortes, Jose, et al., "Systolic arrays, a survey of seven projects", © 1987 IEEE, Publ. No. 0018-9162/87/0700-0091, pp. 91-103.

Gokhale, M., et al., "Processing in Memory: The Terasys Massively Parallel PIM Array" © Apr. 1995, IEEE, pp. 23-31.

Gunther, Bernard, et al., "Assessing Document Relevance with Run-Time Reconfigurable Machines", © 1996 IEEE, Publ. No. 0-8186-7548-9/96, pp. 10-17.

Hagiwara, Hiroshi, et al., "A dynamically microprogrammable computer with low-level parallelism", © 1980 IEEE, Publ. No. 0018-9340/80/07000-0577, pp. 577-594.

Hartenstein, R. W., et al. "A General Approach in System Design Integrating Reconfigurable Accelerators," http://xputers.informatik.uni-kl.de/papers/paper026-1.html, IEEE 1996 Conference, Austin, TX, Oct. 9-11, 1996.

Hartenstein, Reiner, et al., "A reconfigurable data-driven ALU for Xputers", © 1994 IEEE, Publ. No. 0-8186-5490-2/94, pp. 139-146.

Hauser, John, et al.: "GARP: a MIPS processor with a reconfigurable co-processor", © 1997 IEEE, Publ. No. 0-08186-8159-4/97, pp. 12-21.

Hayes, John, et al., "A microprocessor-based hypercube, supercomputer", © 1986 IEEE, Publ. No. 0272-1732/86/1000-0006, pp. 6-17.

Herpel, H. -J., et al., "A Reconfigurable Computer for Embedded Control Applications", © 1993 IEEE, Publ. No. 0-8186-3890-7/93, pp. 111-120.

Hogl, H., et al., "Enable++: A second generation FPGA processor", © 1995 IEEE, Publ. No. 0-8186-7086-X/95, pp. 45-53.

King, William, et al., "Using MORRPH in an industrial machine vision system". © 1996 IEEE, Publ. No. 08186-7548-9/96, pp. 18-26.

Manohar, Swaminathan, et al., "A pragmatic approach to systolic design", © 1988 IEEE, Publ. No. CH2603-9/88/0000/0463, pp. 463-472.

Mauduit, Nicolas, et al., "Lneuro 1.0: a piece of hardware LEGO for building neural network systems," © 1992 IEEE, Publ. No. 1045-9227/92, pp. 414-422.

Mirsky, Ethan A., "Coarse-Grain Reconfigurable Computing", Massachusetts Institute of Technology, Jun. 1996.

Mirsky, Ethan, et al., "MATRIX: A Reconfigurable Computing Architecture with Configurable Instruction Distribution and Deployable Resources", © 1996 IEEE, Publ. No. 0-8186-7548-9/96, pp. 157-166.

Morley, Robert E., Jr., et al., "A Massively Parallel Systolic Array Processor System", © 1988 IEEE, Publ. No. CH2603-9/88/0000/0217, pp. 217-225.

Patterson, David, et al., "A case for intelligent DRAM: IRAM", Hot Chips VIII, Aug. 19-20, 1996, pp. 75-94.

Peterson, Janes, et al., "Scheduling and partitioning ANSI-C programs onto multi-FPGA CCM architectures", © 1996 IEEE, Publ. No. 0-8186-7548-9/96, pp. 178-187.

Schmit, Herman, "Incremental reconfiguration for pipelined applications," © 1997 IEEE, Publ. No. 0-8186-8159-4/97, pp. 47-55.

Sitkoff, Nathan, et al., "Implementing a Genetic Algorithm on a Parallel Custom Computing Machine", Publ. No. 0-8186-7086-X/95, pp. 180-187.

Stone, Harold, "A logic-in-memory computer", © 1970 IEEE, IEEE Transactions on Computers, pp. 73-78, Jan. 1990.

Tangen, Uwe, et al., "A parallel hardware evolvable computer POLYP extended abstract", © 1997 IEEE, Publ. No. 0-8186-8159/4/97, pp. 238-239.

Thornburg, Mike, et al., "Transformable Computers", © 1994 IEEE, Publ. No. 0-8186-5602-6/94, pp. 674-679.

Tomita, Shinji, et al., "A computer low-level parallelism QA-2", © 1986 IEEE, Publ. No. 0-0384-7495/86/0000/0280, pp. 280-289.

Trimberger, Steve, et al., "A time-multiplexed FPGA", © 1997 IEEE, Publ. No. 0-8186-8159-4/97, pp. 22-28.

UEDA, Hirotada, et al., "A multiprocessor system utilizing enhanced DSP's for image processing", © 1988 IEEE, Publ. No. CH2603-9/88/0000/0611, pp. 611-620.

Villasenor, John, et al., "Configurable computing", © 1997 Scientific American, Jun. 1997.

Wang, Quiang, et al., "Automated field-programmable compute accelerator design using partial evaluation", © 1997 IEEE, Publ. No. 0-8186-8159-4/97, pp. 145-154.

W.H. Mangione-Smith and B.L. Hutchings. Configurable computing: The Road Ahead. In Proceedings of the Reconfigurable Architectures Workshop (RAW'97), pp. 81-96, 1997.

Wirthlin, Michael, et al., "The Nano processor: a low resource reconfigurable processor", © 1994 IEEE, Publ. No. 0-8186-5490-2/94, pp. 23-30.

Wirthlin, Michael, et al., "A dynamic instruction set computer", © 1995 IEEE, Publ. No. 0-8186-7086-X/95, pp. 99-107.

Wittig, Ralph, et al., "One Chip: An FPGA processor with reconfigurable logic", © 1996 IEEE, Publ. No. 0-8186-7548-9/96, pp. 126-135.

Yamauchi, Tsukasa, et al., "SOP: A reconfigurable massively parallel system and its control-data flow based compiling method", © 1996 IEEE, Publ. No. 0-8186-7548-9/96, pp. 148-156.

"Information Brief", PCI Bus Technology, © IBM Personal Computer Company, 1997, pp. 1-3.

Yun, Hyun-Kyu and Silverman, H. F.; "A distributed memory MIMD multi-computer with reconfigurable custom computing capabilities", Brown University, Dec. 10-13, 1997, pp. 7-13.

Hoover, Chris and Hart, David; "San Diego Supercomputer Center, Timelogic and Sun Validate Ultra-Fast Hidden Markov Model Analysis-One DeCypher-accelerated Sun Fire 6800 beats 2,600 CPUs running Linux-", San Diego Supercomputer Center, http://www.sdsc.edu/Press/02/050802_markovmodel.html, May 8, 2002, pp. 1-3.

Caliga, David and Barker, David Peter, "Delivering Acceleration: The Potential for Increased HPC Application Performance Using Reconfigurable Logic", SRC Computers, Inc., Nov. 2001, pp. 20.

Hammes, J.P., Rinker, R. E., McClure, D. M., Böhm, A. P. W., Najjar, W. A., "The SA-C Compiler Dataflow Description", Colorado State University, Jun. 21, 2001, pp. 1-25.

Callahan, Timothy J. and Wawrzynek, John, "Adapting Software Pipelining for Reconfigurable Computing", University of California at Berkeley, Nov. 17-19, 2000, p. 8.

Ratha, Nalini K., Jain, Anil K. and Rover, Diane T., "An FPGA-based Point Pattern Matching Processor with Application to Fingerprint Matching", Michigan State University, Department of Computer Science, pp. 8.

Dehon, André, "Comparing Computing Machines", University of California at Berkeley, Proceedings of SPIE vol. 3526, Nov. 2-3, 1998, pp. 11.

Vemuri, Ranga R. and Harr, Randolph E., "Configurable Computing: Technology and Applications", University of Cincinnati and Synopsys Inc., IEEE, Apr. 2000, pp. 39-40.

Dehon, André, "The Density Advantage of Configurable Computing", California Institute of Technology, IEEE, Apr. 2000. pp. 41-49.

Haynes, Simon D., Stone, John, Cheung, Peter Y.K. and Luk, Wayne, "Video Image Processing with the Sonic Architecture", Sony Broadcast & Professional Europe, Imperial College, University of London, IEEE, Apr. 2000, pp. 50-57.

Platzner, Marco, "Reconfigurable Accelerators for Combinatorial Problems", Swiss Federal Institute of Technology (ETH) Zurich, IEEE, Apr. 2000, pp. 58-60.

Callahan, Timothy J., Hauser, John R. and Wawrzynek, John, "The Garp Architecture and C Compiler", University of California, Berkeley, IEEE, Apr. 2000. pp. 62-69.

Goldstein, Seth Copen, Schmit, Herman, Budiu, Mihai, Cadambi, Srihari, Moe, Matt and Taylor, R. Reed, "PipeRench: A Reconfigurable Architecture and Compiler", Carnegie Mellon University, IEEE, Apr. 2000, pp. 70-76.

Muchnick, Steven S., "Advanced Compiler Design and Implementation", Morgan Kaufmann Publishers, pp. 217.

Hammes, Jeffrey P., Dissertation "Compiling SA-C To Reconfigurable Computing Systems", Colorado State University, Department of Computer Science, Summer 2000, pp. 179.

Automatic Target Recognition, Colorado State University & USAF, http://www.cs.colostate.edu/cameron/applications.html, pp. 1-3.

Chodowiec, Pawel, Khuon, Po, Gaj, Kris, Fast Implementations of Secret-Key Block Ciphers Using Mixed Inner-and Outer-Round Pipelining, George Mason University, Feb. 11-13, 2001, pp. 9.

Li et al., "Configuration prefetching techniques for a partial reconfigurable coprocessor with relocation and defragmentation", ACM FPGA, Feb. 24-26, 2002, pp. 187-195.

Dave, "Crusade: Hardware/software co synthesis of dynamically reconfigurable heterogeneous real time distributed embedded systems", ACM Proc. Conf on Design, Automation and Test, Article No. 22, pp. 1-18, Jan 1999, ISBN 1-58113-121-6.

Verbauwhede et al., "The happy marriage of architecture and application in next generation reconfigurable systems", ACM CF, Apr. 14-16, 2004, pp. 363-376.

Hartenstein, "A decade of reconfigurable computing a visionary retrospective", IEEE, pp. 642-649, 2001.

Allan, V.H., Shah, U.R., Reddy, K.M., "Petri Net versus Modulo Scheduling for Software Pipelining", Department of Computer Science, Utah State University, IEEE, Proceedings of MICRO-28, 1995, pp. 105-110.

Callahan, Timothy J., Wawrzynek, John, "Adapting Software Pipelining for Reconfigurable Computing", University of California at Berkeley, ACM, Cases'00, Nov. 17-19, 2000, pp. 57-64.

Rinker, Robert, Carter, Margaret, Patel, Amitkumar, Chawathe, Monica, Ross, Charlie, Hammes, Jeffrey, Najjar, Walid A., Bohm, Wim, "An Automated Process for Compiling Dataflow Graphs into Reconfigurable Hardware", IEEE Transactions on Very Large Scale Integration (VLSI) Systems, vol. 9, No. 1 Feb. 2001, pp. 130-139.

Office Action for Application No. 03 776 468.5-2224 dated Jul. 31, 2008, p. 6.

* cited by examiner

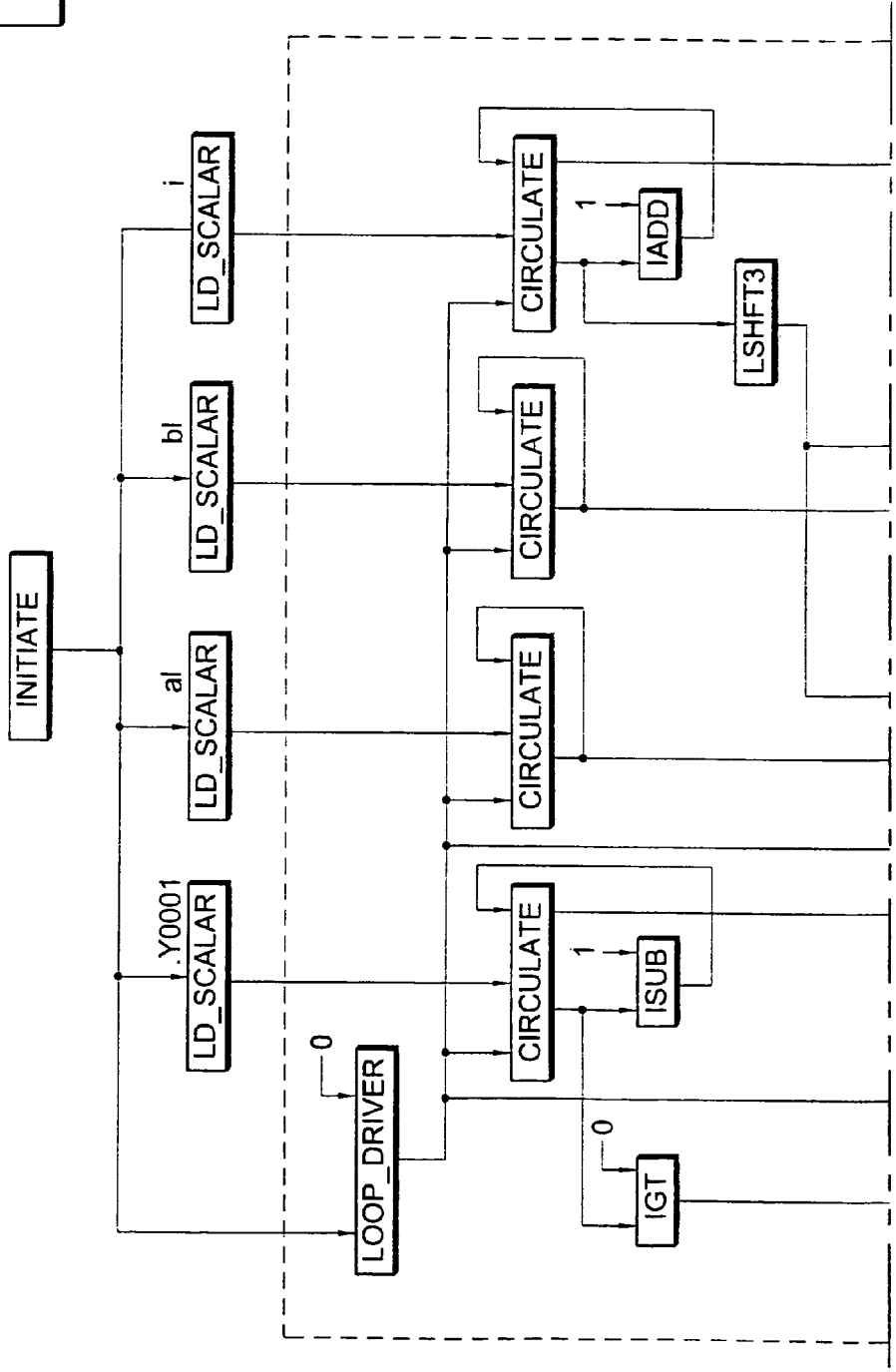

PROCESS FOR CONVERTING PROGRAMS IN HIGH-LEVEL PROGRAMMING LANGUAGES TO A UNIFIED EXECUTABLE FOR HYBRID COMPUTING PLATFORMS

CROSS REFERENCE TO RELATED PATENT APPLICATIONS

The present invention is a continuation of, and claims priority from, U.S. patent application Ser. No. 10/285,299 filed Oct. 31, 2002 now U.S. Pat. No. 6,983,456 for: "PROCESS FOR CONVERTING PROGRAMS IN HIGH-LEVEL PROGRAMMING LANGUAGES TO A UNIFIED EXECUTABLE FOR HYBRID COMPUTING PLATFORMS", assigned to SRC Computers, Inc., Colorado Springs, Colo., the disclosure of which is herein specifically incorporated in its entirety by this reference.

COPYRIGHT NOTICE/PERMISSION

A portion of the disclosure of this patent document contains material which is subject to copyright protection. The copyright owner has no objection to the facsimile reproduction by anyone of the patent document of the patent disclosure as it appears in the United States Patent and Trademark Office patent file or records, but otherwise, reserves all copyright rights whatsoever. The following notice applies to the software and data and described below, inclusive of the drawing figures where applicable: Copyright© 2002, SRC Computers, Inc.

BACKGROUND OF THE INVENTION

1. Field of the Invention

The present invention relates, in general, to adapting a high-level language program to operate in a hybrid reconfigurable hardware-instruction processor computing environment. More specifically, the invention relates to converting a high level language program into a unified executable that can run on a hybrid reconfigurable hardware-instruction processor computer.

2. Background

As instruction processors continue to increase rapidly in processing power, they are used more often to do computationally intensive calculations that were once exclusively done by supercomputers. However, there are still computationally intensive tasks, including, for example, compute-intensive image processing and hydrodynamic simulations that remain impractical to do on modern instruction processors.

Reconfigurable computing is a technology receiving increased interest in the computing arts. Traditional general purpose computing is characterized by computer code executed serially on one or more general purpose processors. Reconfigurable computing is characterized by programming reconfigurable hardware, such as Field Programmable Gate Arrays (FPGAs) to execute logic routines.

Reconfigurable computing offers significant performance advances in computation-intensive processing. For example, the reconfigurable hardware may be programmed with a logic configuration that has more parallelism and pipelining characteristics than a conventional instruction processor. Also, the reconfigurable hardware may be programmed with a custom logic configuration that is very efficient for executing the tasks assigned by the program. Furthermore, dividing a program's processing requirements between the instruction processor and the reconfigurable hardware may increase the overall processing power of the computer.

Hybrid computing platforms have been developed that include both general-purpose processor(s) and reconfigurable hardware. An exemplary hybrid-computing platform is the SRC-6E commercially available from SRC Computers, Inc., in Colorado Springs, Colo., USA. The SRC-6E system architecture includes multiple general-purpose instruction processors executing a standard operating system, e.g., Linux. Attached to the general-purpose instruction processors are specially configured Multi-Adaptive Processors (MAPs).

Unfortunately, an important stumbling block for users who may wish to use reconfigurable computing is the difficulty of programming the reconfigurable hardware. Conventional methods of programming reconfigurable hardware included the use of hardware description languages (HDLs); low-level languages that require digital circuit expertise as well as explicit handling of timing. Thus, there remains a need for processes that can take a program written in a high level language and convert it into code that can be executed on a hybrid reconfigurable hardware-instruction processor computer with minimal modifications to the original program.

SUMMARY

One embodiment of the invention includes a method of converting high-level language source code into a unified executable comprising: generating an object file from a reconfigurable hardware portion of the high-level language source code, and integrating the object file into the unified executable.

Another embodiment of the invention includes a method of forming a unified executable comprising: converting a high level language program into a control flow graph representation, converting the control flow graph representation into a control-data flow graph representation, partitioning the control-data flow graph into an instruction processor portion and a reconfigurable hardware portion, converting the reconfigurable hardware portion of the control-data flow graph into a hardware definition language portion and the instruction processor portion into an instruction processor object file, converting the hardware definition language portion into a reconfigurable hardware bitstream, converting the reconfigurable hardware bitstream into a bitstream object file that is readable by an instruction processor, and integrating the bitstream object file with the instruction processor object file to form the unified executable.

Another embodiment of the invention includes a system for forming a unified executable comprising a partitioner to partition control-dataflow graph representations into a reconfigurable hardware portion and an instruction processor portion.

Another embodiment of the invention includes a system for forming a unified executable that is executable on a hybrid reconfigurable hardware-instruction processor computer, said system comprising: a high-level language converter to convert a high-level language into control flow graph representations, a control flow graph to control-dataflow graph converter to convert the control flow graph representations into control-dataflow graph representations, a partitioner to partition the control-dataflow graph representations into a reconfigurable hardware portion and an instruction processor portion, a control-dataflow graph to hardware definition language converter to convert the reconfigurable hardware portion of the control-dataflow graph representations to a hardware definition language file, a hardware definition language to bitstream converter to convert the hardware definition language file to a bitstream file, a bitstream to object file converter to convert the bitstream file into a bitstream object file, and a linker to integrate the bitstream object file into the unified executable.

Another embodiment of the invention includes a computer program product comprising: a computer usable medium having computer readable program code embodied therein for causing a formation of a unified executable, the computer readable program code comprising, computer readable program code for causing a computer to convert a high level language source code into a control flow graph representation, computer readable program code for causing the computer to convert the control flow graph representation into a control-data flow graph representation, computer readable program code for causing the computer to partition the control-data flow graph into an instruction processor portion and a reconfigurable hardware portion, computer readable program code for causing the computer to convert the reconfigurable hardware portion of the control-data flow graph into a hardware definition language portion and the instruction processor portion into an instruction processor object file, computer readable program code for causing the computer to convert the hardware definition language portion into a reconfigurable hardware bitstream, computer readable program code for causing the computer to convert the reconfigurable hardware bitstream into a bitstream object file that is readable by an instruction processor, and computer readable program code for causing the computer to integrate the bitstream object file with the instruction processor object file to form the unified executable.

Additional novel features shall be set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION

System Overview

Figure 1:
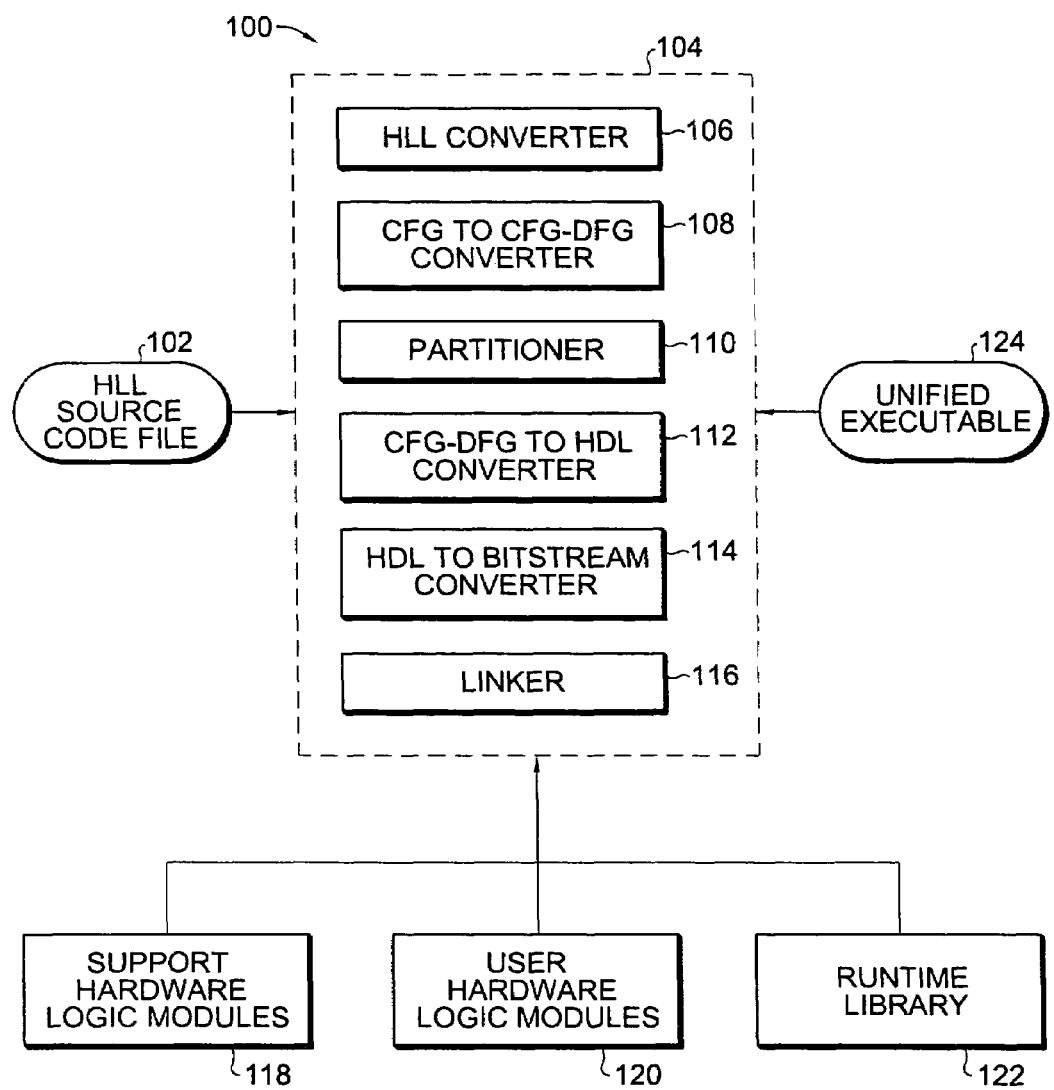
FIG. 1 shows a system for converting a high level language program into a unified executable according to an embodiment of the invention.

Referring now to FIG. 1, an embodiment of a hybrid reconfigurable hardware-instruction processor system for converting a program written in a high level programming language into a unified executable 100 is shown. In an embodiment, the reconfigurable hardware portion of system 100 may include multi-adaptive processors (MAPs) that may integrate field programmable gate array (FPGA) reconfigurable circuitry with logic to control the FPGAs and communicate with the instruction processor portion of system 100. In another embodiment, electronic communication between the reconfigurable hardware and instruction processors in system 100 may include using a switch/network adaptor port and/or a switch for linking multiple MAPs to instruction processors.

An embodiment of system 100 includes a MAP Programming Environment that includes MAPs, instruction processors, a high level language (HLL) file to unified executable converter 104, support hardware logic modules 118, user hardware logic modules 120 and a runtime library 122 among other components. In an embodiment of system 100, an HLL source code file 102 is input into converter 104. The HLL source code file 102 may be written in a conventional high level language such as, for example, C, C++, FORTRAN, COBOL, BASIC, PASCAL, and Java among others.

The HLL file 102 may be input into converter 104 where it may be converted to a unified executable 124 through the components of the converter 104. An embodiment of converter 104 may include an HLL converter 106, a CFG to CFG-DFG converter 108, a partitioner 110, a CFG-DFG to HDL converter 112, an HDL to bitstream converter 114 and a linker 116, among other components.

The converter 104 may include an HLL converter 106 that converts the high level language file into control flow graph (CFG) representations. In one embodiment the HLL converter 106 includes a software module including logic instructions for initiating a traditional compilation by reading the high level language source code, parsing the source code, converting the code into an internal representation and a symbol table. HLL converter 106 may also include logic instructions for performing syntactic and semantic checking of the source code, and for generating appropriate diagnostic messages in response to errors in the source code.

Also, HLL converter 106 may include logic instructions for optimization of the internal representation of the source code. Among other things, HLL converter 106 outputs a CFG representation. The CFG representation can be further processed either by the instruction processor compiler to produce instruction processor sequences, or passed on to another software module such as CFG to CFG-DFG converter 108 for data flow analysis and generation of logic for a reconfigurable processor (e.g., a MAP).

In an embodiment, the CFG to CFG-DFG converter 108 may be a software module including logic instructions for receiving the CFG representation created by HLL converter 106 and converting a CFG representation to a control-data-flow graph representation. The control-data-flow graph may be used throughout the remainder of the compiler phases. The CFG to CFG-DFG converter 108 may also optimize the degree of parallelism in the compiled code. The functions of the CFG to CFG-DFG converter 108 may include: creating a control-data-flow graph from a CFG representation passed by HLL converter 106 that may be used by the remaining components of converter 104, converting basic blocks to a code block in the data flow graph, converting input/output scalars, converting input/output arrays, dealing with scalar references in code blocks, dealing with array references in code blocks, constructing loop control, dealing with pointer references, dealing with calls to instruction processor code, dealing with system calls to instruction processor OS, expanding intrinsic function calls, expanding external function calls, optimizing loops, optimizing multi-threads, optimizing data path and logic unit data widths, and optimizing structure including the elimination of unneeded structure, among other functions.

The partitioner 110 may be a software module including logic instructions for sizing the logic to fit in the available resources of the hybrid computing system. The partitioner 10 may receive as an input the control-data-flow graph generated by CFG to CFG-DFG converter 108 and may map the control-data-flow graph onto the available resources such that performance is optimized.

In an exemplary embodiment, partitioner 110 may receive as input the following information: logic unit sizes from hardware logic module information file, chip sizes from resource file, interface size and speed from resource file, data storage performance and sizes from resource file, partitioning syntax input from the programmer, such as pragmas or directives, profiling information from control-dataflow graph (CFG-DFG) emulator and profiling information from the instruction processor profiling tool.

In an exemplary embodiment, the partitioner 110 may also include logic instructions for annotating the CFG-DFG with the above information and estimating performance parameters of sub-graphs based on execution in the instruction processor and the MAP. The partitioner 110 may further include logic instructions for assessing the sizing of the logic and allocating the logic based on, e.g., the resources of the integrated circuits and the MAP.

The partitioner 110 may also include logic instructions for defining interface logic on the MAP and assigning MAP proxy code to the instruction processor. The MAP proxy provides a target for the instruction processor code that transitions to a thread of control on the MAP. The MAP proxy accepts a call, and initiates any parameter passing required to the MAP. The MAP proxy may also receives requests from the MAP.

The output of the partitioner 110 may include a CFG-DFG that may be implemented as logic in the MAP, and a CFG-DFG that may be implemented on the instruction processor.

CFG-DFG to HDL converter 112 may be a software module that includes logic instructions for converting the CFG-DFG into a hardware definition of the physical logic that will be instantiated in the reconfigurable processor(s) that in the MAP(s). CFG-DFG to HDL converter 112 receives as an input a CFG-DFG file from CFG to CFG-DFG converter 108 and converts the CFG-DFG file to an internal representation. The hardware logic module information file is also read to provide node input, output and latency information. Nodes and paths between nodes are checked for compatibility and bit width consistency.

Some nodes are inlined rather than instantiating the node. Inlining refers to generating the hardware definition rather than referring to the definition as a instantiated logic module. All of the nodes in the CFG-DFG are checked for proper node dependency and consistent data flow. Each node is then instantiated, and then all wiring connecting the nodes is declared. An output file containing the hardware definition language is created. The output file may be written in a hardware definition language such as Verilog or EDIF.

The HDL to bitstream converter 114 may include conventional synthesis tools for compiling Verilog to EDIF, and Place and Route tools for converting EDIF files to a bitstream that is loadable into MAP may be used to process the output of the CFG-DFG to HDL converter 112.

The linker 116 may be a software module that includes logic instructions for taking object files including bitstream object files, instruction processor files and other object files and integrating them to form the unified executable 124.

In another embodiment, system 100 may include a conventional instruction processor compiler (not shown) that may be used to compile the portion of the high level language that is not converted to logic to be run in the MAP.

System 100 may also include a bitstream configurator (not shown) that may include a software module that includes logic instructions for creating a unified executable file. The bitstream file is encapsulated as a compiled C routine that can be incorporated into an executable file using a compiler and standard linker. The executable containing the application instruction processor instructions, the MAP logic bitstream, as well as any required library code may be referred to as the unified executable.

System 100 may also include a Binary Translator (not shown), which is a companion tool to the converter 104. Converter 104 may take high-level language source code as input and create a CFG representation and a unified executable. The Binary Translator may take an executable file and covert it into a CFG representation, and provides that to a secondary input to converter 104, bypassing the need for source code.

System 100 also includes modules 118 and 120 and library 122 that may provide a run-time environment for the HLL to unified executable conversion process. The run-time environment may include library routines that are included in the instruction processor portion of each application. These library routines provide support services for the MAP. This includes resource allocation and deallocation, communication between instruction processor and MAP, debugging, and performance analysis. At least three distinct environments may be supported by the run-time routines: 1) execution with MAP hardware, 2) execution with emulated MAP and dataflow graph emulation, 3) execution with emulated MAP and simulated user logic.

Method Overview

Figure 2:
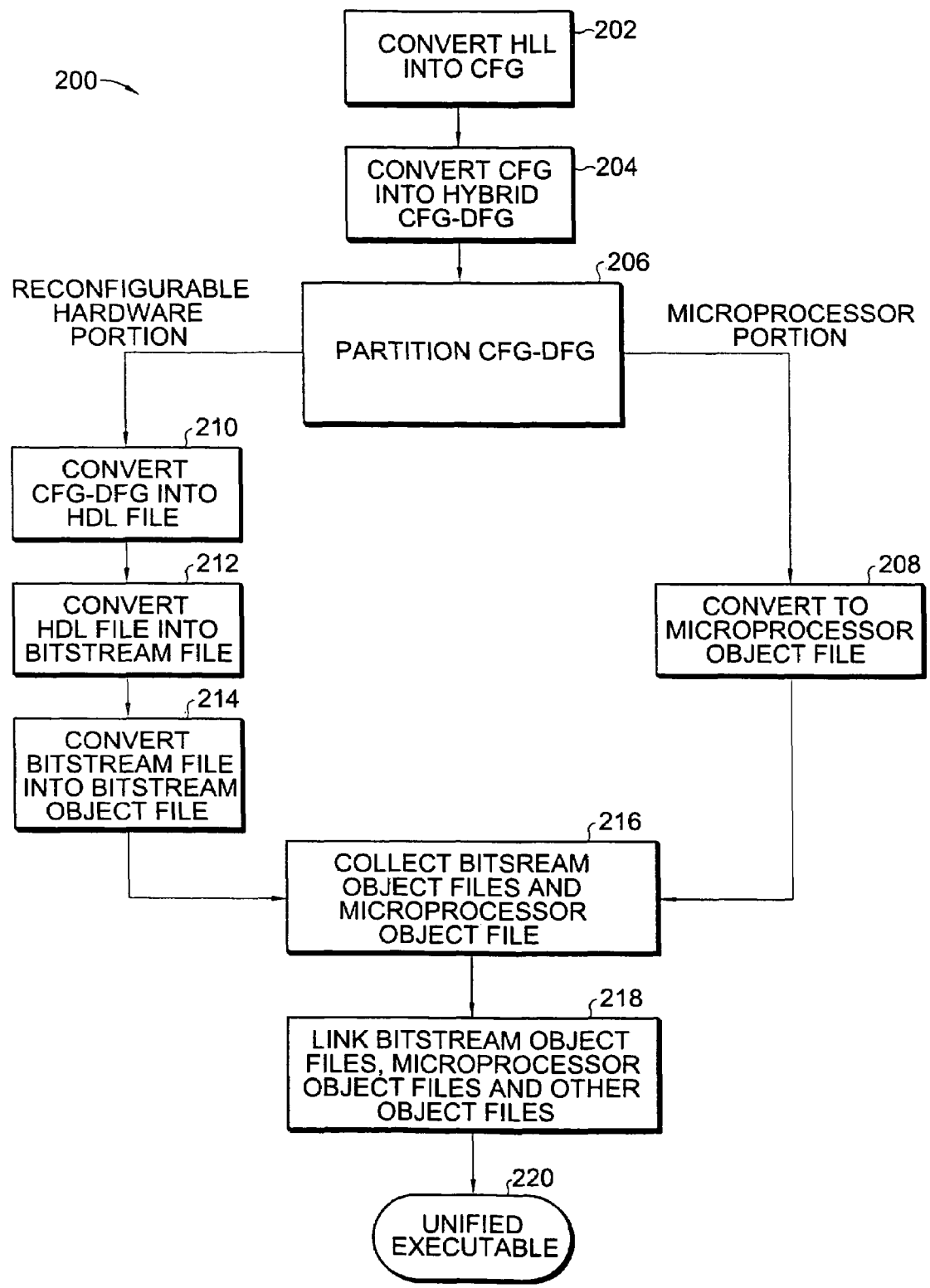
FIG. 2 shows a flowchart for converting a high level language program into a unified executable according to an embodiment of the invention.

Referring now to FIG. 2, a method of converting a high level language (HLL) into a unified executable 200 according to an embodiment of the invention is shown. The method 200 may start with the conversion of an HLL program into a control flow graph (CFG) at step 202. In an embodiment, conversion 202 of the HLL program to a specified CFG format may be performed by a conventional HLL compiler. Conversion 202 of the HLL program to CFG may include using a compiler to parse the HLL program into CFG representations and to generate instruction code that is executable on an instruction processor. The instruction code may then be written to object files that may be linked together with a linker-loader that resolves addresses.

The programming language used in the HLL program may be a conventional high level language such as C, C++, FORTRAN, COBOL, BASIC, Java and PASCAL, among others. The HLL program may include a variety of data entities including scalars, arrays and user-specifieed aggregates, among others, and their associated operators. The HLL program may also include function calls, subroutines, loops, and conditionals, among other operations.

In an embodiment of the invention, the next step of method 200 may be the conversion of the CFG representations into hybrid control-dataflow graph representations (CFG-DFG) at step 204. Briefly, this conversion 204 may include separating the CFG representations into its component basic blocks, adding load and store data to the top and bottom of the basic blocks, and converting the basic blocks into code blocks of CFG-DFG representations. A more detailed description of conversion 204 is provided below.

The next step of method 200 may be the partitioning of the CFG-DFG representations into a reconfigurable hardware portion and an instruction processor portion, at step 206. In one embodiment, the CFG-DFG representations may be input into a partitioner program that may scan the data and divide it into a portion for the reconfigurable hardware and a portion for the instruction processor. In another embodiment, the partitioner program may receive instructions from a user inserted partitioning syntax, for example a C pragma or a compiler directive, that guides how the CFG-DFG code is partitioned into reconfigurable hardware and instruction processor portions. For example, a pragma may instruct the partitioner program to put a particular loop operation in the instruction processor portion of the partitioned CFG-DFG representations. The pragmas may be included in the original HLL program source code or may be provided directly to the partitioner program.

At this point in this embodiment of method 200, the partitioned CFG-DFG representations from the partitioning step 206 may be split into separate process steps. The instruction processor portion from partition step 106 may be converted into an instruction processor object file 208. In one embodiment, the instruction processor portion of the hybrid CFG-DFG representations is converted back into CFG representations and then may be converted into instruction code that is executable on an instruction processor. The instruction code may then be written to object files that may be linked together with a linker-loader that resolves addresses. In another embodiment, the instruction processor portion of the hybrid CFG-DFG representations may be identified with portions of the original CFG representations and those portions of the original CFG representations may be converted to object files.

Turning now to the reconfigurable hardware portion of the CFG-DFG representations from partitioning step 206, this portion may be converted from CFG-DFG representations into a hardware definition language (HDL) file 210. The hardware definition language may include conventional HDLs such as Verilog and EDIF among others.

The hardware definition language file may then be converted into a bitstream data file 212 that can be loaded into individual reconfigurable circuits in the reconfigurable hardware. For example, the bitstream data files may be loaded into field programmable gate arrays (FPGAs) in the Multi-Adaptive Processors (MAPs) used in the hybrid instruction processor-reconfigurable hardware computers of the present invention. In an embodiment, a Place & Route program may be used to perform the HDL to bitstream conversion 212. Based on the HDL files, the Place & Route program may instantiate and interconnect hardware logic modules for the reconfigurable hardware. The Place & Route program may also direct where modules may physically go and how they are coupled to each other in the reconfigurable hardware.

In an embodiment of method 200, after the bitstream files are created, they may be converted into bitstream object files at step 214. The bitstream to object file conversion 214 may include converting the bitstream data into high-level language source code (e.g., placing the bitstream in a C structure) and converting the high-level language file into an object file that may be readable by an instruction processor.

In an embodiment of method 200, after converting the bitstream files into bitstream object files at step 214 and converting an instruction processor portion of the CFG-DFG representations into an instruction processor object file at step 208, the object files may be collected at step 216. Additional object files may also be collected with the bitstream object files and the instruction processor object files. For example, additional object files may come from previous iterations of method 200. Additional object files may also be taken from previous instruction processor compilations as well as from object libraries.

Once the bitstream object files, mircorprocessor object instruction processor files and any additional object files are collected, they may be linked together 218 to form a unified executable 220. In an embodiment, linking the object files 218 may be done by a linker program. The unified executable 220 may be readable by an instruction processor that may execute the unified executable 220 to configure a hybrid reconfigurable hardware-microprocessor computer to run the HLL program.

Figure 3:
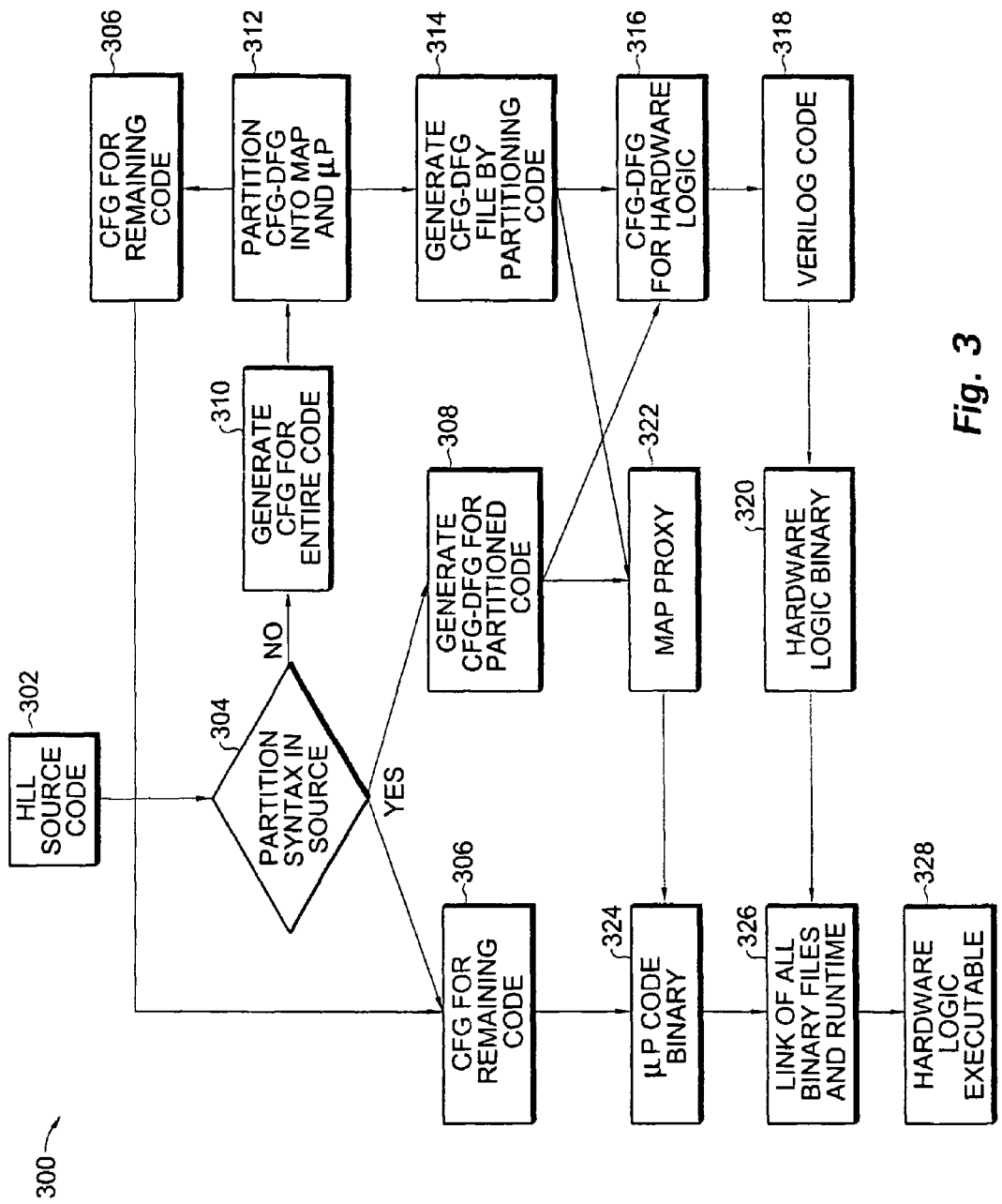
FIG. 3 shows a flowchart for converting high-level language (HLL) source code to a hardware logic executable according to an embodiment of the invention.

Referring now to FIG. 3, a flowchart of a method of converting high-level language source code to a hardware logic executable according to an embodiment of the invention is shown. The method may start with the analysis of high-level language (HLL) source code 302 being processed in a partition step 304. If a partition is found in the HLL source code 302, then the code may be divided up and converted into control flow graph (CFG) representations in steps 306 and 308.

In one embodiment, after the partitioned portion of the HLL source code 302 is converted to CFG representations at step 308, the CFG representations may be used to generate a MAP proxy 322 (see details of MAP proxy in High-Level Language Converter Section), or be converted into CFG-DFG representations for hardware logic at step 316. For a portion of the CFG representations that results in the generation of a MAP proxy 322, that portion may then be converted into binary instruction processor code at step 324, then linked with all other binary files at step 326 to become part of a hardware logic executable 328. For a portion of the CFG representations converted to CFG-DFG representations for hardware logic at step 316, the CFG-DFG representations may be converted into a hardware definition logic (HDL) code, such as Verilog code at step 318, then converted to hardware logic binary at step 320 and linked with all other binary files at step 326 to become part of the hardware executable 328. The remaining HLL source code 302 that is not part of the partitioned source code may be converted into CFG representations at step 306. Then the CFG representations may be converted into instruction processor binary code at step 324 before being linked with all other binary files 326 to become part of a hardware logic executable 328 (i.e., unified executable).

For HLL source code 302 that does not have partitions, the entire code may be converted into CFG representations at step 310 and may be partitioned into a reconfigurable hardware portion and an instruction processor portion at step 312. The instruction processor portion may be converted into instruction processor binary code at step 324 and ultimately be formed into hardware logic executable 328. The reconfigurable hardware portion may be partitioned and that portion generate a MAP proxy at step 322 while that same portion is converted into CFG-DFG representations. This partitioned portion may ultimately become part of hardware logic executable 328.

Figure 4:
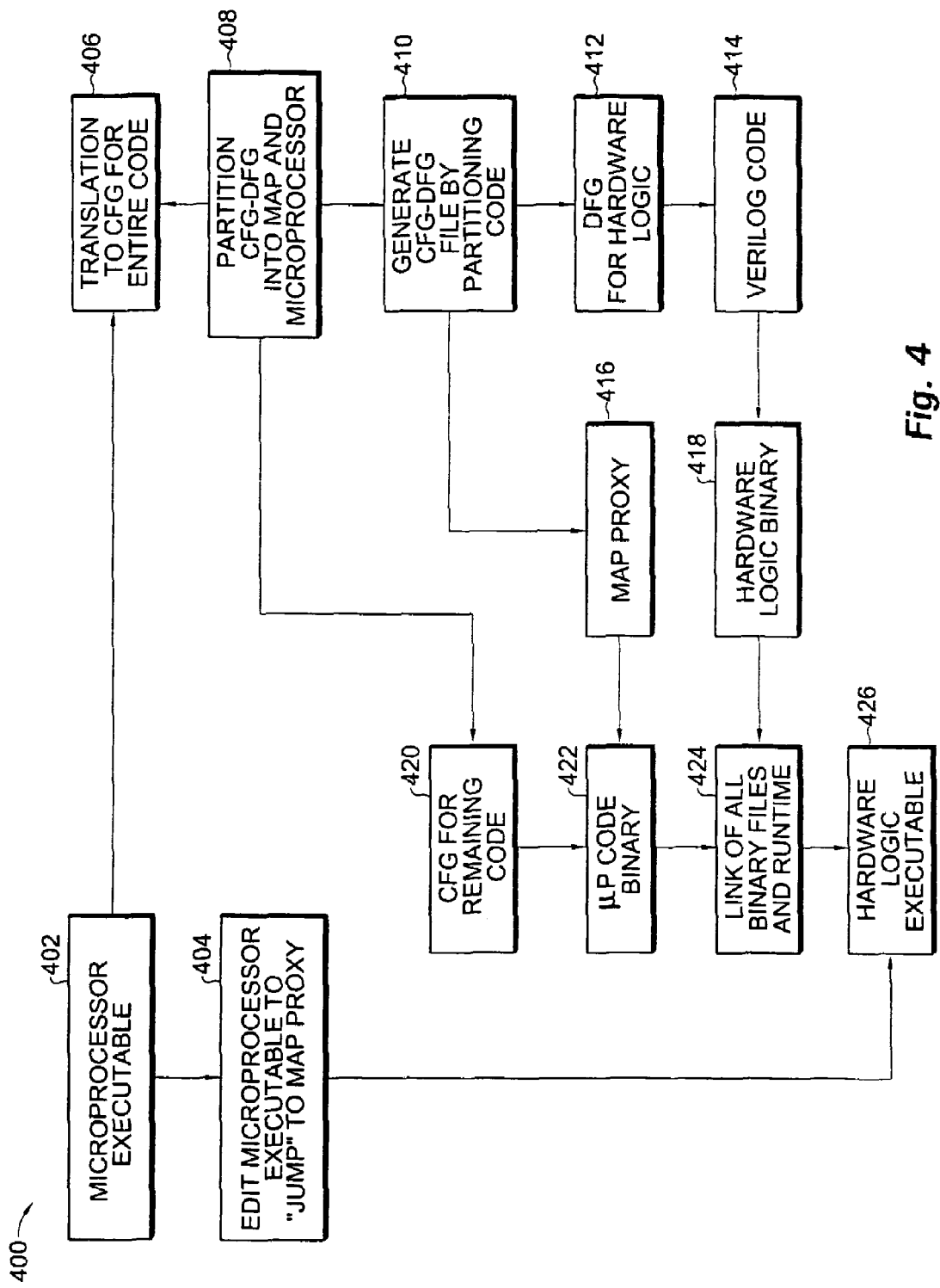
FIG. 4 shows a flowchart for converting an instruction processor executable to a hardware logic executable according to an embodiment of the invention.

Referring now to FIG. 4, a flowchart of a method 400 of operation for a binary translator according to an embodiment of the invention is shown. In one embodiment, instruction processor executable 402 may be edited at step 404 so that it may become part of the hardware logic executable 426. In another embodiment, the instruction processor executable 402 may be translated into CFG representations at step 406.

After the instruction processor executable 402 is translated into CFG representations at step 406, and converted into a CFG-DFG representation, it may then be partitioned at step 408 into a reconfigurable hardware portion and an instruction processor portion. The instruction processor portion and any remaining portions of the CFG representations 420 may then converted into instruction processor binary code at step 422. The instruction processor binary code may then be linked with all other binary files at step 424 to become part of a hardware logic executable 426.

The reconfigurable hardware portion may be partitioned and that portion causes generation of a MAP proxy at step 416 while that same portion is converted at step 414 into hardware definition language (HDL) code (e.g., Verilog), which then may be converted to hardware logic binary at step 418. The hardware logic binary may be linked with all other binary files at step 424 to become part of the hardware logic executable 426.

The MAP proxy generated by the partitioned portion may be converted into instruction processor binary code at step 422 and then linked with all other binary files at step 424 to become part of the hardware logic executable 426.

FIGS. 2 and 3 illustrate method steps that may be used in the process of converting a HLL program into a unified executable or hardware logic executable according to embodiments of the invention. FIG. 4 illustrates method steps that may be used in the process of converting an instruction processor executable file into a hardware logic executable. It should be appreciated that additional steps and alternate sequences for the steps shown are contemplated in additional embodiments of the invention.

Map Execution Selector

In an exemplary embodiment, a method is provided for identifying regions of source code written in a high-level language that may be segregated and targeted for hardware logic, while other portions of the code may be compiled for execution on a conventional processor. An exemplary method uses special bracketing syntax showing which region(s) of code are to be executed on the hardware logic and provides scoping information for variables contained within the bracketed region. This information may be used to build the communication and data movement routines that facilitate execution of region(s) identified to execute on the hardware logic without further user intervention.

Many high-level programming languages include language constructs which may be used to specify region(s) of user code that may be compiled and executed on hardware logic, rather than a general purpose processor. For example, in the Fortran language the syntax "!dir$" may be used, and in C the syntax "#pragma" may be used. Using these constructs, the syntax to bracket the user code contains either the start or stop identifier and the scoping rules for the variables contained within the bracketed code, and additional syntax for copying out privately computed data.

For example, consider the following small Fortran procedure:

```
        program main
!
        parameter (n=1000)
        integer(kind=8) a(n), b(n), c(n)
        integer (kind=8) cc
c
        common / arrs/ a,b,c
c
        call initialize (a, b, c)
c
        do i = 1, n
        cc = a(i) * b(i)
        if (cc .le. 42) then
        c(i) = cc
        else
        c(i) = a(i)
        endif
        end do
c
        stop
        end
```

This code segment first declares three arrays (a, b, c) that will be used to hold data used in the computation. The arrays are declared in a common block, meaning their storage allocation will be in the instruction processor's memory and not a local stack space associated with the procedure. There is an external call to a procedure that can be assumed to initialize the data in the arrays. After that initialization call is a do-loop that contains the computation portion of this procedure.

The portion of code that has been identified to execute on the hardware logic is determined to be the loop body enclosed by the do-loop construct. Using syntax that is recognized by the compiling system which will generate hardware logic, the Fortran code may be modified to resemble this:

```
        program main
!
        parameter (n=1000)
        integer(kind=8) a(n), b(n), c(n)
        integer (kind=8) cc
c
        common / arrs/ a,b,c
c
        call initialize (a, b, c)
c
        !dir$ start_MAP global (a,b,c,n)
        !dir$! private( (i,cc)
        do i = 1, n
          cc = a(i) * b(i)
          if (cc .le. 42) then
            c(i) = cc
          else
            c(i) = a(i)
          endif
          end do
        !dir$ end_MAP
c
        stop
        end
```

Here the do-loop has been bracketed with pair of directives that will provide the information needed by the compiling system. The compiling system processes this information to build both the procedure that will run on a general purpose processor and the subprogram that will execute on hardware logic.

The conversion of this single Fortran procedure into separately compilable procedures may involve several compilation phases. In one phase, the compilation system processes the individual source files contained within the program, discarding from further reconfigurable hardware logic compilation source files that do not have syntax indicating that hardware compilation is desired. When the compilation systems encounters syntax indicating that reconfigurable hardware compilation is desired, the compiling system starts to build up the infrastructure needed to implement the compilation of this source file on both the instruction processor and the bracketed portion on the hardware logic. In addition to creating source files needed for the instruction processor compilation phase and the hardware logic compilation phase, the mechanisms used to allocate, reserve, and release the hardware logic resources are also generated.

The bracketing syntax may include scoping information for all variables used within the bracketed region. This scoping information may be used by the compiling system to build the correct data movement statements and to ensure that the integrity of the program remains the same as it would be if it had been run entirely on the instruction processor. Scoping data and variables as "global" indicates to the compiling system that this data is persistent across the calling boundary between the instruction processor and the hardware logic. The mechanism that moves the data to the hardware logic and retrieves the data from the hardware logic may be built into the new subprograms being created by the compiling system. Global data may be handled in a similar fashion so that the integrity of the data is preserved.

Scoping data and variables as "private" indicates to the compiling system that these variables are local in scope to just the hardware logic, and therefore their resultant values do not need to persist past the point of hardware logic execution. As a variation to this syntax, there is an additional syntax that allows private data to be "copied out" to a local variable in the instruction processor version of the source file.

Figure 5:
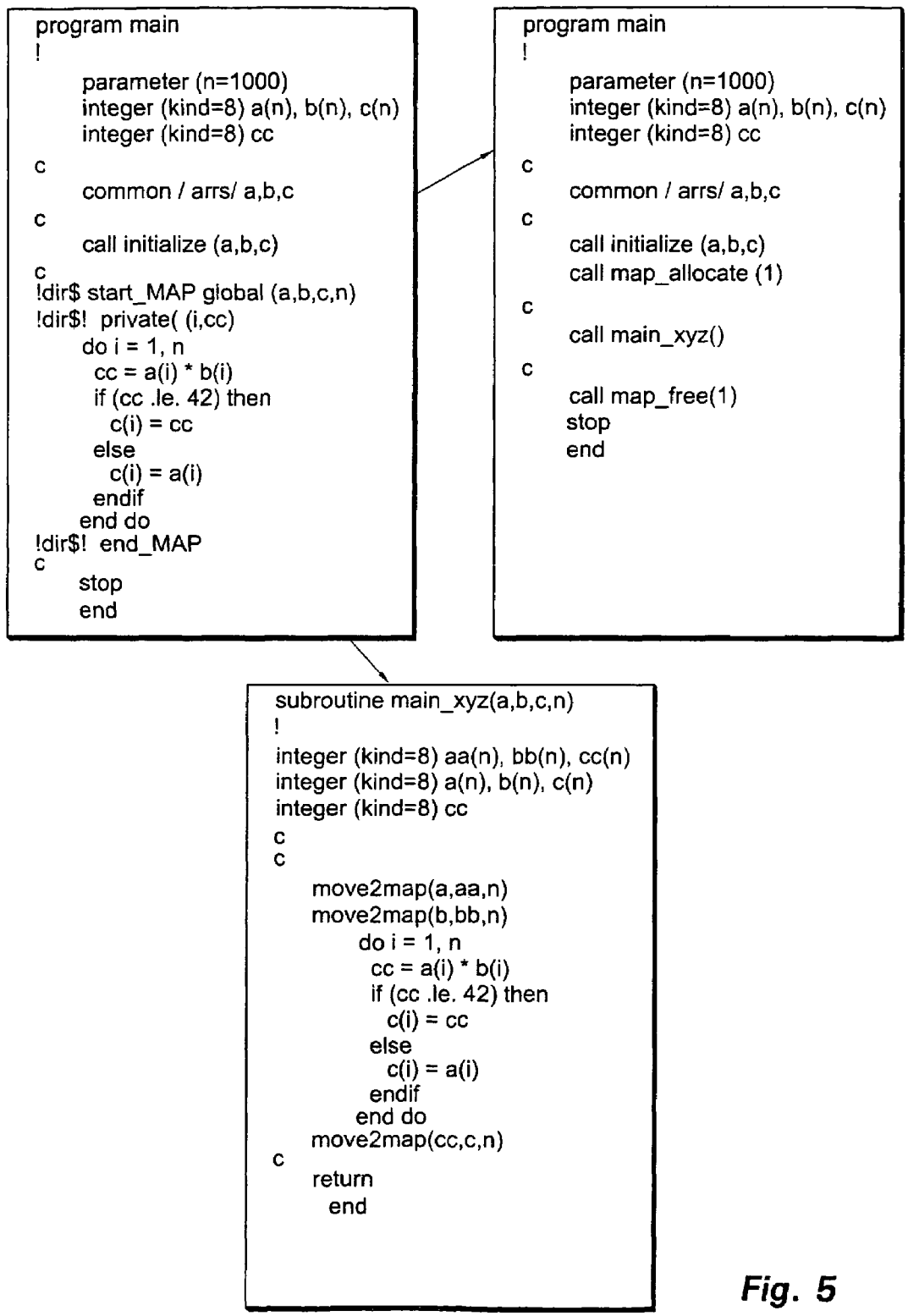
FIG. 5 shows a diagram for separating high-level language source according to an embodiment of the invention.

The compiling system can use this data scoping information to generate two separate source files, each of which represents a portion of the original source file containing the bracketing syntax. One of the new source files will be compiled and executed on the instruction processor's system. The other source file will be used to generate the hardware logic. This process is illustrated in FIG. 5.

High-Level Language Converter

A component of the compiling system that is invoked first to initiate a traditional compilation phase, similar to compilation on any instruction processor system. This component receives as input any programming language code and extracts from the source file(s) tokens which can then be parsed. While the parsing phase is taking place, semantic analysis may also be performed, so that after this phase an internal representation of the code and a symbol table may be produced. Semantic error checking is done and the appropriate diagnostic messages are issued.

The internal representation of the source code now generated by this compilation phase resembles control flow blocks of code. The next step is to expand on these control flow blocks into the internal language that will be processed by the optimizer. During this expansion phase, each control flow block may be expanded into units called either basic blocks or extended basic blocks. A flow graph may be a directed graph of the basic blocks in a function, which represents the function's control flow. Each node in the graph corresponds to a basic block. The flow graph may be updated during compilation as optimizations occur. The major global optimizations performed during this step may include invariant code motion; induction variable analysis; and, global register assignment. Other optimizations may include the merging of code blocks as well as peephole optimizations that result in optimized control flow code blocks.

After the global register assignment optimization, the calling parameters of the routine may be written to an intermediate file that may be used as the input into the next compilation phase. The calling parameters are written along with their data types, followed by the user symbols associated with the routine and their data types. After writing out the symbols used in the routine, the next portion of the file contains the traversal of the terminal code blocks showing the type of basic block represented and the instructions associated with the code block. Once this control flow representation has been produced, the final step produces all the instructions that were generated during the compilation of the routine. These instructions may correspond to the instructions listed in the control flow blocks.

As is the case for any architecture, a compiler is required to process a program written in higher-level languages into equivalent programs in a machine language for execution on a computer. System 100 satisfies the above requirement with the ability to translate programs for a traditional instruction processor alone, or in combination with a reconfigurable processor. The compiler phase used to translate this higher-level language is based on instruction processor compiler technology. The HLL converter uses a mixed model of compilation with language-specific front-ends to generate a common high-level intermediate representation. This first level of representation is then input into various basic optimizations, including control flow analysis, so that the resulting second-level intermediate representation can be referred to as a control flow representation. The control flow representation becomes a major component in the control flow information file that is generated as output by the HLL converter. The following text provides additional details on the contents of this file and also the additional files that can be produced as a result of this stage of compilation.

Input to the HLL converter can consist of two different types of source code. Any higher-level language source code can used as input into the HLL converter, provided that this code is written to conform to the language standards which it represents. Another input to the HLL converter is source code that represents control flow information for the higher-level language originally represented. This control flow information has been written to a well-defined interface specification so that control flow information from a previous compilation can be used (as described later) or control flow information that has been derived from another source, such as another uP executable, can be used.

After the control flow analysis has revealed the hierarchical flow of control within each procedure, a representation of the control flow can be generated as an intermediate language. The control flow information file that is produced at this point contains, but is not necessarily limited to, the following: entry symbols, user symbols, basic blocks, and intermediate representation instructions, among others.

Entry symbols represent the symbols created by the HLL converter that will be the parameters passed in a calling routine, which serves as the interface between the instruction processor portion of the executable and the hardware logic. These symbols may pass addresses of data that will accessed by the hardware logic as well as scalar values for computation.

User symbols are the symbols that represent the variables in the region of code being compiled for hardware logic. These symbols correspond to variable names in the higher-level source code, including constructs such as arrays and structures. Symbols may also represent any external routine calls; it is here that hardware logic modules may be visible in the compilation process.

A basic block may be a maximal sequence of instructions that can be entered only at the first of them and exited only from the last of them. The basic blocks representing the given source code are listed here. Every basic block starts with a block information header entry. This entry provides the relative block number, the source line number that this basic block represents, the label defined by this block (if one exists) as it is represented in the associated symbol table. Following this information is a list of flags representing attributes for these basic blocks. These flags provide more information about the block such as if this block contains the entry to the procedure; if this block has any external references; and, if this block's control falls through to its immediate successor. Immediately following the block information header line is a list of the instructions that represent terminal nodes. Examples of these types of instructions are stores of data to memory, unconditional or conditional branches or procedure calls. Each terminal node is represented by its relative number within the basic block, the line number which points to the "tree" of instructions representing the statement, and then flags that provide more information on that node.

The instructions referenced by the basic block section may be listed in the intermediate representation instructions. This section contains the individual instructions that have been generated during compilation and used for optimizations up to this point. These instructions have been grouped into basic blocks and their relationship with one another has already been established in the previous section. They are generated here in the order that they were created during the compilation process.

The first entry is the relative number of the instruction in this instruction list. Next is the instruction name, followed by each of the operands for this instruction. Information for operands may be provided if the operand is a label pointing to an entry in a table of variable and entry point names. Internally generated names from the compilation are also shown. Information may be provided about the data sizes being loaded or stored from memory. More details on the types of instructions that can be referenced in the control flow information file are given in the interface specification section.

The generation of the control flow information file is based on options provided either in the compilation command line or in the source code itself. Adding an option to the compilation command designates which subprogram contained within a larger source file of subprograms is to be targeted for hardware logic. During compilation, only the designated subprogram will have its control flow information written out to a separate file for further hardware logic compilation. The remaining source code subprograms will be compiled to generate the instruction processor machine code.

Control flow information files can also be generated based on the existence of partitioning, or bracketing, syntax that is recognized and parsed by the compiler. This partitioning syntax is used in conjunction with language-specific source lines such that, if this source code is compiled for a different architecture then the partitioning syntax may be ignored during compilation. Keywords defined for this syntax enable a region of the entire source code to be extracted and compiled as a separate subprogram for hardware logic. As described above with the command line option, only this specially bracketed region will have its control flow information written out to a separate control flow information file for further hardware logic compilation.

If no partitioning syntax is present in the code and there is no command line option to designate a specific subprogram as being targeted for hardware logic compilation, then the compiler may default to compiling the entire source code as a candidate for hardware logic. The control flow information about each subprogram may be written out and passed along for further compilation. The next compilation step will do the analysis needed in determining the best point in the control flow for partitioning to create a subset control flow information file. This new control flow information file is passed back to the HLL converter to create the necessary MAP proxy routines needed.

Figure 6:
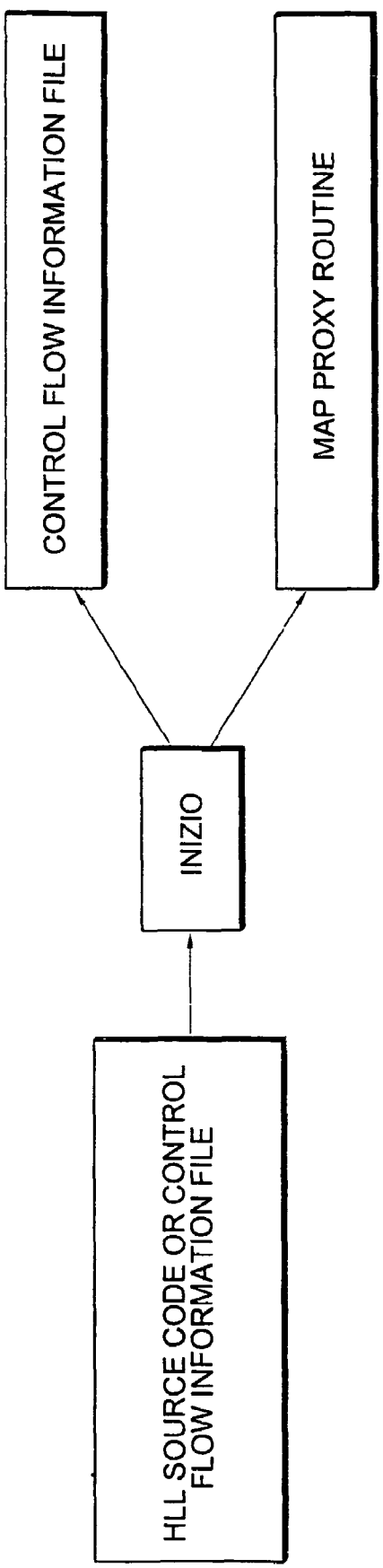
FIG. 6 shows a flowchart for converting high-level language source code into control flow graph representations according to an embodiment of the invention.

The compiler utilized to generate a control flow information file from a higher-level language or to process a previously generated control flow information file must also create various other procedures that provide the necessary functionality for hardware logic execution. These procedures provide functionality by supporting an interface between the execution of the code on the uP processor and the execution of the code on the reconfigurable processor. This interface functionality is termed, "MAP proxy". FIG. 6 shows an example of the interface functionality.

Code contained in the control flow information file 610 may include the region of source code that will be executed on the hardware logic. That file continues through the compilation process with the result being FPGA bitstreams suitable for hardware logic execution.

Code contained in the MAP proxy 615 may be scheduled for execution on the instruction processor in place of the region of control flow information that has been partitioned for execution on hardware logic. This code handles the data movement needed in support of the hardware logic execution by inserting data manipulation constructs that are appropriate for the target reconfigurable processor. The MAP proxy also may insert runtime library calls used when executing to interact with the operating system. This interaction includes the allocation of hardware logic resources; querying of hardware logic status; the release of hardware logic resources back to the system; and, the transfer of control from the instruction processor process to the hardware logic.

The final step for the HLL converter is to generate the machine code needed to execute on the targeted instruction processor. The HLL converter produces control flow information for the entire source code and also the MAP proxy code. This information is then translated down to the machine code, so that the binary files produced from this compilation can be used as input into the linking step that will result in the unified executable.

Hardware Logic Module Information Files: Concept and Structure

Another component of the compilation system is a data base that describes the mapping of the operators, intrinsic function calls, and procedure calls in the source of the MAP procedure to existing (system defined) hardware logic modules. The database is called the system info file.

Optionally, a user may define additional hardware logic modules which may be called as if calling a procedure in the source of a MAP procedure, or which may be used to redefine the intrinsic system defined hardware logic modules described in the system info file. In order to compile for MAP using user defined hardware logic modules, the user must provide a data base which maps the procedure name or operator overload to the user defined hardware logic module. This database is called the user info file.

Every opcode in the nodes of a dataflow graph representation of the MAP procedure being compiled must be defined in an info file entry.

Hardware logic module information files are used by both the CFG to CFG-DFG converter dataflow graph generator and by the CFG-DFG to HDL converter Verilog generation phases of compilation.

A hardware logic module information file includes of one or more entries concatenated into a single file. Each entry describes a unique operation (op-code) represented in the dataflow graph or a function or subroutine that has been instantiated thru a call from the MAP procedure being compiled. This description includes an interface to the hardware logic module that is to be instantiated to perform the operation, including it's inputs, outputs, any input or output signals the module is to be connected to, and characteristics of the hardware logic module. Optionally, an entry may contain functionally equivalent pseudo code that may be used in dataflow graph emulation mode, or various simulation modes to emulate/simulate the modules functionality.

A hardware logic module information file entry is delimited with a begin-def and end-def marker, and takes the form:

```
BEGIN_DEF "<opcode>"
    <mapping and emulation information>
END_DEF
```

The <opcode> is the ASCII string matching the op-code in the dataflow graph corresponding to the operation, or the name of a procedure called in the source code of the MAP procedure. The <mapping and emulation information> consists of a sequence of entries, each ending with a semicolon. The order of these sections of the hardware logic module information file entries does not matter.

MACRO="<macro_name>";

The <macro_name> is the ASCII string representing the name of the hardware logic module that performs the function of the operation or procedure the hardware logic module information file entry describes.

LATENCY=<num>;

The <num> is an integer value specifying the number of clock cycles between the presentation of data to the hardware logic module's inputs and the availability of corresponding results on the outputs.

STATEFUL=YES|NO;

YES indicates the hardware logic module holds state between iterations, typically in an internal register; NO indicates it does not.

EXTERNAL=YES|NO;

YES indicates the hardware logic module interacts with entities outside of its code block; NO indicates it does not.

PIPELINE=YES|NO;

YES indicates the hardware logic module is pipelined such that it can accept new inputs each clock; NO indicates it is not.

```
INPUTS  = <num> : <input specs>;
OUTPUTS = <num> : <output specs>;
```

<num> is the number of inputs or outputs to the operation or procedure in the source of the MAP procedure, or to the node which represents it in the dataflow graph. There must be <num> input or output specs specified in the INPUTS or OUTPUTS specifier.

Each <input spec> takes the form:

I<n>=<type> <nbits> BITS (<input_port_name>)

Each <output spec> takes the form:

o<n>=<type> <nbits> BITS (<output_port_name>)

<n> is an integer that specifies the zero based input or output sequence number to the operation or procedure call in the source of the MAP procedure or in the node of the dataflow graph. The numbering of the inputs and outputs is independent; each begins at zero.

<type> is the data type of the input or output. It may be INT, FLOAT, or ADDRESS. (This will be expanded to include additional types, COMPLEX, LOGICAL, REAL, INTEGER, CHAR, CHARACTER). <input_port_name> and <output_port_name> represent the corresponding input or output port names of the associated hardware logic module.

```
IN_SIGNAL   : <nbits> BITS "<macro_port_name>" =
"<internal_signal_name>";
OUT_SIGNAL : <nbits> BITS "<macro_port_name>" =
"<internal_signal_name>";
```

These describe hardware logic module connections which are not visible at the source code or dataflow graph level. <nbits> is the number of bits of the input or output signal. <macro_port_name> is the name of the signal into (IN_SIGNAL) or out (OUT_SIGNAL) of the hardware logic module. <internal_signal_name> is the name of the source (IN_SIGNAL) or target (OUT_SIGNAL) signal in the compiled hardware logic.

There are currently three internal source signals available:

```
CLOCK
rst
code_block_reset
```

CLOCK is the clock source for all hardware logic modules. rst is the one-time global reset. code_block_reset is a reset signal that is activated anytime a hardware logic module's code block is activated.

There are currently no documented signals to target. These will include error, overflow, or exception conditions detected during execution of the hardware logic module in the future.

DFG=# <simcode> #

<simcode> is C code which is used as an functional definition of the hardware logic module's behavior during dataflow emulation.

Syntax extensions are planned to the hardware logic module information file entries to specify variations of these or additional characteristics of the hardware logic modules. These characteristic variations and additions include, but are not limited to the description of hardware logic modules which can accept new inputs each n iterations, which can accept inputs for n iterations and produce i results after j clock periods, a means to specify the frequency at which a hardware logic module executes, actual code or a directory path to a file containing HDL code which define the hardware logic module for simulation, and a specification of resource requirements for the hardware logic module.

Translating Hardware Logic Module Information Files

In addition to the data flow graph, there is a second input file to the CFG-DFG to HDL converter. This is a CFG-DFG to HDL converter binary file containing the interfaces and information about the hardware logic modules contained in the hardware logic module information files. In an embodiment of the present invention, a small executable may be used which translates the ASCII hardware logic module information file into CFG-DFG to HDL converter internal tables and is executed during compilation prior to invoking the CFG-DFG to HDL converter.

This translation program may be invoked with one required and two optional command line options. The required option, -o outfile, indicates the name of the output file where the CFG-DFG to HDL converter tables are to be written. The option -d deleted_signal indicates the name of an input or output signal in the hardware logic module information file to be ignored; that is, the translation program will skip processing of a signal named deleted_signal in an hardware logic module information file which is specified in a -d option. This allows an hardware logic module information file entry for a hardware logic module to contain test signals or signals used in simulation that may not exist when generating actual hardware logic. The second optional command line argument is -r sigval=newsigval. The translation program replaces occurrences of pin or wire names specified by sigval in the hardware logic module information file with the string newsigval in the resulting CFG-DFG to HDL converter table. This option allows renaming the hardware logic module's input and output signals which are to be connected by the CFG-DFG to HDL converter. The CFG-DFG to HDL converter may ignore any connections that are to be connected to a wire whose name begins with "unconnected_". By renaming "unconnected_" wires with this option, they may be processed by the CFG-DFG to HDL converter. As with the -d option, -r is useful when generating an HDL like Verilog which will be used in a test bench or simulation environment and that may have signals that are not actually present in the generated Verilog for the resulting hardware logic. Multiple -d and -r options may be specified.

The translation program may start by initializing the CFG-DFG to HDL converter tables to be built, calling gr_tables_init in the CFG-DFG to HDL converter support library. Next the command line options may be processed. An array of character pointers is built containing the list of deleted signals specified by the -d command line options. Two parallel arrays of character pointers are built for the renamed signals (-r option). The first array contains the strings specified by sigval in the option, the second array contains the strings specified by newsigval in the option. For a given renamed signal in the first array, its corresponding new name is located at the same index in the second array. The output file name specified with the -o option is inserted into the CFG-DFG to HDL converter OUTPUT_FILES table.

After tables are initialized and the command line is processed, the hardware logic module information file(s) are parsed and an array of subref data structures is constructed. There may be two hardware logic module information files containing an arbitrary number of entries. One hardware logic module information file is assumed to contain interfaces which map the opcodes which appear in nodes of the data flow graph to specific hardware logic modules known to the compilation system (the intrinsic operations). This hardware logic module information file is called the system hardware logic module information file, and is located by reading a environment variable. The second hardware logic module information file, which is optional, contains interfaces to user provided hardware logic modules which are not intrinsically know to the compiler, as well as any user provided redefinitions of any of the intrinsic hardware logic modules. Parsing of the hardware logic module information file and creation of the array of subref structures is performed by a function shared with CFG to CFG-DFG converter, fetch_all_subrefs. The parser and semantic routines of fetch_all_subrefs may be generated by the gnu tools flex and bison.

A subref structure is used to store the information in the hardware logic module information files internally to the translator program and The CFG to CFG-DFG converter. As each opcode info file definition is parsed, the information is stored into a subref structure. Parsing continues until all the hardware logic module information file entries have been parsed, and an array of subref structures has been built. The translator program then enters loops thru the array processing one subref structure at a time while building the CFG-DFG to HDL converter tables which hold the hardware logic module interfaces.

The CFG-DFG to HDL converter tables built from the processing of the subref structures are EQUIV_IN, EQUIV_OUT, EQUIV_IN_PRS, PIN_NAMES, HELD, BEHAV_V, and BEHAV_C. The content of each of these tables is indicated in the discussion of subref structure processing (below). There is one EQUIV_IN and one EQUIV_OUT table entry created for each subref structure processed. The table index for the EQUIV_IN and EQUIV_OUT table entries for a given subref are the same.

Processing of a subref structure begins by checking the opcode name field of the subref structure. If no name was specified in the hardware logic module information file entry, an error is issued and the rest of the current subref structure is skipped. If a name is specified, the CFG-DFG to HDL converter tables built from previous subref processing are searched for a previous subref with the same opcode name. If one is found, a warning may be issued, and further processing of the duplicate named subref may be skipped; the first hardware logic module information file entry for the opcode name is used. Note that the user's info file entries are the first entries parsed, and their corresponding subref structures appear in the array of subrefs with the smallest array indices. Thus, a user may provide their own hardware logic module for any given opcode which is intrinsically known to the compiler, and due to the order of processing of the subref array, the user's info file entry for that opcode overrides any entry in the system's info file.

The index of the first free entry in the EQUIV_IN_PRS is saved and will later be placed in the EQUIV_IN table entry for the current hardware logic module information file entry. This is used to locate the first input parameter for the hardware logic module. The latency for the hardware logic module is also save for later insertion into the EQUIV_OUT table entry for the current info file entry. If the latency is not specified or if it is negative, and error is issued and a value of zero is used for the latency.

The output parameters may be processed first. For each output, an EQUIV_IN_PRS table entry is created. The output's bit width and the index to the EQUIV_IN/EQUIV_OUT table entries for this subref are inserted into the EQUIV_IN_PRS table entry. A flag indicating this is an output is also set in the EQUIV_IN_PRS table entry, distinguishing it from an input. A PIN_NAMES table entry is then created for the output parameter. A PIN_NAMES table entry has the output parameter's name, it's width in bits, the index to it's previously created EQUIV_IN_PRS table entry, the index of the current subref's EQUIV_IN/EQUIV_OUT table entry, and a flag indicating this is an output pin set. If this is the first PIN_NAMES table entry created for the current subref (the first output parameter processed for the module), the PIN_NAMES table index is saved for later insertion into the EQUIV_OUT table for the current subref.

The output signals for the opcode are processed after the output parameters. The list of deleted signals specified by d command line options is searched to determine if the output signal should be entered into the CFG-DFG to HDL converter HELD and PIN_NAMES tables. If it is found, the signal is skipped; otherwise a HELD table entry is created. The HELD table entry contains the index to the associated PIN_NAMES table entry for the signal, the bit width of the signal, and the name of the external signal the output signal should be connected to. The table of renamed signals specified by -r command line options may be searched to see if the signal has been remapped. If it has, the remapped signal name is used; otherwise the name specified in the hardware logic module information file is used. If no external signal name is specified, and error is issued. A PIN_NAMES table entry may then be created for the output signal. The PIN_NAMES table entry contains the EQUIV_IN/EQUIV_OUT tables index for the current subref entries, the output signal's bit width, the index of the HELD table entry created for this signal, the signal's name internal to the hardware logic module, and two flags indicating the signal is an output and that there is a HELD table entry for the signal. If this is the first signal processed for the subref structure, the index of the PIN_NAMES table entry is save for insertion in the EQUIV_OUT table entry for the subref.

After the output signals are processed, the input parameters for the subref are processed. An EQUIV_IN_PRS and a PIN_NAMES table entry are created for each input. The contents of the EQUIV_IN_PRS entry may be identical in content to one made for an output parameter with the exception that the flag indicating an output parameter is not set. The PIN_NAMES table entry contains the same information as a PIN_NAMES table entry for an output parameter, except a flag indicating an input is set rather than the flag indicating an output parameter.

The input signals are processed after the input parameters. For each input signal, a HELD and a PIN_NAMES table entry are created. The processing of the input signals and the resulting table entries are identical to that for output signals, except a flag indicating the signal is an input rather than an output is inserted in the PIN_NAMES table entries.

The last PIN_NAMES table entry has now been made for the subref, and the last entry's index is save for insertion into the subref s EQUIV_OUT table entry.

Finally the EQUIV_IN and the EQUIV_OUT table entries are generated for the subref. The EQUIV_IN table entries contain the index of the first EQUIV_IN_PRS table entry made processing this subref structure. The index of the last EQUIV_IN_PRS table entry made for this subref, and the name of the data flow graph opcode this subref defines. The EQUIV_OUT table entry contains the latency of the associated hardware logic module, the name of the hardware logic module, the index of the first PIN_NAMES table entry associated with the subref, the index of the last PIN_NAMES table entry associated with the subref.

Processing of the subref is now complete. info2grf continues until all subrefs structures are processed. If no errors were found during processing, the CFG-DFG to HDL converter tables are written to the output file and a zero status code is returned. Otherwise, no tables are output and a non-zero status code is returned. The translation program may then terminate.

Converting CFG into Hybrid CFG-DFG

Embodiments are now described for converting CFG representations into hybrid CFG-DFG representations. The original CFG representations may include nodes and directed edges, where each node may be a basic block of code, and each edge may show a transfer of control from the exit of one block to the beginning of another. The code in a basic block may have a single point of entrance and a single exit, that is, it may represent a straight sequence of statements that cannot be branched into or out of other than at the beginning and the end, respectively. The statements in a basic block may be sequential.

The hybrid CFG-DFG representations may have CFG representations at its upper level, but with dataflow graphs in each code block. In one embodiment, CFG to CFG-DFG conversion may consolidate groups of basic blocks, including groups that form inner loops, into flat and possibly pipelined code blocks.

Figure 7:
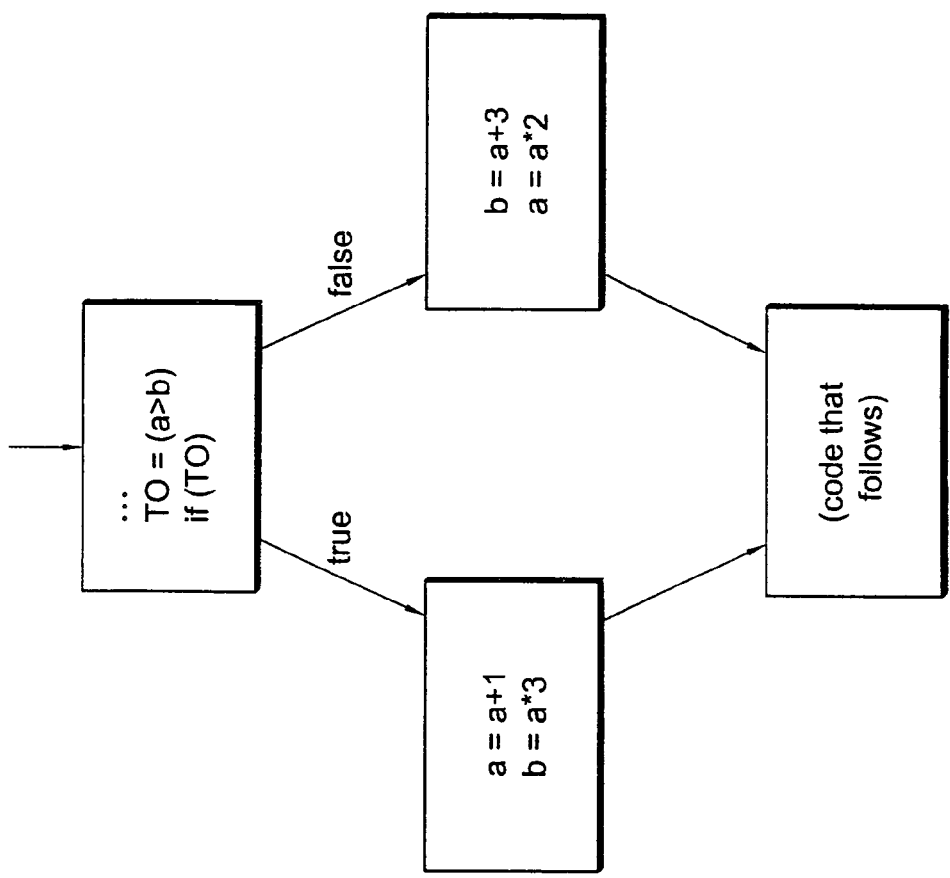
FIG. 7 shows a portion of a control flow graph according to an embodiment of the invention.

FIG. 7 shows an example of a portion of a CFG that corresponding to the following code fragment:

```
If (a>b) {
    a = a + 1;
    b = a * 3;
}
else {
    b = a + 3;
    a = a * 2;
}
```

In this example, the conditional test comparing 'a' and 'b' may be stored to a register or temporary variable, and may be the last statement in its basic block. Based on the result of the comparison, control may be transferred to one of two blocks that represent the "true" and "false" parts of the conditional construct. Each of these blocks, after executing its statements, may transfer control to the block containing the code that follows the conditional. Note that the code blocks in a CFG may contain sequential statements, each of which may reference registers or variables by reading and writing them. Also, note that the directed edges between blocks may represent a transfer of control that could be viewed as a one-bit "trigger" signal.

While CFG representations may be used in many compilers as an internal intermediate representation, dataflow graphs are not usually used because the dataflow execution paradigm is poorly suited to conventional von Neumann processors, due to its use of arbitrarily many functional units and its asynchronous execution. However, the dataflow model is well-suited for reconfigurable hardware. In a dataflow graph, the nodes may represent functional units (e.g., integer add). The directed edges between nodes may represent data connections that bring output data items from one functional unit to the inputs of other functional units. FIG. 4 shows a dataflow graph for the following code fragment:

```
{
int d;
a = b + c;
b = a * 4;
d = c - a;
a = a * 5 - d
}
```

The incoming values of 'b' and 'c' may be loaded at the top of the graph. Their values may flow out of the output ports (bottom) of the LOAD nodes. The dataflow graph may expose instruction-level parallelism. Here, three instructions (two multiplies and a subtract) may occur at the same time. Note that the 'd' variable may not need storage since it may be local to the graph and may exist as an edge. Also note that the intermediate value assigned to 'a' may not be stored to that variable, but simply may exists as an edge since a subsequent assignment below may create the final value of 'a'. A dataflow graph such as this may be mapped directly onto reconfigurable hardware by instantiating selected functional units. In this example one add, two subtracts and two multiplies would be created.

Figure 8:
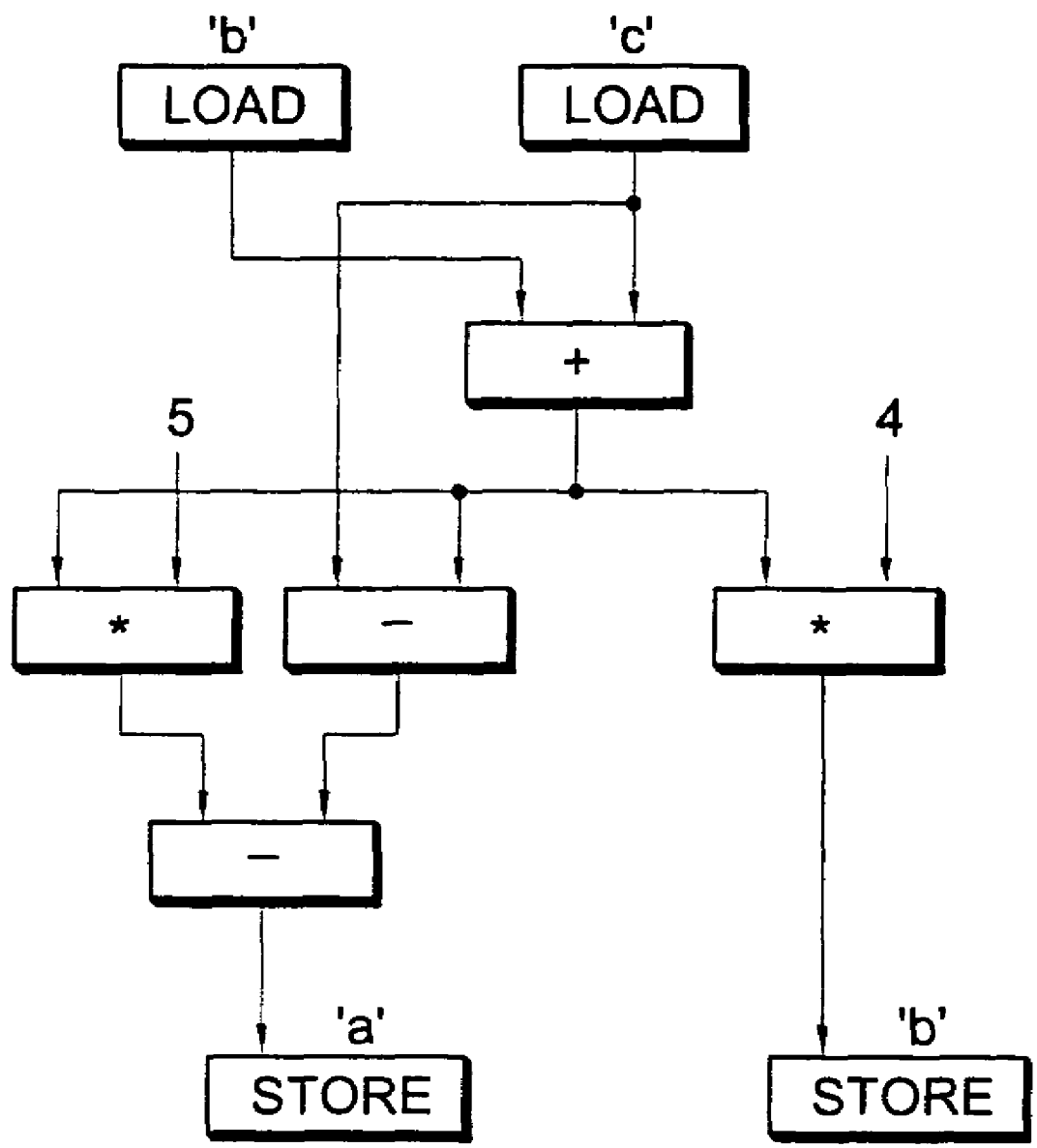
FIG. 8 shows a dataflow graph according to an embodiment of the invention.

The sequential statements in each basic block of a CFG representation may be converted to a dataflow graph, thereby producing a hybrid where the upper level nodes are code blocks with single-bit edges, and within each block may be a dataflow graph whose nodes may functional units and whose edges may be data connections. FIG. 8 shows an example of such a conversion applied to the CFG of FIG. 7.

Figure 9:
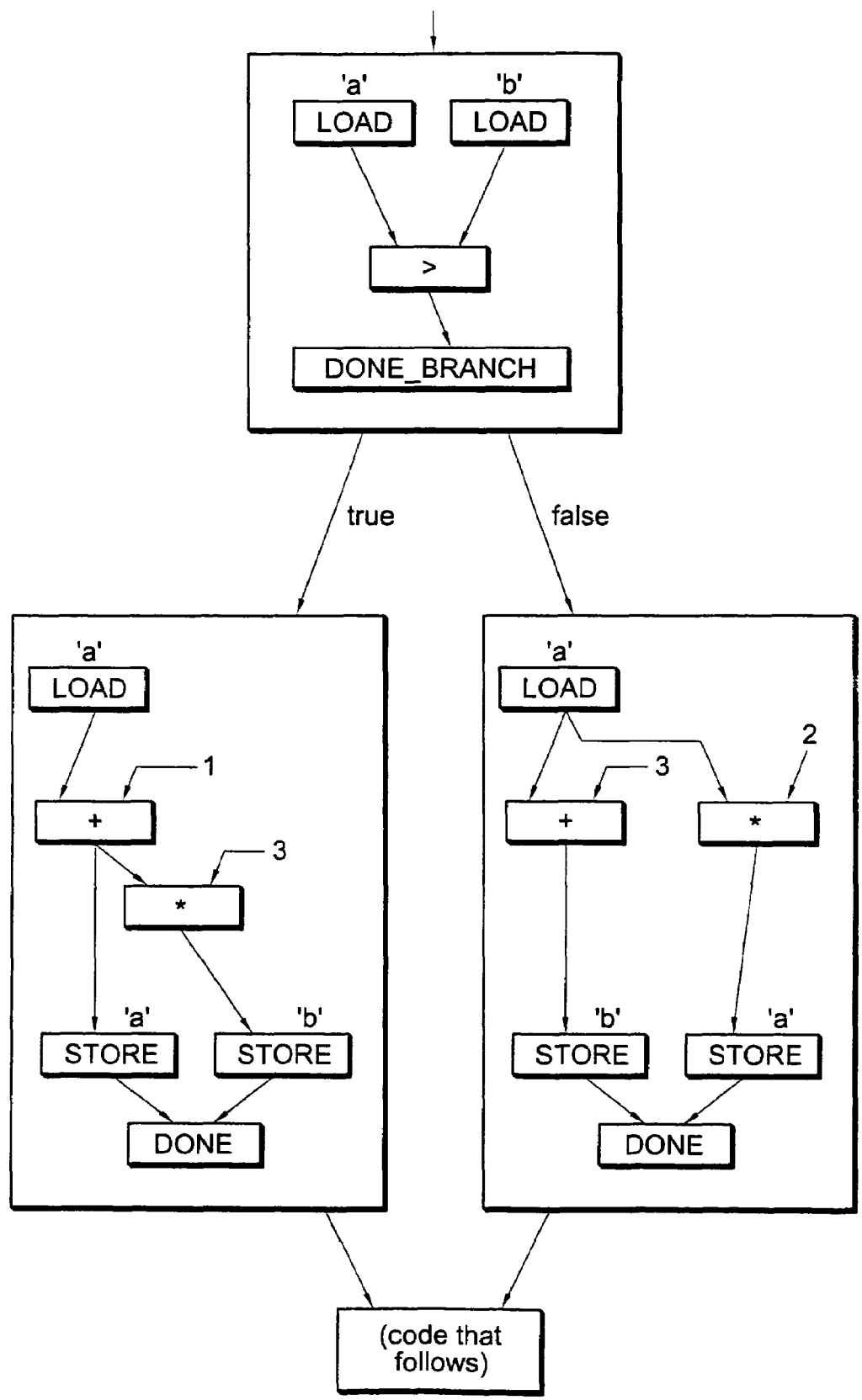
FIG. 9 shows an example of a hybrid CFG-DFG segment according to an embodiment of the invention.

In an embodiment of the invention, subsets of basic blocks in a CFG representation may be merged into a single dataflow code block where conditionals may be handled by computing both sides and then selecting the appropriate values based on the predicate expression of the conditional. FIG. 9 also shows and example of such a code block, where the code blocks of FIG. 8 have been merged.

In addition to scalar and array data types, high-level languages may have structures, which are user-specified data types that may be composites of simpler types. Conventional compiler front ends, when generating CFG representations, may deal with these by producing the appropriate address calculations in the basic blocks they produce. When such a structure may be in a local memory, the address calculations may be left unchanged when converting the graph to a control-dataflow graph. In the case of structures as local variables, the conversion process uses the type information along with the address offsets to determine which field of the structure is being referenced.

Pointers may be dealt with according to the architectural details of the target machine. If the reconfigurable hardware "sees" the same memory space as the processor that has passed address parameters to it, pointer arithmetic may work with no modification. If not, an adjustment factor is computed at run-time; this factor may be the difference between an address in the processor's memory and the place the data was copied to in the reconfigurable hardware's OBM. The control-dataflow graphs are generated so that they may include the addition of this factor when referencing a pointer.

Conventional high-level languages may have a small set of fixed-size arithmetic data types (e.g., 32-bit integers and 64-bit integers). This corresponds to the fact that the von Neumann processors they target may have fixed-size functional units. In reconfigurable hardware, it may be possible to instantiate functional units of any bit-width, which may achieve a saving of space by using an amount of precision needed for a given program. One way this savings may be achieved is to extend the high-level language to include new data types with user-specified bit-widths. Another approach may be to allow the user to specify the bit-width of the standard types (e.g., "int") for a section of source code.

It may possible for the compiler to infer the safety of reducing the precision of some functional units and the data paths they connect to. For example, in the code:

```
unsigned int a, b;
unsigned char c;
...
c = a + b;
``` it may be safe to change the addition operation to an 8-bit adder, since higher bits of the result may be lost when assigning the result.

In another embodiment, a component of the translation of CFG representations to control-dataflow graphs may be a database that describes the mapping of operators and function calls to existing hardware logic modules. This database, may be called an "info file", and may be used at various steps during compilation.

Function calls may be dealt with in a variety of ways, depending on the nature of the routine being called: If the routine is associated, via the "info file", with a hardware logic module, then a single node may be produced in the dataflow graph to represent it as a functional unit. If the routine meets appropriate criteria, it may be inlined so that the call mechanism may not be needed. If the function is tail recursive, it may be converted to a loop. If a function does not fall in the above categories, then a stack-oriented call mechanism may be used. In another embodiment, LIFO stacks may be implemented in the reconfigurable logic that may hold the various instantiations of local variables as the recursion takes place. Stack information may also direct the flow of control so that the returns of the recursive calls take place correctly.

The hybrid control-dataflow graph may adapt itself to multiple threads of execution within a subroutine compiled to reconfigurable hardware. While the semantics of high-level languages may specify sequential execution (where one code block may be active at any given time), parallelism at the code block level may be easy to implement when the compiler can determine that parallel execution may not produce incorrect results. This determination may come in a variety of ways, depending on the language and its possible extensions: For example, if the language contains parallel constructs, the parallelism may come in as part of the CFG representation. Also, a sequential language may be extended by user pragmas that may allow the programmer to direct the compiler to make certain parts of the code parallel. Analysis may allow the compiler to prove that certain code blocks may be safely executed in parallel.

Figure 11:
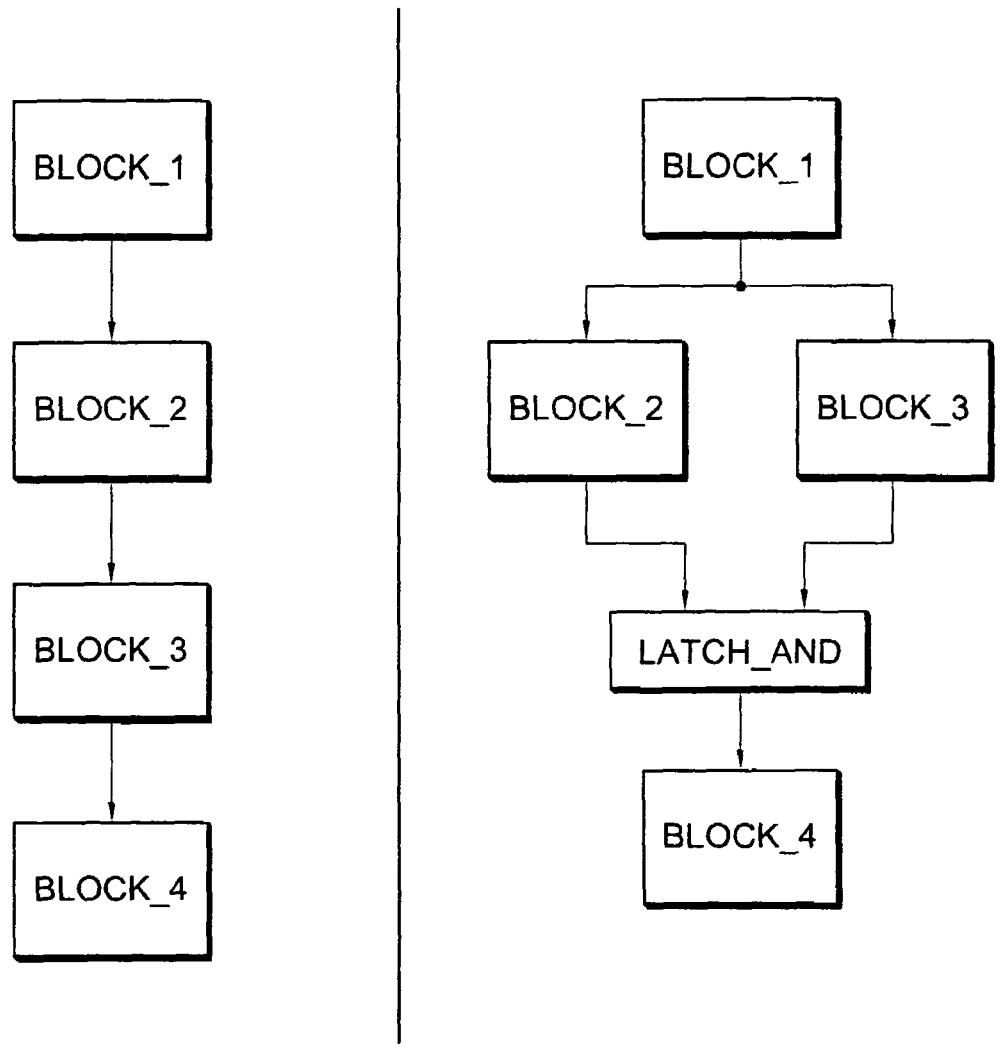
FIG. 11 shows an example of concurrent code blocks according to an embodiment of the invention.

FIG. 11 shows an embodiment that has, at left, a sequential part of a CFG representation, and at right a transformed graph where two code blocks have been made concurrent. The trigger signal from the preceding block fans out to trigger both concurrent blocks, and a "join" mechanism called a LATCH_AND may used to merge the "done" signals from the two blocks. The LATCH_AND may be designed so that it latches each input signal when it goes high, so that the incoming triggers may not have to occur simultaneously.

The control-dataflow graph's connectivity information may be used to improve the performance of logic placement in an FPGA. In current place-and-route tools, the placement problem may be viewed at a very low level, where the items being placed may be small logic blocks. If the hardware logic modules available to the compiler are already determined to be of specified shapes, the compiler may do placement at a much higher, hence much simpler, level of granularity, with a potentially significant speedup of the process.

Figure 12:
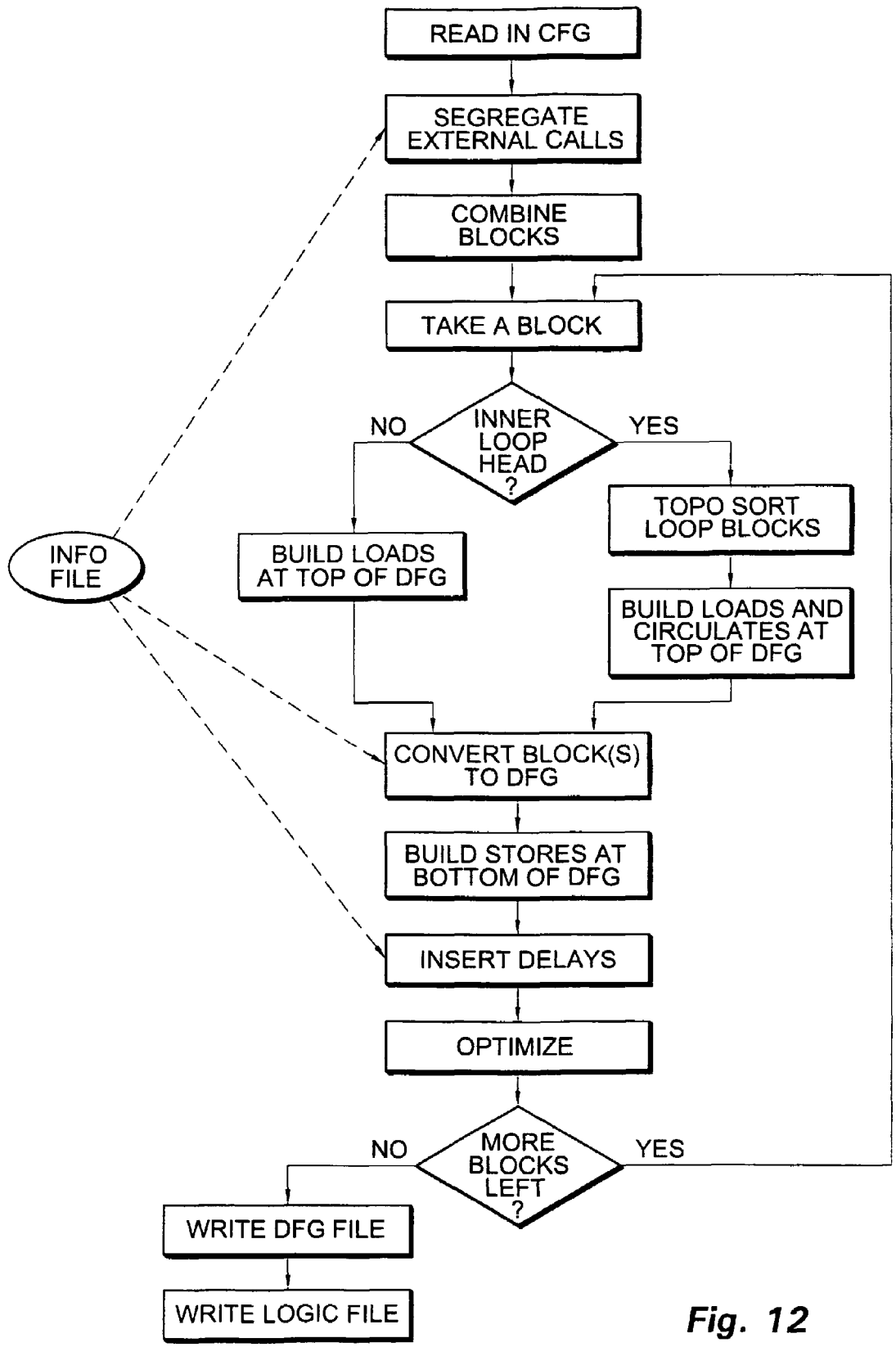
FIG. 12 shows a flowchart for converting a CFG representation to a hybrid control-dataflow graph according to an embodiment of the invention.

FIG. 12 shows the top-level process for converting a subroutine's CFG representation to a hybrid control-dataflow graph. One or more "info files" may be read to obtain information about the available hardware logic macros that may be available for implementation of the dataflow graph as reconfigurable logic. After reading the CFG representation into its internal data structure, the compiler may segregate "external" hardware logic module calls into individual blocks. This may be done because external modules interact with resources outside of their code blocks and race conditions might result if they were to execute concurrently. Next, individual blocks may be combined into larger blocks, as in the example of FIG. 10.

Each block may then processed. For non-loop blocks, LOAD nodes may be created for the various scalar values that are referenced. Then the dataflow graph of the block's computation may be created. Finally, a STORE node may be created for each scalar variable to store its final value. Inner loops may require some additional handling. When the head block of an inner loop is found, the rest of the loop's blocks may be gathered and topologically sorted. Then LOAD and CIRCULATE nodes may be built for the scalars. The loop's code blocks may then be processed in a manner similar to that of non-loop blocks.

After each DFG is created, delay nodes may be inserted to balance the path lengths (that may be measured in clock ticks) through the dataflow graph. Then a variety of optimizations may be performed on the graph. After all DFGs have been created, they may be written to a DFG file, and a logic emulation file may be created.

The CFG representation may consist of two parts: an array of opcodes and a sequence of basic blocks. The opcodes may be read into an array of structures whose elements consist of one opcode and references to the opcode's data sources. Each basic block in the CFG representation may stored in a structure like the one shown below:

```
typedef struct {
    // the following fields are initialized by reading the CFG
    int id;                         // id of block in the Inizio dump
    int label;                      // this block's label in the Inizio dump
    INT_NODE *anchors;              // list of opcode anchors in this block
    int flags;                      // characteristics for this block
        // the following fields are filled in by analyzing the block
    int outgoing_true;              // block to go to if test is true
    int outgoing_false;             // block to go to if test is false
    INT_NODE *incoming;             // list of blocks that can jump to this block
    INT_NODE *anchor_nodes;         // list of store and branch nodes
                                        in this block
    VAR_INFO *scalars;              // info on all scalars used in this block
    SCALAR_ASSOC *scalar_sources;// sources of scalars at
    output of block
    int active;                     // source of this block's 'active'
                                        expression
    int src_true;                   // source node of this block's true
                                        expression
    int src_false;                  // source node of this block's
                                        false expression
    int is_loop_head;               // tells whether this is a loop head
    int is_loop_tail;               // tells whether this is a loop tail
    int was_flattened;              // tells whether this is head of a flattened
                                        loop
    NODEPOOL *pool;                 // dataflow nodes for this block
} BLOCK_INFO;
```

As the dataflow graph is built for a block, its nodes may be allocated in the "pool" field of the basic block structure. An example of the dataflow node structure may be show as:

```
typedef struct edge {
    int node;
    int port;
    struct edge *link;
} Edge;
typedef struct {
    int bitwidth;
    int is_const;
    char *constval;
    Edge *back_edges;
    int pseudoreg;
} InputPort;
typedef struct {
    int bitwidth;
    Edge *targets;
    int pseudoreg;
} OutputPort;
typedef struct {
    char *nodetype;
    int num_inputs;
    InputPort *inputs;
    int num_outputs;
    OutputPort *outputs;
    char *dt_str;
    char *str;
    int ili;
    int mark;
} Node;
```

In one embodiment, two files may be written as output: A dataflow graph file and an emulation logic file. The following simple C source function may be examples of these files:

```
void subr (int a, int b, int *c, int mapno) {
    if (a > b)
        *c = a + b;
}
```

The example code below shows the dataflow graph file that may be produced when the example C function is compiled:

```
variable_count: 4
    "a" integer*4 scalar param
    "b" integer*4 scalar param
    "c" integer*4 scalar param
    "mapno" integer*4 scalar param
BLOCK 0:
    node_count: 6
    #0 SRC^INITIATE, input_count 0, output_count 1
        O0: 1 bits (r0) --> 4.0 3.0 2.0
    #1 SRC^ICMP_le, input_count 2, output_count 1
        I0: 32 bits (r3)
        I1: 32 bits (r2)
        O0: 1 bits (r1) --> 5.1
    #2 SRC^LD_SCALAR_VAL_DR23_32 "b", input_count 1, output_count 1
        I0: 1 bits (r0)
        O0: 32 bits (r2) --> 1.1
    #3 SRC^LD_SCALAR_VAL_DR22_32 "a", input_count 1, output_count 1
        I0: 1 bits (r0)
        O0: 32 bits (r3) --> 1.0
    #4 SRC^LATCH_AND_1, input_count 1, output_count 1
        I0: 1 bits (r0)
        O0: 1 bits (r4) --> 5.0
```

-continued

```
    #5 SRC^OUTPUT, input_count 2, output_count 0
        I0: 1 bits (r4)
        I1: 1 bits (r1)
TRUE TO_BLOCK 2
FALSE TO_BLOCK 1
BLOCK 1:
    node_count: 7
    #6 SRC^INITIATE, input_count 0, output_count 1
        O0: 1 bits (r5) --> 11.0 10.1 9.0 8.0
    #7 SRC^IADD, input_count 2, output_count 1
        I0: 32 bits (r8)
        I1: 32 bits (r7)
        O0: 32 bits (r6) --> 10.0
    #8 SRC^LD_SCALAR_VAL_DR22_32 "a", input_count 1, output_count 1
        I0: 1 bits (r5)
        O0: 32 bits (r7) --> 7.1
    #9 SRC^LD_SCALAR_VAL_DR23_32 "b", input_count 1, output_count 1
        I0: 1 bits (r5)
        O0: 32 bits (r8) --> 7.0
    #10 SRC^ST_SCALAR_VAL_DR24_32 "c", input_count 2, output_count 1
        I0: 32 bits (r6)
        I1: 1 bits (r5)
        O0: 1 bits (r9) --> 11.1
    #11 SRC^LATCH_AND_2, input_count 2, output_count 1
        I0: 1 bits (r5)
        I1: 1 bits (r9)
        O0: 1 bits (r10) --> 12.0
    #12 SRC^OUTPUT, input_count 2, output_count 0
        I0: 1 bits (r10)
        I1: 1 bits "0x1"
TO_BLOCK 2
    BLOCK 2:
    node_count: 2
    #13 SRC^INITIATE, input_count 0, output_count 1
        O0: 1 bits (r11) --> 14.0
    #14 SRC^OUTPUT, input_count 2, output_count 0
        I0: 1 bits (r11)
        I1: 1 bits "0x1"
EXIT
```

The example dataflow graph above has two sections. The first is a list of the parameters and local variables, with name, type and kind (parameter or local). The second section is a listing of code blocks. In this example, the code blocks were not merged. Each block has a unique id number, and a set of dataflow nodes. Every block has a SRC^AINITIATE node and a SRC^OUTPUT node as its beginning and ending nodes. For each node there is the following information: its function, its input and output counts, bit-width of each input, constant values for those inputs whose input is specified as constant, bit-width of each output, target list of each output (i.e., which other node input ports are fed by the output). Input and output ports may also have unique pseudo register ids in parentheses.

Figure 13:
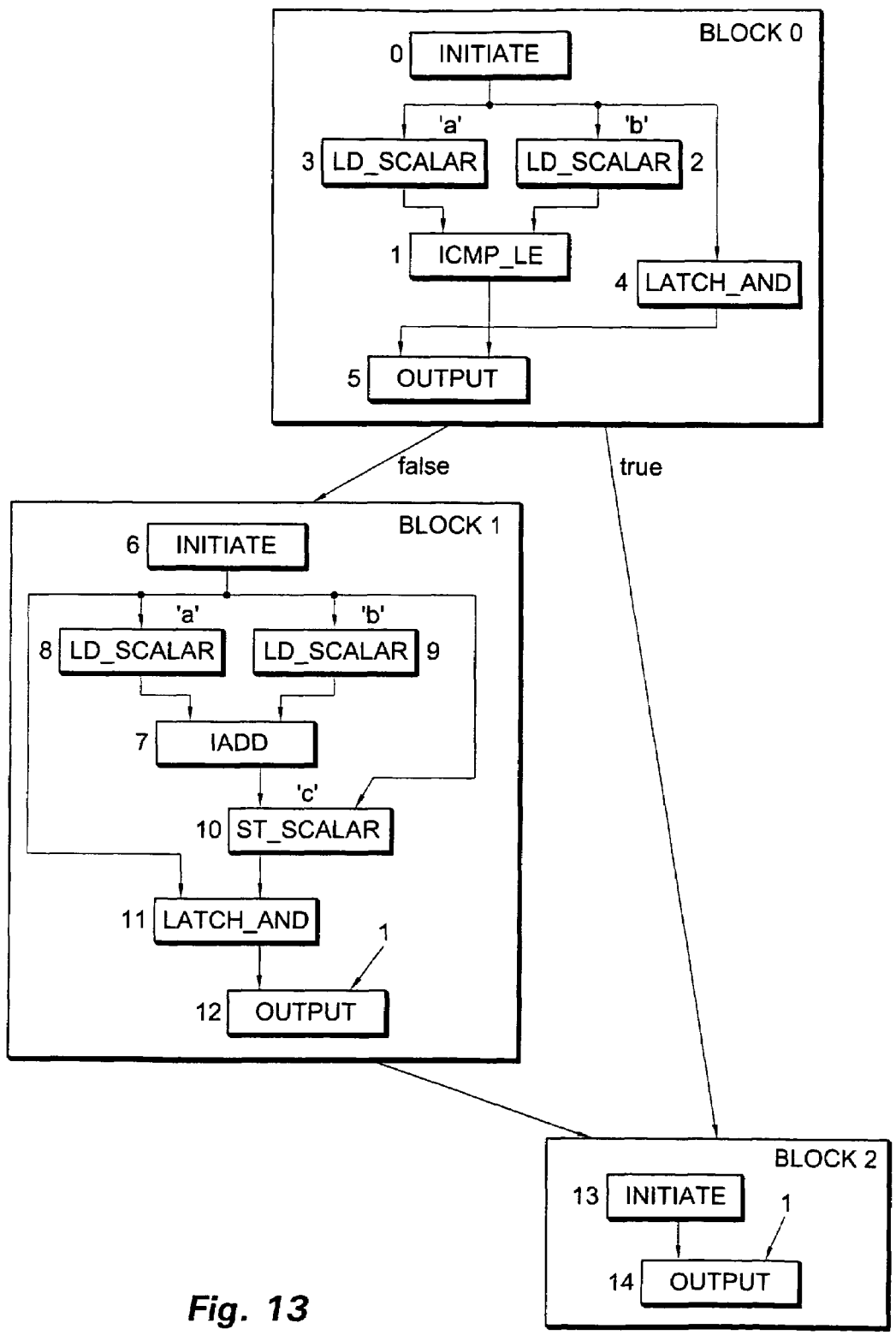
FIG. 13 shows another example of a dataflow graph according to an embodiment of the invention.

The end of each block may specify where control flow goes when the block is exited. Two target blocks may be specified as TRUE and FALSE targets when the block ends in a conditional. Otherwise one block may be specified, or EXIT may specified when the block is the exit of the function. FIG. 13 shows this set of code blocks in pictorial form.

Along with the dataflow graph file, an emulation logic file may also written. This may be a simple C routine that may be executed as a thread, emulating the reconfigurable logic part of a program. An example of an emulation logic file for an example C function may be shown as:

```
#include <sys/types.h>
#include <stdio.h>
#include <dfl.h>
#include <emul_funcs.h>
#define a_DF MAP_DR2
#define b_DF MAP_DR3
#define c_DF MAP_DR4
#define mapno_DF MAP_DR5
#define ULOGIC_FR_START MAP_FR2
#define ULOGIC_FR_DONE MAP_FR4
extern MAP_Control_t *DFG_map;
int num_new_refs = 0;
NameFireFunc *new_fire_ref = NULL;
NameExecFunc *new_exec_ref = NULL;
void tst076_logic_1 (MAP_Control_t *map) {
    uint64 src, val;
    DFG_map = map;
    while (1) {
        ULOG_WaitOnFRSet (map, ULOGIC_FR_START);
        ULOG_Write_FR (map, ULOGIC_FR_START, 0);
        src = ULOG_Read_DR_GRP (map, a_DF,
        MAP_DR_GRP1);
        DFG_store_scalar_value ("a", src);
        src = ULOG_Read_DR_GRP (map, b_DF,
        MAP_DR_GRP1);
        DFG_store_scalar_value ("b", src);
        src = ULOG_Read_DR_GRP (map,
        c_DF, MAP_DR_GRP1);
        DFG_store_scalar_value ("c", src);
        src = ULOG_Read_DR_GRP (map,
        mapno_DF, MAP_DR_GRP1);
        DFG_store_scalar_value ("mapno", src);
        dfg_simulate ("tst076.dfg", 0);
        val = DFG_load_scalar_value ("c");
        ULOG_Write_DR_GRP (map, c_DF,
        MAP_DR_GRP1, val);
        ULOG_Write_FR (map, ULOGIC_FR_DONE, 1);
        ULOG_WaitOnFRClear (map, ULOGIC_FR_DONE);
    }
}
void tst076_logic_2 (MAP_Control_t *map) { }
```

In the example emulation logic file above, an infinite loop may act as the FPGA. As such, it may obey the same protocols, in this example using flag registers FR2 and FR4 as start and end handshakes, respectively. When it receives the start signal from FR2, the emulation routine may load initial values for the user subroutine's parameters. It then may call dfg_simulate, passing in the name of the DFG file to be executed. The dataflow simulator may do a token-driven simulation, returning when the EXIT code block has completed. Final values of the parameters may then be returned, followed by a FR4 handshake. The routine may then go back to the top of the loop to await another signal that it should execute.

Another embodiment of the conversion of a basic block in the CFG to a code block in the DFG is now described. In this embodiment, loads/stores may be treated in two different ways, depending on whether they are scalar or array references. Scalar references may be converted to DFG edges, with a single load at the start of the block and a single store at the end. Array references may be converted to on-board memory (OBM) references.

Figure 14:
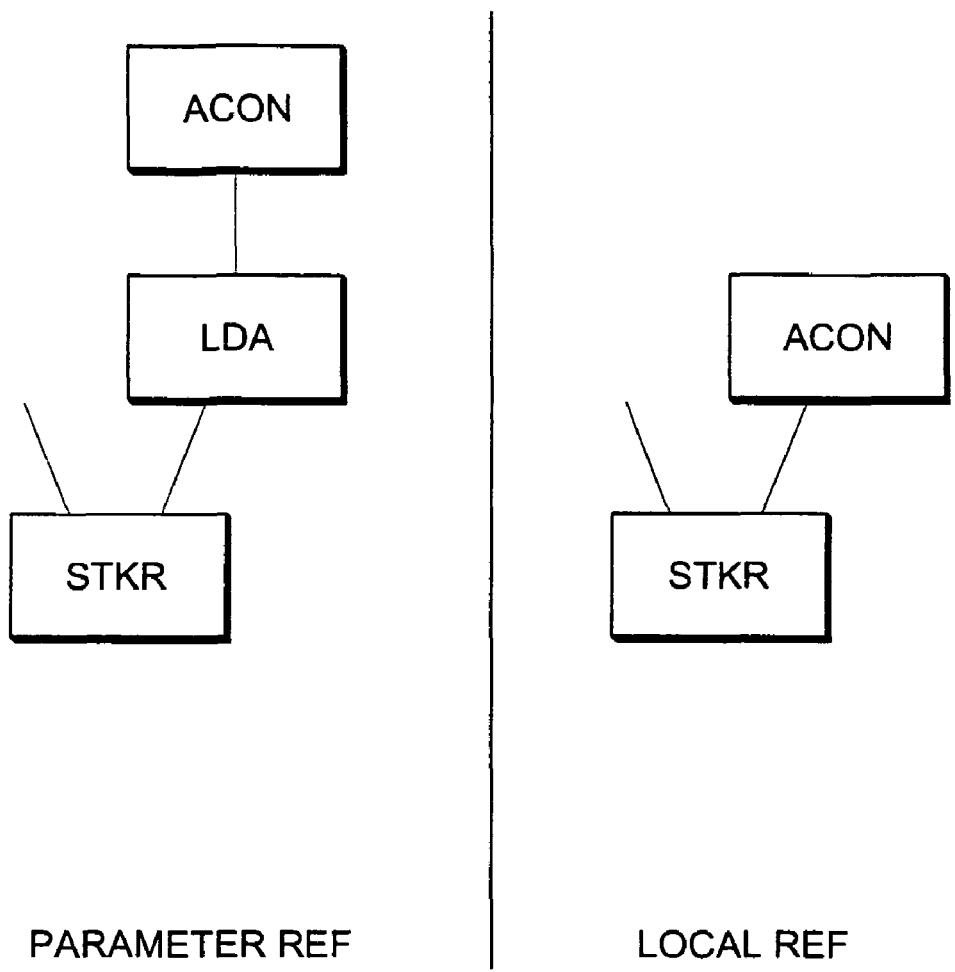
FIG. 14 shows an example of parameter versus local variable stores according to an embodiment of the invention.

Scalar variable references for pass-by-reference parameters may differ from local variable references. The CFG output of the compiler's front end may reflect this: It may put a level of indirection into such parameter references. FIG. 14 illustrates the distinction.

In another example, the following set of operations are considered:

```
a = b + c
c = b - a
a = c * 5
```

Figure 15:
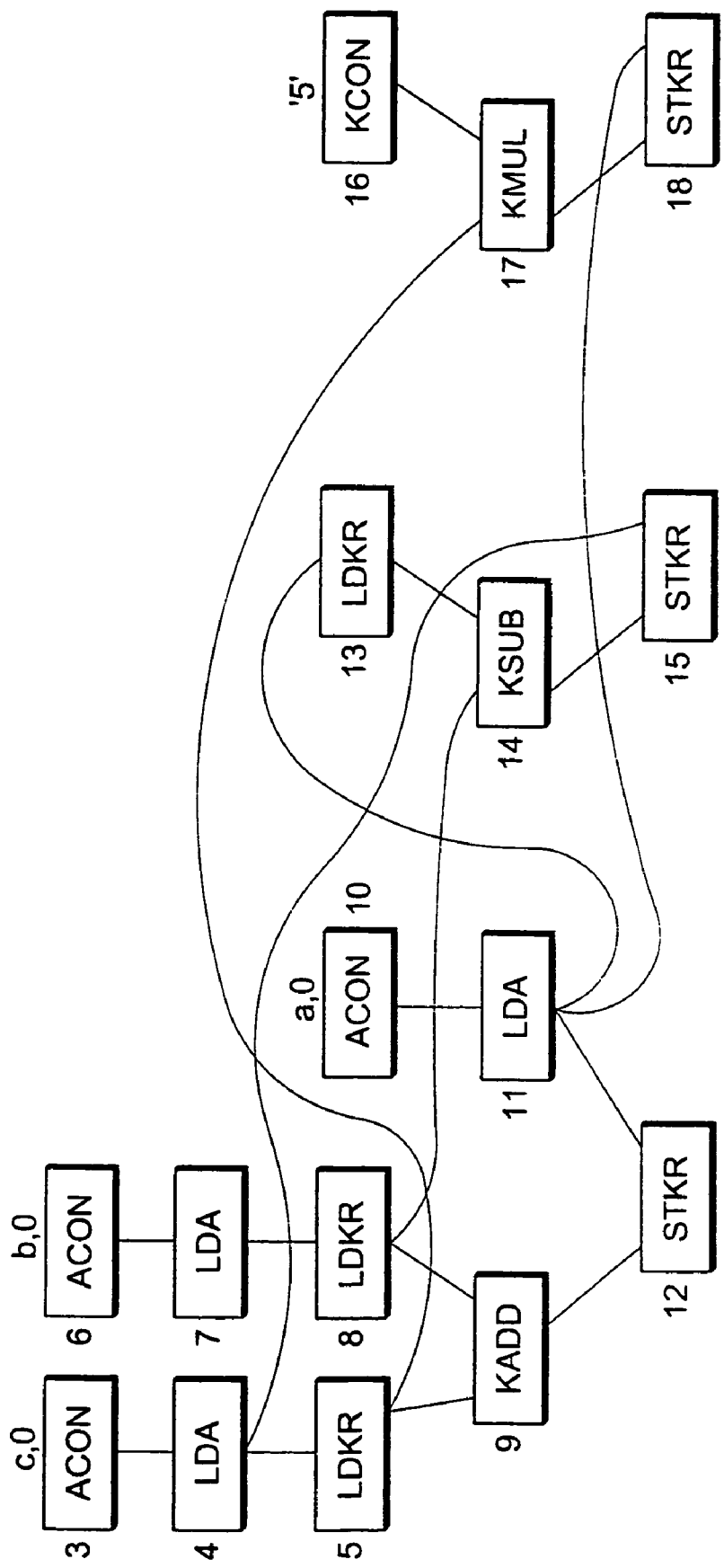
FIG. 15 shows an example of a graphical interpretation of an op-code sequence.

The front end may produce a set of op codes in its CFG output, shown in FIG. 15. Since this was Fortran source, the scalars may be brought in by reference, so the LDA (Load Address) nodes may perform an indirection step by fetching addresses from the addresses that may be input to them.

Note that the graph sharing may not indicate common subexpressions. For example, the output of node may go to two places, representing the two reads of variable 'c' in the code. Those two reads may not produce the same value however since there may be an intervening store in between them.

Figure 16:
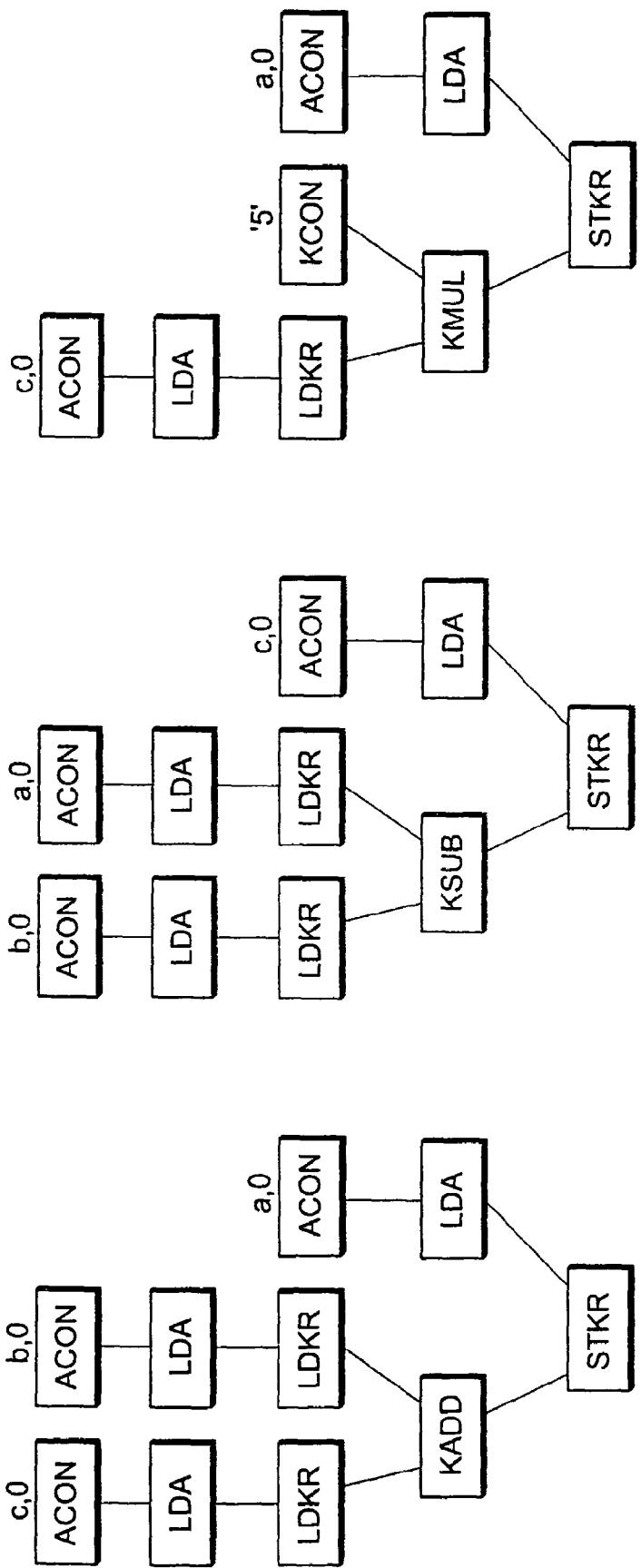
FIG. 16 shows an example of DFG fragments built up from the op-code sequence in FIG. 10 according to an embodiment of the invention.

In an embodiment, the first step in processing a basic block may be to build dataflow graph fragments from the op codes. This may be done by a routine that starts at each anchor (bottom-most) op code and recursively builds a tree above it. There may be no sharing among the fragments, so the result of this routine may be to build the fragments shown in FIG. 16.

Figure 17:
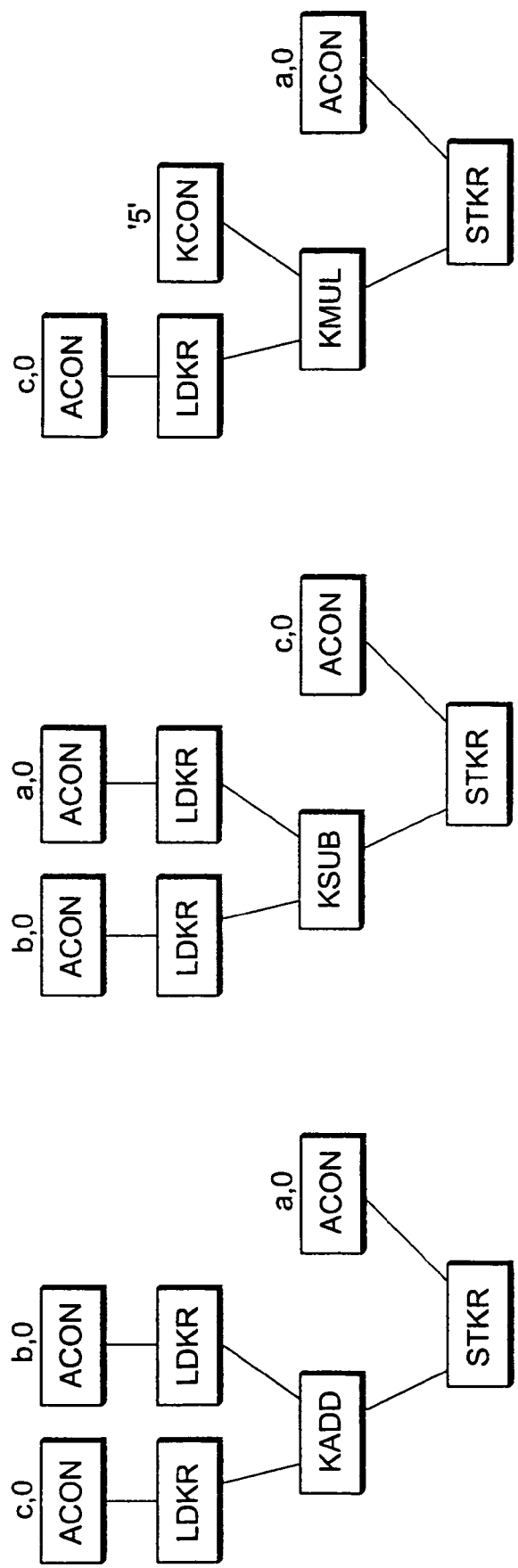
FIG. 17 shows an example of DFG fragments after removal of scalar param indirection according to an embodiment of the invention.

In an embodiment, after the DFG fragments are built, the LDA nodes may be removed from beneath any ACONs (Address Constants) that carry scalar pass-by-reference parameters. This reflects the fact that the MAP compiler (i.e, the portion of the system that compiles portions of HLL source code to reconfigurable hardware) may be treating them as copy-and-restore, rather than by reference. This may leave the DFG fragments looking like those shown in FIG. 17.

Next a list of all the referenced variables may be made, by starting at the anchors and looking upward to find ACONs. An INITIATE node may be created as the head of the DFG, and a layer of LD_SCALAR nodes may be created to bring in the initial values of the scalars. A temporary array of data structures may be created as a reference for the sources of each variable. An example of the structure is shown as:

```
typedef struct {
    int node;        // node that produces the value
    int port;        // port that produces the value
    char *name;      // name of variable
} SCALAR_ASSOC;
```

The array may be initialized to refer all of the variables to their LD_SCALAR nodes. Subroutine and function calls may be processed and then the DFG fragments may be converted to a DFG.

In one embodiment, the CFG-to-DFG conversion may be a routine that starts at the bottom of each DFG fragment and does the following: Scan upward to find load nodes. For each load, look at the ACON above it to determine which variable is being loaded. Remove the load node and rewire the node it targets so that it is fed by the current source of that variable. If the anchor is a store of a scalar, it looks at the right-hand input to see which variable is being stored. It then may eliminate the store node and record the node's left source as the new source for that variable.

In the example, when the first anchor is processed, the LDKR nodes for values 'b' and 'c' may be found; they may be eliminated and the nodes they feed may be rewired to be fed from the LD_SCALAR nodes at the top of the DFG. Then the STKR node may be eliminated and the KADD node may be noted, in the temporary array, as being the new source of variable 'a'. When the next anchor is processed, its two LDKR nodes may be found. The 'b' value's source may still be its LD_SCALAR node, but the 'a' value's source may be the KADD. The LDKR nodes may be eliminated and their targets may be wired to the appropriate sources. The STKR node may then be eliminated and the KSUB node may be noted as the new source of variable 'c'. When the third anchor is processed, its LDKR may be eliminated and its target may be rewired to the output of the KSUB. Then the STKR may be eliminated and the KMUL may be noted as the new source of variable 'a'.

Figure 18:
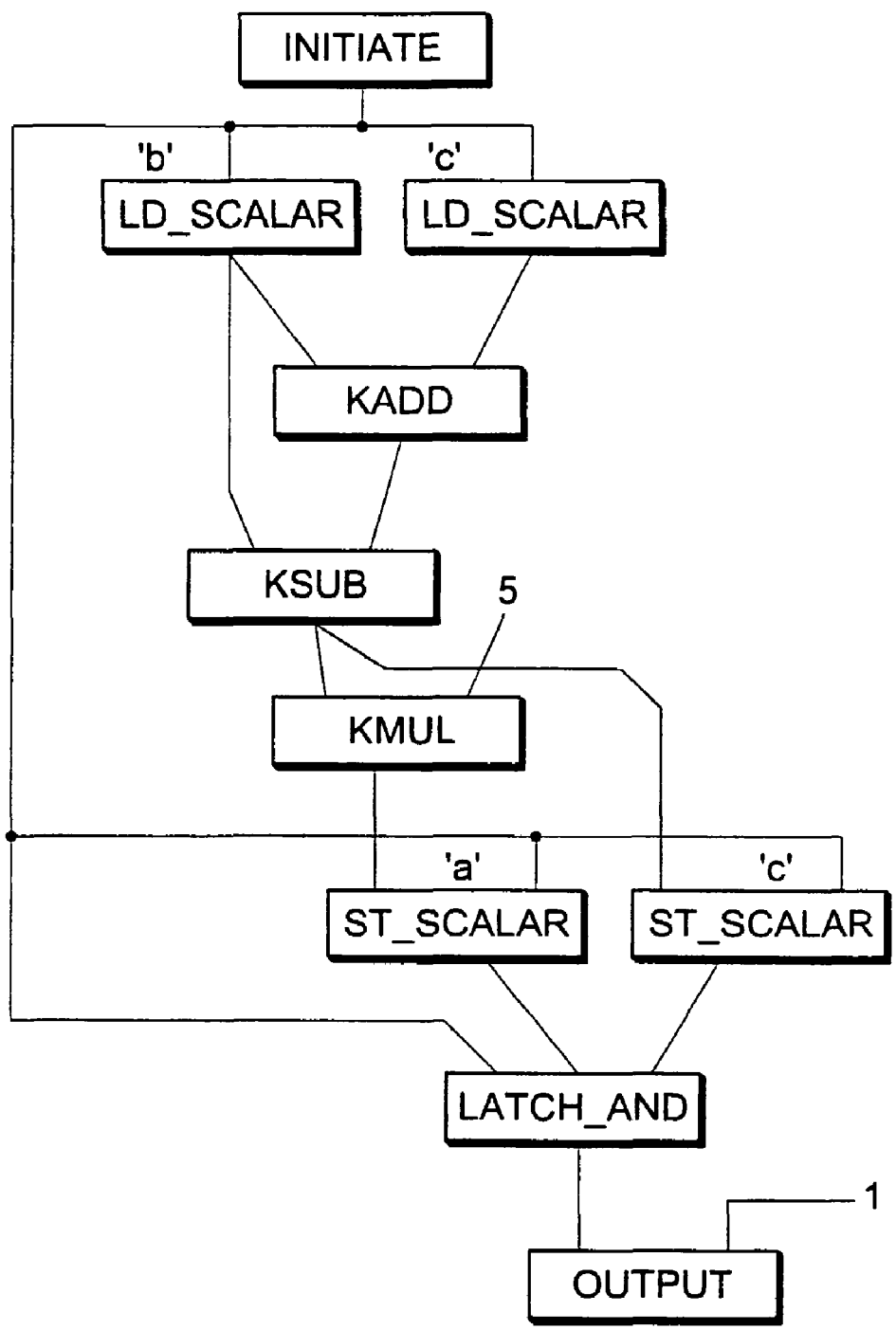
FIG. 18 shows an example of a DFG block code according to an embodiment of the invention.

Once all the anchors are processed, a layer of ST_SCALAR nodes may be created, storing the final values of the scalars by referencing the last sources of those variables. The ST_SCALARs have trigger outputs that may be gathered into a LATCH_AND node, and that node may feed an OUTPUT node at the DFG's bottom Any LD_SCALAR nodes whose outputs are unused may be removed by a dead-code elimination pass. The compiler may also looks for ST_SCALAR nodes that are storing the value that's coming from that variable's LD_SCALAR node, and may eliminate them since their values have not changed. FIG. 18 illustrates an example of the resulting DFG code block for this example.

In an embodiment, the DFG generator may distinguish between loads/stores of scalar variables versus loads/stores of array elements. When it sees a load or store node (e.g. LDKR or STKR), it may determine the kind of load/store by looking at its address input. If it sees something of the form shown in FIG. 14, it may use the ACON node to find the variable's name, and it may consult an internal 'variables' data structure to find out whether it is a scalar variable.

Figure 19:
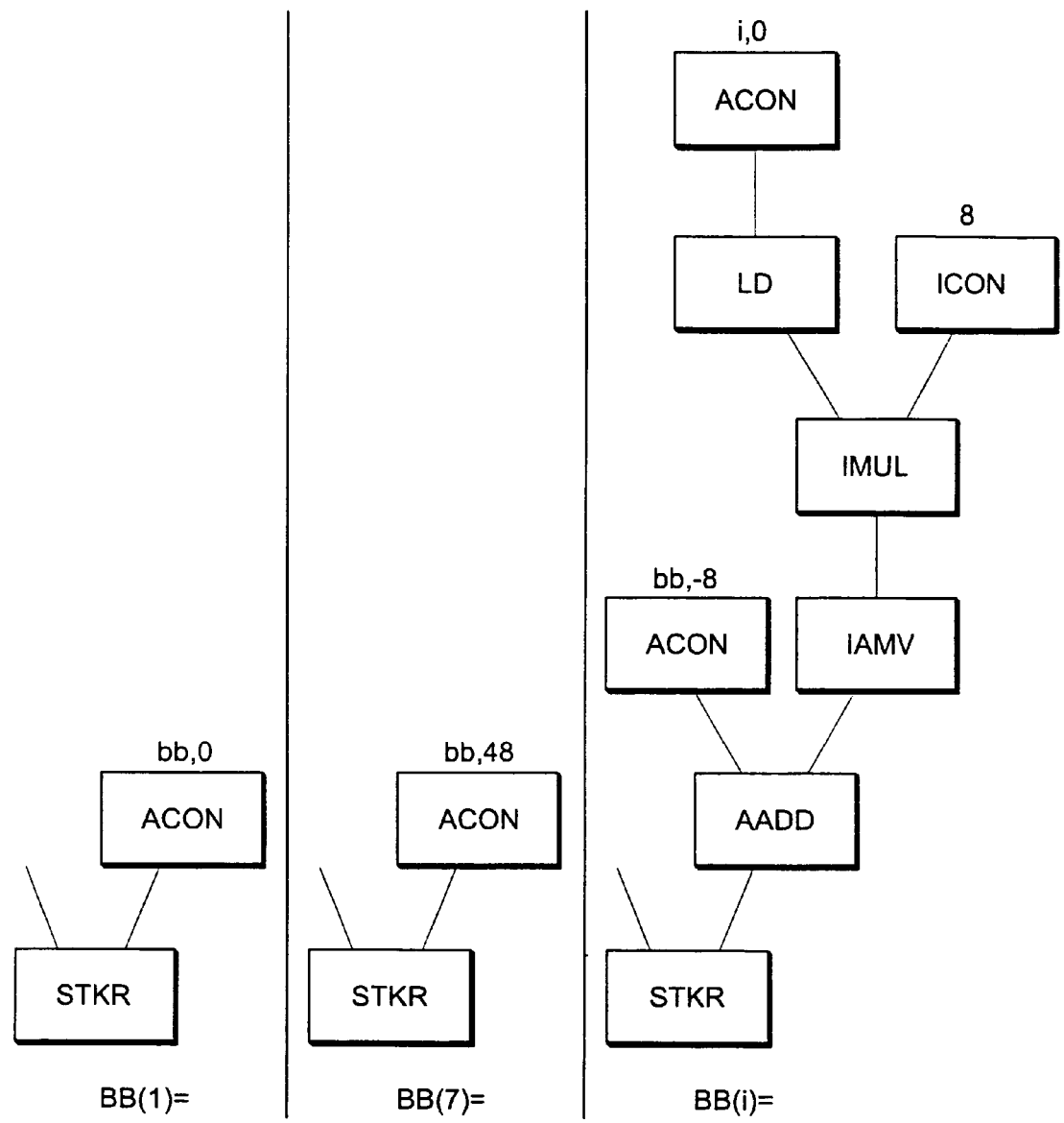
FIG. 19 shows an example of three array references used with embodiments of the invention.

FIG. 19 shows an example of what array references may look like. Note that in this example of a hardcoded '1' index, the reference looks structurally the same as a scalar local variable reference; consultation of the 'variables' structure may tell it that this may be an array. Note also that ACON nodes may have a variable name and a constant offset. In the second example in FIG. 19, the offset of 48 comes from the fact that the reference is six elements away from the base address, and each element is eight bytes in size. The third form is where the address is fed by an expression tree. Here the ACON node for 'BB' may be given a −8 offset to compensate for the fact that the array's indices start at one. The IMUL node may multiply by 8 because addresses are byte-oriented.

Load and store nodes for array references may be left in place, though each store node may be given an additional enable input. In the case of a basic block, this enable input may be fed by the block's INITIATE node.

In another embodiment, as the block's CFG is being transformed into a DFG, an anchor may be a subroutine call rather than a store. Consider the code fragment:

```
a = b + c
call xyz (b, a, c)
a = c * 5
```

Figure 20:
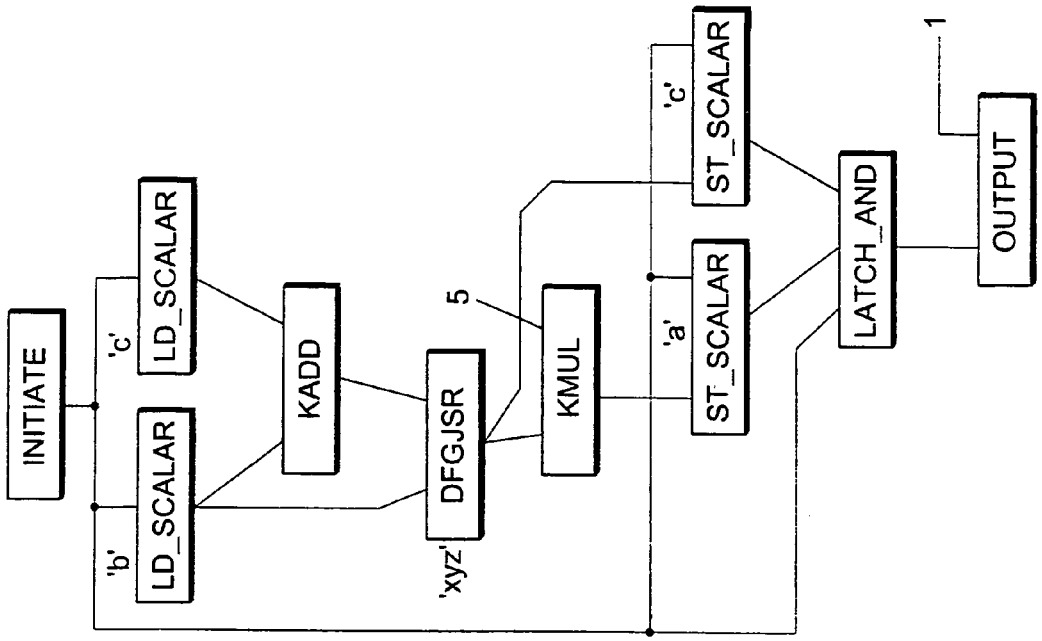
FIG. 20 shows op-code structures of a subroutine call and the corresponding block code according to an embodiment of the invention.
Figure 20:
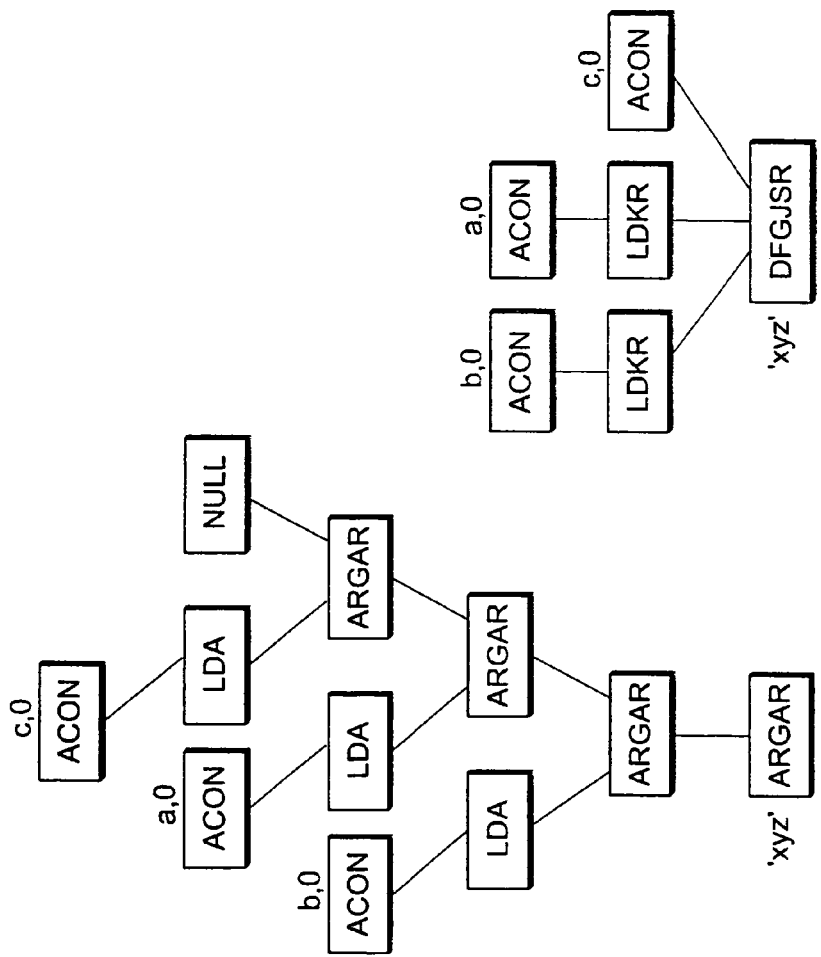

The front end output for this code is shown at left in FIG. 20. It may be fed by a linked list of ARGAR nodes, each bringing in one argument to the call. After the DFG generator has built the DFG fragments from the op codes, the routine may be called that finds the subroutine call anchors. For each one, it may remove the linked list of ARGAR nodes and gives the call node multiple inputs with the arguments wired to them. This requires knowledge about the subroutine, which may be drawn from the 'info' file. For a stateful node, an extra input may be created for connection to an enable signal. For an external node, an extra input and an extra output may be given for trigger and done signals. (Note that by the time this step is being performed, the extra indirection for scalar parameters may have already been removed.)

The info file may specify, for each argument, whether it is a value or an address. It also may specify which are inputs and which are outputs. If an input argument is a value (but not a constant), an appropriate load node may be created. If it's an address, it may be left unchanged. For this example, assume that this is a 2-input, 1-output subroutine. The middle of FIG. 20 shows the DFG code fragment for the subroutine call after the call has been converted to DFGJSR, and LDKR nodes have been added for the two inputs.

Later in the subroutine call processing, the DFGJSR node may cause another consultation with the info file. The two inputs may be handled in the same way as with inputs to other nodes: the source of the variable may be noted, the LDKR node may be removed, and the input may be wired directly to the source. For outputs, the incoming edge may be removed, the ACON node may be examined to determine which variable is receiving the output value, and that output may be noted as the new source of that variable. At right in FIG. 20 is the complete code block after conversion to DFG.

Calls to intrinsic functions may show up in the CFG output as non-anchor JSR and QJSR nodes. After the subroutine calls have been handled, the JSR and QJSR nodes that remain may be function calls.

An example of such a function call may be shown as:

```
a = b + c
c = min (b, a)
a = c * 5
```

Figure 21:
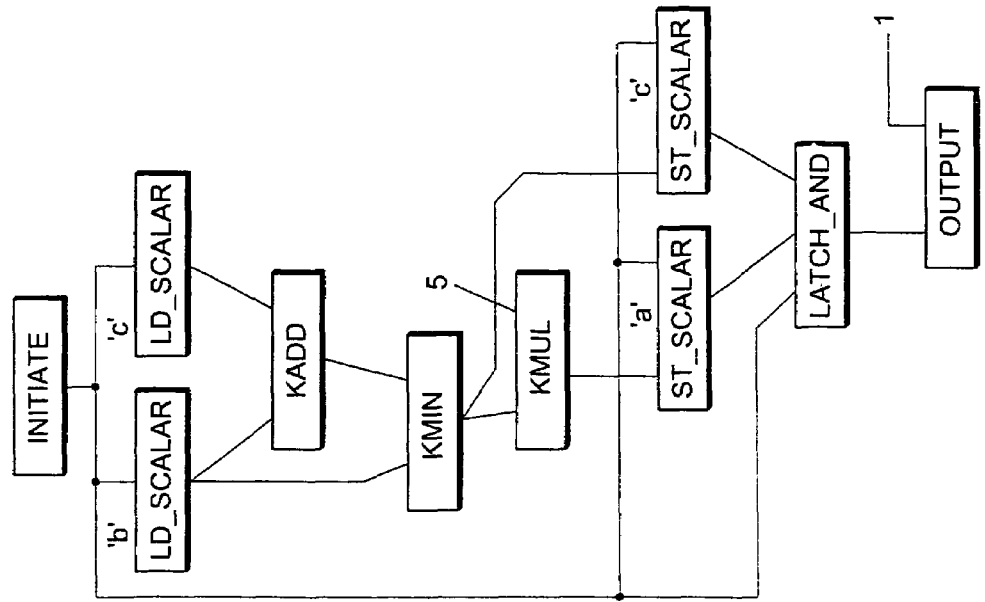
FIG. 21 shows op-code structures of a function call and the corresponding block code according to an embodiment of the invention.
Figure 21:
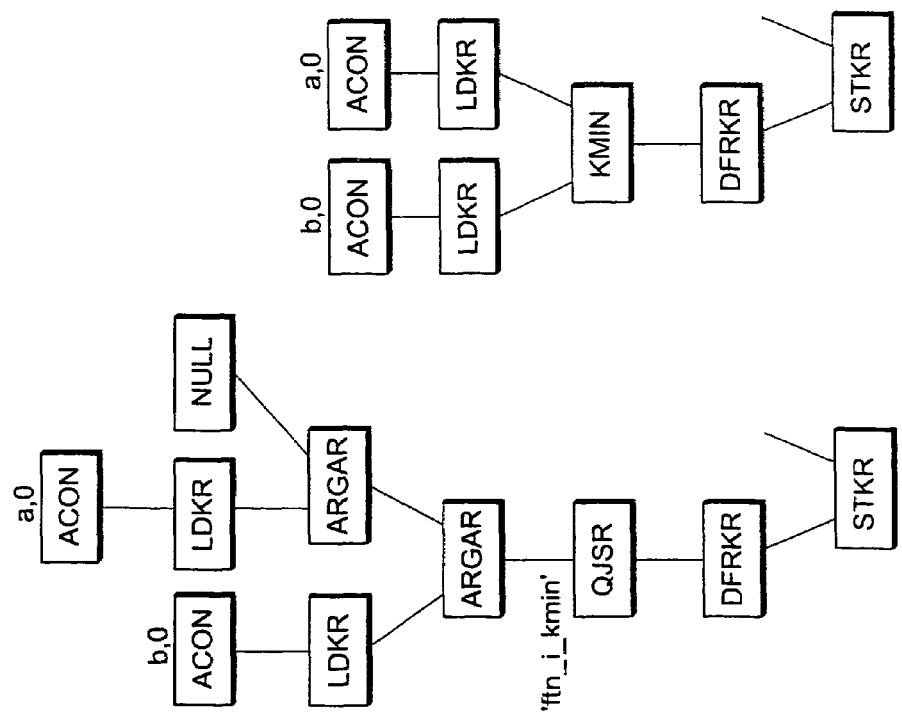

The function call may yield a CFG whose second assignment is shown in FIG. 21. As with subroutine calls, its arguments form a linked list. The arguments may be flattened to multiple inputs, as shown in the middle of the figure. From this point, the building of the DFG may take place in the usual way, yielding the graph shown at right of FIG. 21.

The basic block may end in a conditional branch. In this case, the second input to the OUTPUT node may be fed by the result of a compare. As an example, consider the code:

```
a = b + c
c = min (b, a)
a = c * 5
if (a .gt. 42) a = a + 1
```

Figure 22:
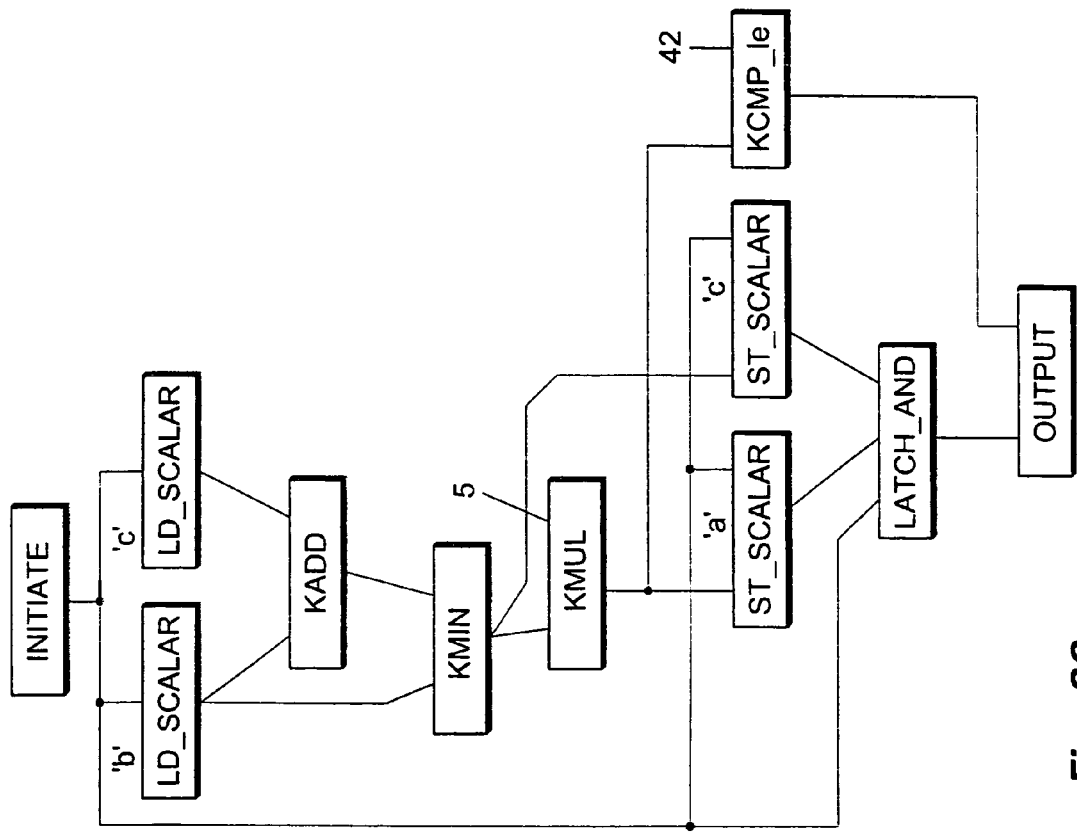
FIG. 22 shows op-code structures of a branch and the corresponding block code according to an embodiment of the invention.
Figure 22:
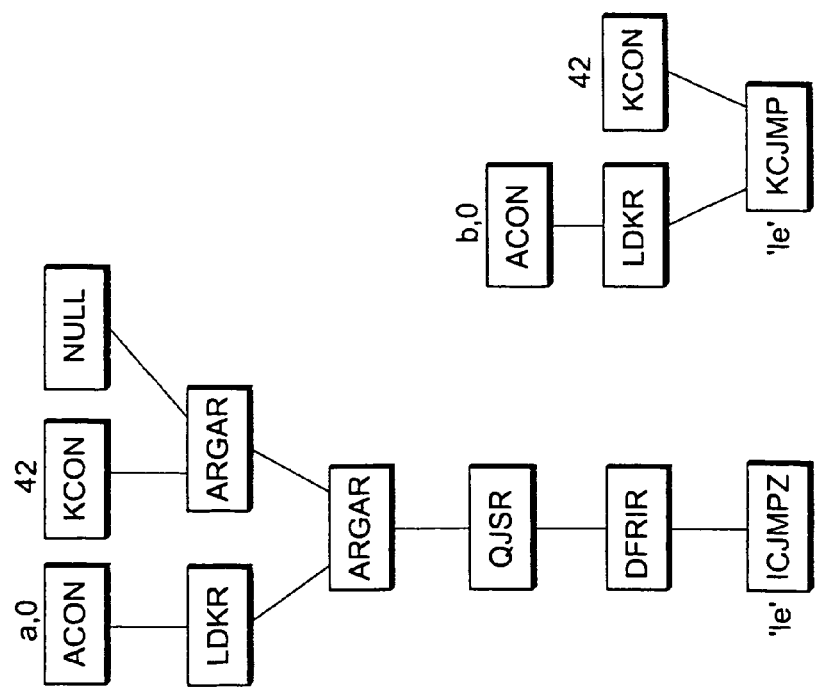

Note that the "a=a+1" statement is not part of the basic block; the block ends with the conditional test. The last anchor is the ICJMPZ node, and the structure above it is shown at left in FIG. 22. The QJSR, the DFRIR and the ICJMPZ nodes get replaced with a KCJMP. Later, the KCJMP may be turned into a KCMP_le. At right is the DFG for the code block, where the KCMP_le node may be fed by the final value of 'a' and its output goes to the second input of the OUTPUT.

Figure 10:
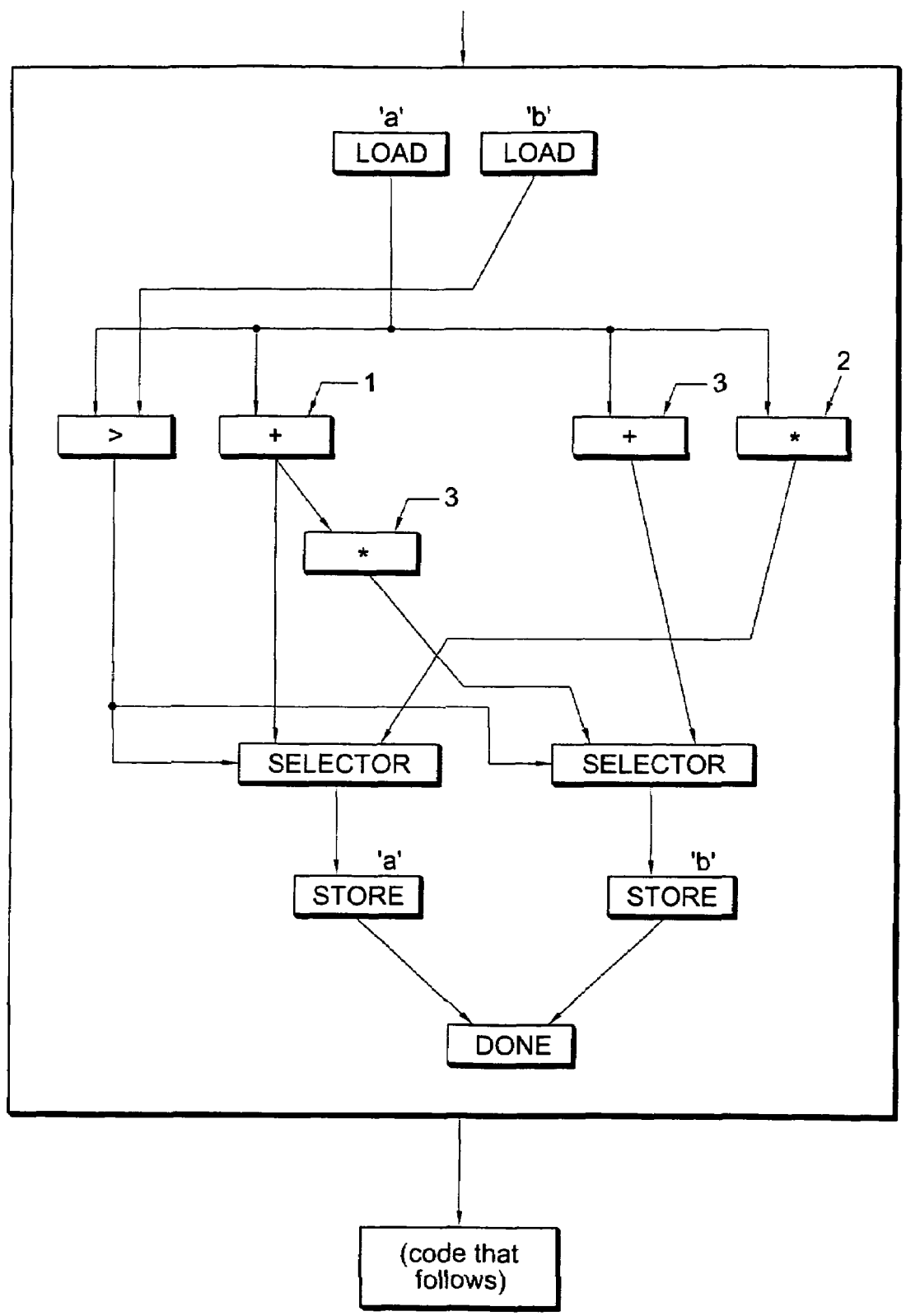
FIG. 10 shows an example of a dataflow graph with a conditional according to an embodiment of the invention.

As was shown in FIGS. 9 and 10, basic blocks may be merged into a single large code block. This process may include dealing with conditionals inside the code block by computing all paths and selecting the appropriate values using multiplexers, called SELECTOR nodes. As an example, consider the code:

```
aa = AL[i];
if (aa > 42)
    bb = aa + 1;
else                \\
    bb = aa − 1;
BL[i] = bb;
```

In this example, both expressions aa+1 and aa−1 are computed in each iteration, and the 'bb' value that is assigned to the 'BL' array is fed by a SELECTOR. The job of building a merged code block out of various basic blocks may include building the DFG segments for the individual blocks, and wiring them together using selectors and control signals derived from the predicate expressions of the conditionals.

In an embodiment, the first step in creating a merged code block may include topological sorting of the merged basic blocks. This as the blocks are processed, blocks that feed control to a given block may be converted before that block is converted. In the early steps of processing, each block may be converted to a DFG similar to individual blocks. LD_SCALAR nodes may be built at the top of the DFG. Then the code blocks may be converted. The differences between a merged code block and an individual basic block may include the Boolean control signals and the selector node hookup.

Figure 23:
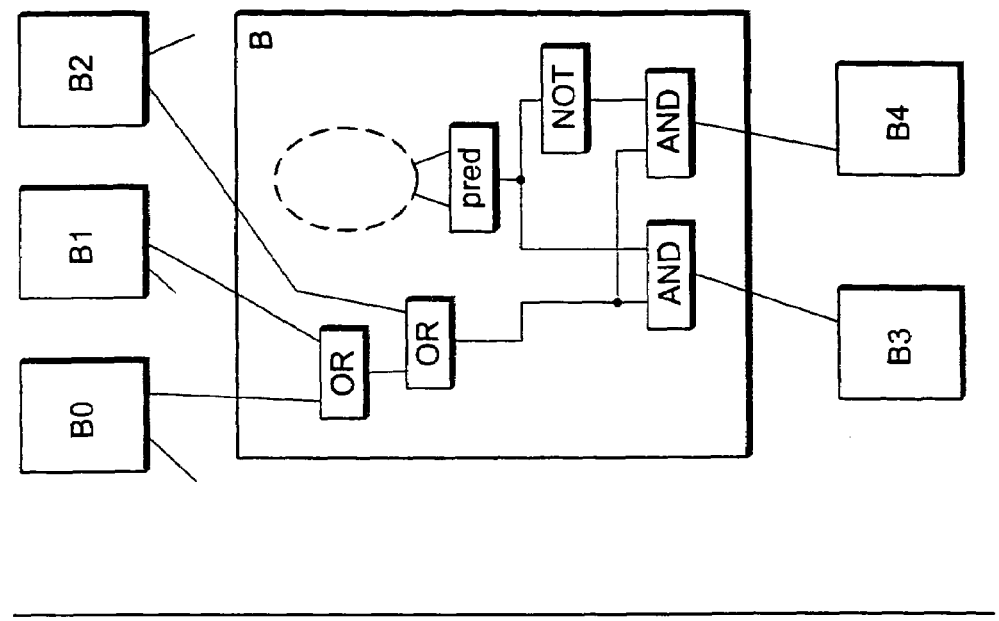
FIG. 23 shows a portion of a CFG representation with basic blocks and logic added to a center block to handle incoming and outgoing flow control according to an embodiment of the invention.
Figure 23:
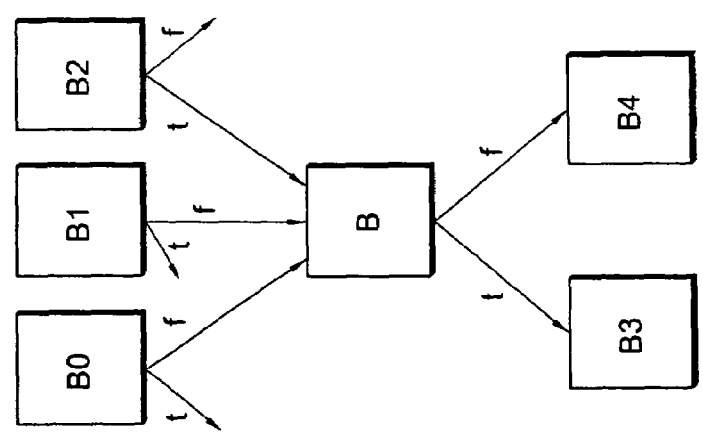

In an example, consider an arbitrary block 'B' in a set of blocks to be merged, with three blocks able to send control to 'B', and 'B' sending control to one of two blocks when it is done. (Note: there may be any number of blocks that can send control to a block, but a given block sends control to two blocks). FIG. 23, at left, shows this. Assume that there is a one-bit signal from each of the incoming blocks that is high if it is transferring control to block 'B'. Block 'B's active signal is computed by ORing the incoming signals. Block 'B' then may compute activation signals for the two blocks that it can activate. Since 'B' can activate two blocks, it ends with a conditional. The conditional's predicate is ANDed with the block's activation signal to provide an activation signal for the "true" signal, and the inverted predicate is ANDed with the block's activation signal to provide an activation signal for the "false" signal. FIG. 23, at right, shows the nodes that compute these signals in 'B'.

The basic block data structure has fields to store control information that may include: The 'incoming' field, which is a linked list of all the blocks that have control flow edges into the current block. The 'active' field, which is the id of the node whose output represents the current block's active signal, i.e. the output of the OR node sequence. The 'src_true' field, which is the id of the node that computes the "true" output control signal. The 'src_false' field, which is the id of the node that computes the "false" output control signal.

Figure 24:
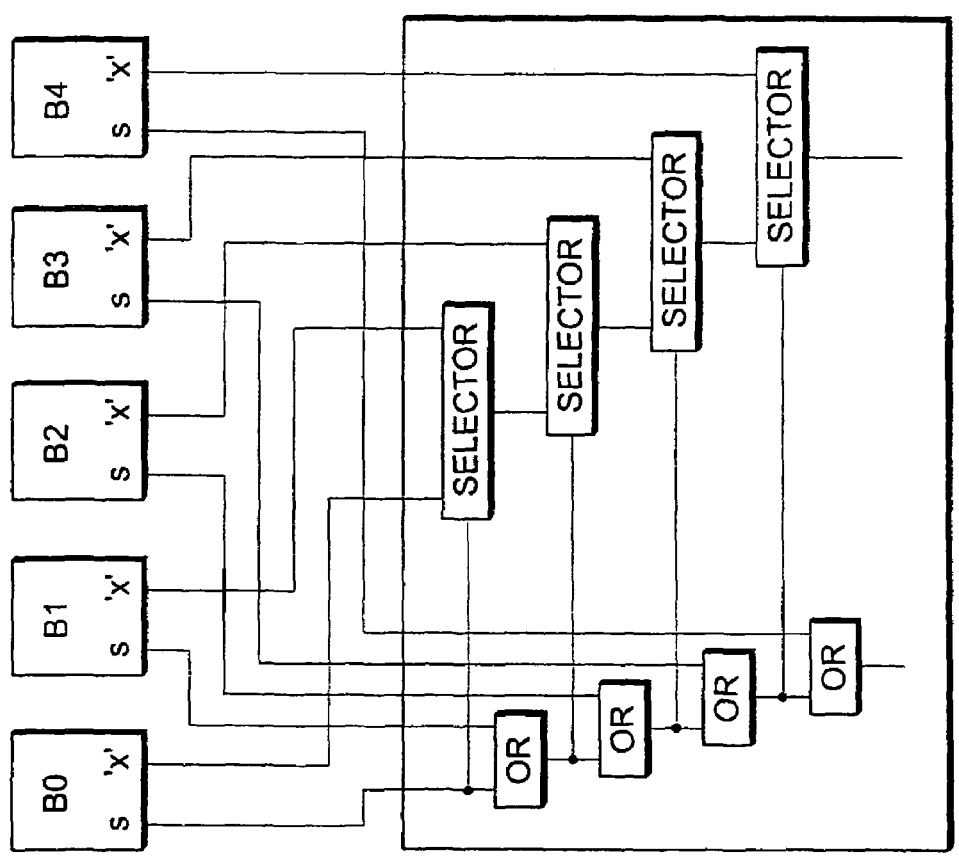
FIG. 24 shows basic blocks with selector inputs tied to the blocks' OR nodes according to an embodiment of the invention.

After the control signals have been built, selectors are installed for the incoming data values. FIG. 23 shows the selector nodes added to the example of FIG. 24, for a variable 'x'. The outputs from the OR chain may feed these selectors. A set of selectors may be created for each variable in the loop.

The conversion of an inner loop to a pipelined DFG may build on the conversion techniques described above. Consider an example of a loop shown as:

```
common /banka/ AL(0:9999)
common /bankb/ BL(0:9999)
do i = 0,n−1
aa = AL(i)
call xyz (aa, bb)
BL(i) = bb
enddo
```

Figure 25A:
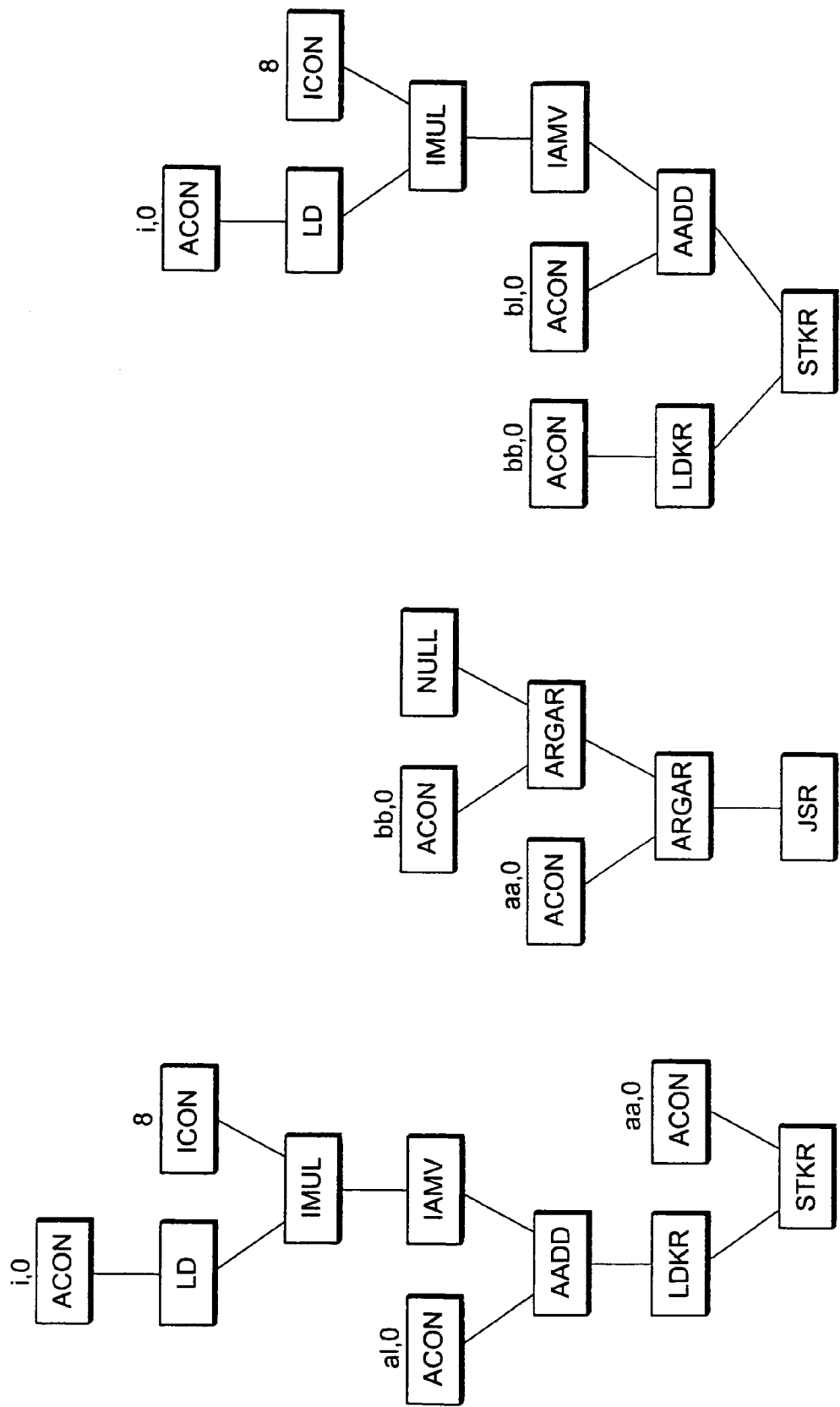
FIG. 25A shows examples of op-code subtrees used with embodiments of the invention.
Figure 25B:
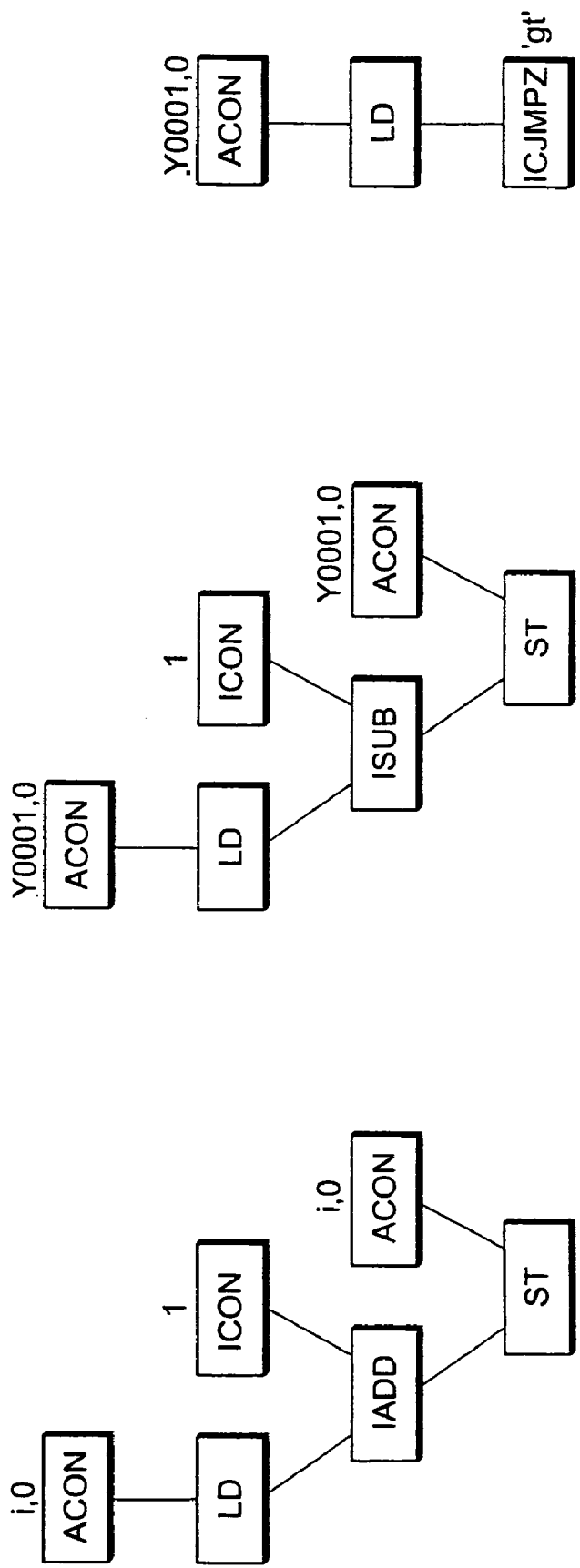
FIG. 25B shows more examples of op-code subtrees used with embodiments of the invention.

The loop is a single basic block, with a conditional branch to itself. FIGS. 25A & 25B shows the code fragments for the anchors. The first one reads 'AL(i)' and stores it in 'aa'. The second once calls the subroutine 'xyz'. The third one stores 'bb' into 'BL(i)'. The fourth increments 'i'. The fifth decrements '.Y0001'. The sixth tests '.Y0001' and branches back to this block if it is greater than zero.

This loop's code block could be transformed using the basic block approach. Each time the block was fired, it would do its loads, compute its values, and do its stores. Then it would pass control back to itself and repeat for the next iteration. While there would be some instruction level parallelism in this execution. In another embodiment, array values may be read and written on every clock, taking advantage of pipelined implementations of the various functional units.

To achieve pipelined execution, a loop "generator" may be created, which will control the loop by firing off iteration at specified intervals. This node may be called LOOP_DRIVER. It may be triggered by the INITIATE node at the head of the code block, and may begin to emit a train of pulses. Each pulse may signal the firing of one iteration of the loop. The LOOP_DRIVER node may not determine when the loop is finished. Other parts of the dataflow graph may test for termination conditions. An iteration may be fired on every clock tick, or may be slowed down to accommodate loop carried dependencies or multiple OBM accesses. An input to the LOOP_DRIVER node may specify its "duty cycle" (i.e., how many clock ticks should occur between iteration firings).

Loop-carried scalar dependencies may exist, so there may be a mechanism to manage these in the pipelined loop. The CIRCULATE node (in 32- or 64-bit form) exists to hold the current value of a scalar variable, and may be connected to the LOOP_DRIVER node's output. When the CIRCULATE sees its first input go high, it knows that the loop is starting up. It may capture the initial value from its second input, and thereafter proceeds to capture a new value from its third input each time the LOOP_DRIVER fires an iteration. This third input is its "circulated" value. In the case where the scalar variable does not change its value in the loop, the CIRCULATE node's output may be connected directly to its own third input.

In an embodiment, loop termination may be determined by a conditional test somewhere in the loop body. Since the loop may be pipelined, by the time the termination condition is detected there may be some additional iterations already under way. These overflow iterations are not harmful as long as they are prevented from writing values to OBM. Thus the termination detection may gate an enable signal to the OBM stores in the loop. It also may trigger a TERMINATION node that in turn signals the ST_SCALAR nodes to capture the current values of the scalar variables.

Figure 26B:
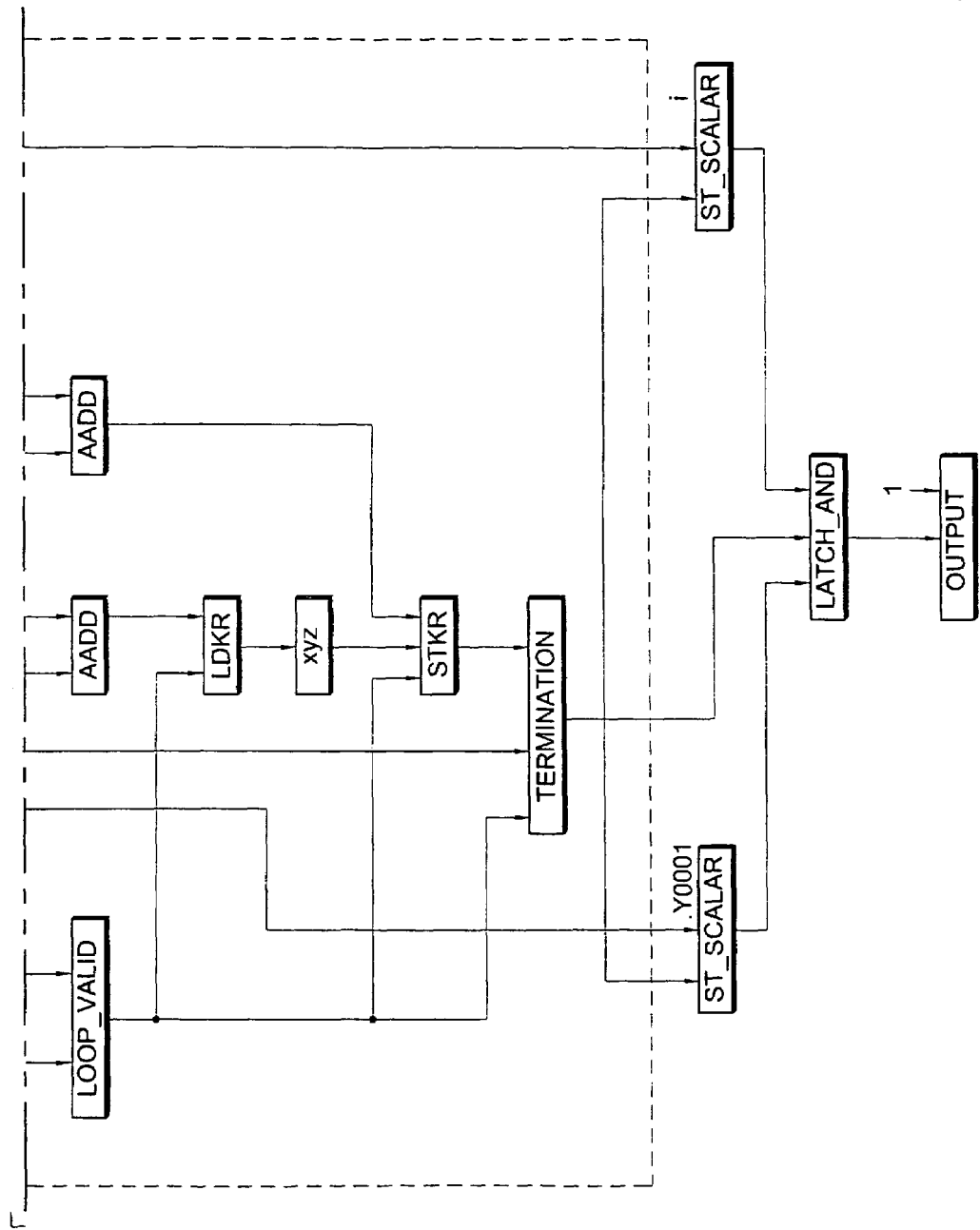
FIG. 26 shows an example DGF for a loop used with embodiments of the invention.

FIG. 26 shows an embodiment of the DFG for the loop of FIGS. 25A & 25B. The top layer of LD_SCALAR nodes and the bottom layer of ST_SCALAR nodes may be the same as in a simple basic block DFG. The shaded area shows the loop-specific part of the graph. There are CIRCULATE nodes for variables 'al', 'bl', '.Y0001' and 'i'. The first two of these may be base addresses that do not change. The last two are down and up-counters, respectively. The LOOP_DRIVER is the loop's controller. The zero on its second input indicates that it does not need to insert any clock ticks in between loop iterations. The CIRCULATE nodes watch the LOOP_DRIVER's output signal; each time it indicates a new loop iteration, they capture their circulated input values. Loop termination may be detected by the IGT node, which compares the down-counter with zero. When the IGT output goes false, the LOOP_VALID detects this and disables the LDKR and STKR nodes, and signals the TERMINATION node. The TERMINATION node in turn triggers the ST_SCALARs so that they capture the final values from the CIRCULATE nodes.

Figure 27:
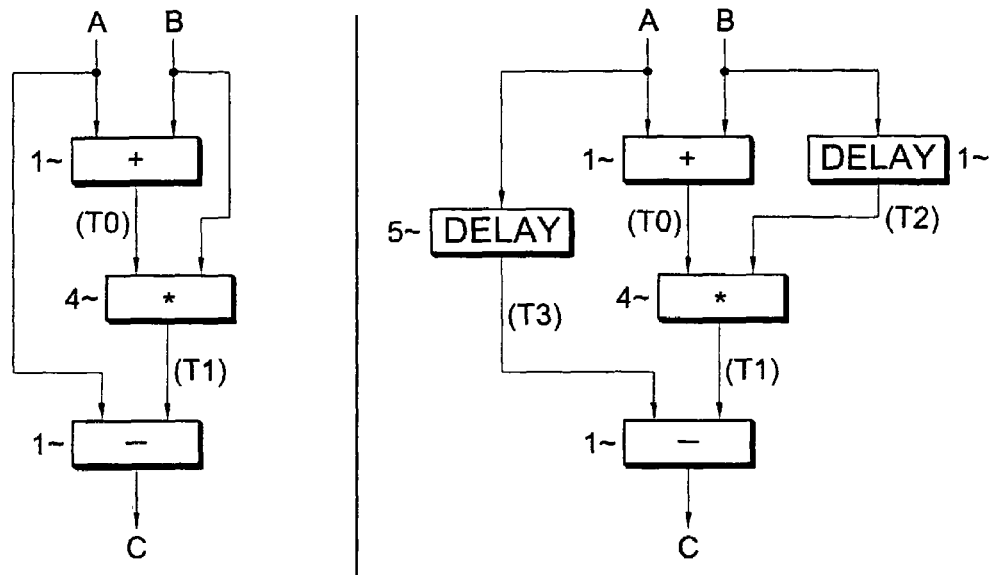
FIG. 27 shows an example of a pipelined DFG without delays according to an embodiment of the invention.

In an embodiment, pipelined logic in each functional unit may be active on every clock tick. Appropriate "matching" may be done for the values appearing on the input ports of any given functional unit. FIG. 27, at left, shows a DFG fragment that computes the expression C=A−(A+B)*B, with some assumed latencies next to the nodes. Below it is a chart showing the values of the signals on each clock tick. Because of the node latencies, the values appearing at the ports of the multiply and subtract nodes may not aligned properly. Delay nodes, which are fixed length FIFO queues, may be inserted as shown at right. The insertion is done such that, for every node in the DFG, the path lengths to all of its inputs may be equal.

Figure 28:
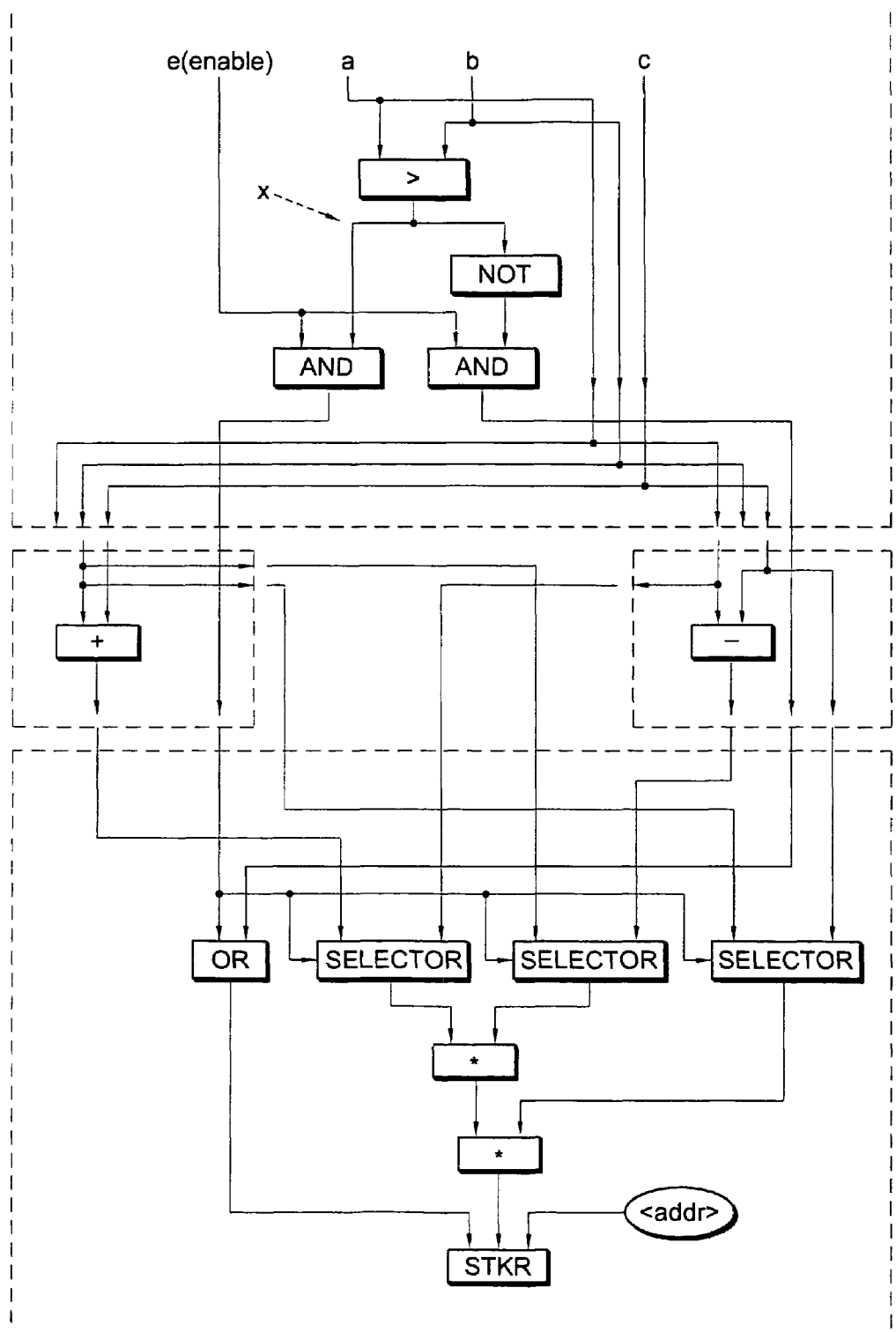
FIG. 28 shows a portion of a code block after merging according to an embodiment of the invention.

After the DFGs are built, a variety of optimizations can be performed. For example, after the control-dataflow graph code block has been created, some SELECTOR nodes in the graph may have both value inputs fed from the same source. Such a node can be eliminated since the same value is being selected regardless of the predicate value feeding it. This situation occurs often when basic blocks have been merged to form one larger code block. FIG. 28 shows part of a code block that occurs when the following code fragment has its blocks merged:

```
if (a > b)
    a = b + c;
else
    b = a − c;
X[i] = a * b − c;
```

In this example, the right-most SELECTOR's two value inputs are fed by the same source, because 'c' has not been assigned in either branch of the conditional. This SELECTOR can be removed.

In another example, merged code blocks often show opportunities for simplification of Boolean expressions. FIG. 28 shows an example. The output of the OR node is the Boolean expression ex+ex', which simplifies to e. The OR node can be eliminated. More significant opportunities like this occur when nested conditionals are merged. Also, pipelined loop code blocks may be fused, feeding the output values from one loop directly into another loop.

The Partitioner

Figure 29:
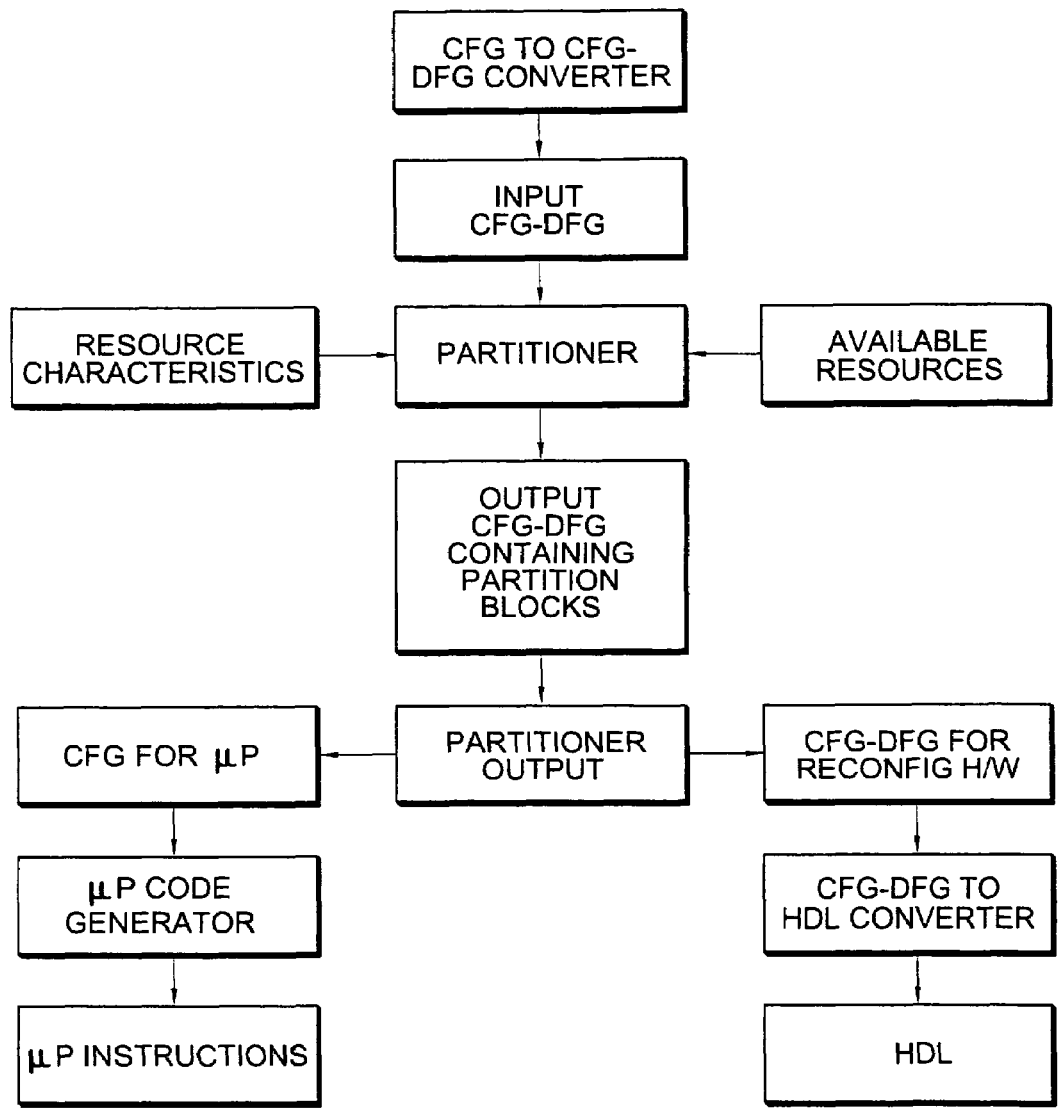
FIG. 29 shows a flowchart for partitioning CFG-DFG representations into a reconfigurable hardware portion and an instruction processor portion according to an embodiment of the invention.

Referring now to FIG. 29 an embodiment of the partitioner component of the invention is shown. In one embodiment, the partitioner component may determine where portions of an algorithm will be executed, and therefore the targets of the compilation process. The partitioner may operate on the control-data flow graph internal representation of the HLL that defines the algorithm being compiled. The control-data flow graph taken by the partitioner may be the CFG-DFG produced by the CFG to CFG-DFG converter. The CFG-DFG is the graph of a set of functions that may be found in the file being compiled. The decision process results in portions of the code targeted to instructions for the instruction processor, and portions of logic in multiple reconfigurable chips contained in multiple reconfigurable processors.

The partitioning process may take a single control-data flow graph as input and produce a set of output control-data flow graphs, each with a specific targeted implementation. The output CFG-DFG may be composed of partition blocks, which are sub-graphs of the original, and edges which represent the connections between the partitioned code.

The partitioning decision is based on several factors including: the nature of the input control-data flow graph, the available hardware resources, and the size and performance characteristics of the hardware resources, among other factors.

Many partitioning algorithms can be devised, and alternative algorithms may be invoked and evaluated in the decision process. Each such partitioning process has as its objective the targeting of hardware resources according to an optimization strategy. Given an input control-data flow graph may create a set of connected sub-graphs that fit within the available resources of the hybrid computing platform, while meeting a set of optimization criteria. The optimization criteria could for example be, maximizing the use of reconfigurable resources, minimizing the number of reconfigurable chips, minimizing the interconnection, or maximizing overall performance.

From the initial control-data flow graph a new graph is created that may be composed of partition blocks and edges. Each partition block contains a sub-graph of the original control-data flow graph (i.e., CFG-DFG) and an assignment to a reconfigurable chip or instruction processor. Each edge of the new graph may represent a physical connection between the assigned resources.

The task of partitioning then becomes one of creating partition blocks that meet optimization criteria, size limitations, and can be feasibly connected to the other partition blocks. The following describes one such partitioning approach for achieving an optimum performance across a hybrid system.

In one embodiment, the partitioning step may be defined as an assignment of sub-graphs to partition blocks based upon programmer supplied partitioning syntax or directives, such as C pragmas or compiler directives, that have been passed to the partitioner as annotations in the input control-data flow graph.

If any of the CFG-DFG sub-graph remains after acting on the programmer provided partitioning syntax direction on partitioning, then the compiler initiated partitioning may proceed as follows: enumerate all sub-graphs of the remaining CFG-DFG as candidate partition blocks; order the candidate partition blocks in order of potential, using information including: profiling data from instruction processor profiler, and DFG emulation profiling, performance estimates based on the degree of parallelism, and performance information found in the hardware logic module information file for each operation of the block, and performance of the data flow between the candidate partition block and adjoining blocks; compare partition block estimated performance as reconfigurable logic versus instruction processor code; assign candidate partition block to chip or instruction processor based on comparison; proceed through all candidate blocks; order candidate partition block by estimated performance; and select final candidate block that completely cover the CFG-DFG construct output CFG-DFG containing partition blocks.

Once this is completed the set of partition blocks may define the execution locations and the control-data flow graphs that are loaded into those resources. The partition blocks are passed to a HLL converter. Blocks intended to run on the instruction processor may continue the compilation process into code generation and production of object files. The blocks that are targeted for reconfigurable chips, may be passed to the HLL converter to generate the MAP Proxy code, and then pass the CFG-DFG to CGF to CFG-DFG converter to continue the process of generating logic. The partition block eventually continues the compilation process to CFG-DFG to HDL converter and ultimately to the creation of a bitstream to be included in a unified executable.

Preparing for HDL Conversion

One of the outputs of The CFG to CFG-DFG converter is an ASCII text file that represents the transformed data flow graph of the procedure being compiled. The next step in compilation is the translation of this file (i.e., a .dfg file) into a format usable by the CFG-DFG to HDL converter verilog code generation phase of compilation. The MAP compiler implements a software module including logic instructions that translates an ASCII .dfg file into CFG-DFG to HDL converter internal formatted tables representing the procedure being compiled in CFG-DFG to HDL converter "tuple" format. The translated tables may be written to a binary formatted file (.grf file) which is one of the inputs to the CFG-DFG to HDL converter.

An embodiment of the translator may have the following steps: In a first step, the command line may be parsed. The software module has one non-optional argument, which is the input file name (i.e., the .dfg file). If the input file argument is specified, then the file name is saved and the file is opened. If the input file cannot be opened, processing terminates.

The next step in the conversion is the reading and parsing of the input file. Parsing may be performed by calling routines generated by flex (scanner generator) and bison (parser generation). As the files are parsed, the software module builds internal data structures to represent the data flow graph. The internal data structures used to represent the graph are the same structures used by The CFG to CFG-DFG converter. The two primary structures are an array of structures representing procedure variables, and array of structures representing the basic code blocks comprising the executable portion of the procedure being compiled.

Then, the software module may begin construction of the CFG-DFG to HDL converter tables. In one embodiment, this step is performed after the internal structures for the data flow graph have been built. The output file name may constructed from the input file name, e.g., by substituting a .grf suffix for the .dfg suffix. The input file name may be entered into a CFG-DFG to HDL converter FILENAME table, and the output file name may be entered into the CFG-DFG to HDL converter OUPTPUT_FILES table.

Then, the symbol table may be translated to the CFG-DFG to HDL converter SCALARS table. In one embodiment, this step takes place after the CFG-DFG to HDL converter tables are initialized. The formal parameters to the procedure being compiled are by convention the first entries of the CFG-DFG to HDL converter SCALARS table. A pass is made thru the data flow graph's variables array to extract the formal parameters. For each parameter, a flag may be set in the SCALARS table indicating it is a formal parameter to the procedure. One of two other flags may be set in each entry indicating if the parameter is a scalar variable or an array. The .dfg memory storage size for a scalar or a single array element is its bit length. This may be converted to byte length and inserted in the SCALARS table entry for each parameter. Finally the name of the parameter is inserted into the SCALARS table entry and the entry completed parameter entry is inserted into the SCALARS table.

When all the formal parameters have been processed, a second pass may be made through the data flow graphs symbol table and the remaining entries for the variables that are not formal parameters to the procedure may be processed. The processing may be performed as described for the formal parameters, except the SCALARS table entries have a local variable flag set in them instead of a the flag indicating the entry is for a formal parameter.

Translation of the data flow graphs basic code blocks follows translation of the symbol table. A block in the data flow graph is a sequential list of nodes. A node is an operation performed on one or more input operands, with one or more outputs. The operation is represented as an ASCII string opcode. The operands are represented as an integer indicating a pseudo register number containing an input or output value. Alternately, an input operand may be a constant. In translating a data flow graph block, four CFG-DFG to HDL converter verilog generator tables are built. There is a BLOCKS table, which is a list of the code blocks. The RAW_NODES table is a sequential list of the nodes contained in the block. The PRS table is a list of the pseudo registers defined and the constants and pseudo registers referenced by each node. The CONSTANTS table contains any constant values used in the procedure being compiled.

The translator passes thru the data flow graph's blocks array, processing one block at a time. Each new block gets and entry in the CFG-DFG to HDL converter BLOCKS table. A CFG-DFG to HDL converter BLOCKS table entry contains indices to the first and last CFG-DFG to HDL converter RAW_NODES table entries for the nodes in the block, which are described below. If the block is an exit block, meaning it is a block containing a return from the procedure being compiled, no additional information is entered into the BLOCKS table entry. If the block is a drop thru block, meaning it does not end with a conditional branch, the index to the BLOCKS table entry for the successor block is entered into the current block's BLOCKS table entry. Otherwise, the block must end with a conditional branch. In this case, the BLOCKS table indices of the two possible successor blocks (the branch true block and the branch false block) are entered into the current blocks BLOCKS table entry.

The RAW_NODES table entries are constructed by the translator passing thru each node in the block. Processing of a node proceeds as follows. Each output pseudo register is entered into the PRS table. As it is an output, and thus defined by the operation of the node, a flag is set in the PRS table entry indicating it is defined by that node. The pseudo register number is also inserted into the PRS table entry, along with the index of the parent nodes RAW_NODES table entry in inserted into each PRS table entry as well. After the output pseudo registers are processed for the node, the inputs are processed. Input pseudo registers are entered into the PRS table in the same manner as the outputs, except the defined flag is not set on their entries. An inputs to a node which is a constants also gets a PRS table entry. When a constant input is encountered, the CFG-DFG to HDL converter CONSTANTS table is searched for an entry that matches the current constant. If a match is found, the index of the match is used, otherwise a new CONSTANTS table entry is made and the index of the new entry is used. The PRS table entry for a constant has the CONSTANTS table entry inserted to it, a flag set indicating this is a constant and not a pseudo register reference entry, and the parent node's RAW_NODES table index inserted into it.

When all the inputs and outputs for a node are processed, a RAW_NODES table entry is made for the node. The RAW_NODES table entry contains the opcode of the node, the PRS table indices of the first and last PRS table entries associated with the node.

When all the nodes have been translated, the translator writes out the CFG-DFG to HDL converter tables built thru the translation of the data flow graph to the .grf output file, and processing is complete.

CFG-DFG into HDL Conversion

One component of a compilation system for reconfigurable FPGA chips is described. The compilation system has the capability to compile higher level languages such as C and Fortran into configuration bitstreams for an FPGA that operates within a larger execution framework.

The larger execution framework is specific to the design of the SRC MAP product. The compilation system is, in theory, readily adaptable to any arbitrary such environment.

The component described is "CFG-DFG to HDL converter". The purpose of CFG-DFG to HDL converter is to convert the output of "the CFG to CFG-DFG converter" into Verilog language. Verilog is a hardware description language (HDL) that can serve as input to the standard toolset provided by the manufacturers of FPGA chips.

The CFG to CFG-DFG converter is another component of the compilation system. The purpose of The CFG to CFG-DFG converter is to process the op-codes of a traditional high level language compiler into a form more suited for pipelined execution on the MAP/FPGA system.

The CFG to CFG-DFG converter output essentially consists of a data flow graph (DFG) created from the traditional output of a compiler, which is more of a control flow graph (CFG) form. CFG-DFG to HDL converter does not require the DFG form to perform its functions. It can also readily work with CFG style input. However, efficient execution in the MAP/FPGA requires the DFG form.

The overall compilation strategy is that the Verilog language created by the Traditional Compiler/The CFG to CFG-DFG converter/CFG-DFG to HDL converter combination serves as the guide for how to connect pre-defined "hardware" modules together to achieve an efficient representation on the FPGA/MAP of the user code. Thus, CFG-DFG to HDL converter does not perform any "synthesis" of op-code constructs into Verilog language. CFG-DFG to HDL converter simply selects from a known set of pre-defined hardware modules those modules that match the functionality that a specific op-code node requires, and provides the interconnections between them. The creation, maintenance, and management of the pre-defined hardware modules is a major component of the overall compilation effort, and is not discussed here, except for a discussion of how the relationship between op-code nodes and pre-defined hardware modules is managed.

While performing its tasks, CFG-DFG to HDL converter manages a set of internal tables that represent various pieces of information required for the processing. Eventually, the tables have enough information such that the Verilog representation of the user code can be output. Input files for CFG-DFG to HDL converter consist of a simple file format, which contains some information already pre-processed into CFG-DFG to HDL converter table format.

Note that CFG-DFG to HDL converter only has a single table format. Table management is simplified by only allowing the addition, and not deletion, of table entries. Entries can be marked invalid with flags, and simply not copied to further stages of table development. Table entries are also of fixed sized, making table searches rapid.

CFG-DFG to HDL converter inputs consist of command-line switches, and two types of input files. Command line switches are used to specify the names of input files, and to control precise details of CFG-DFG to HDL converter processing. For the purpose of this document, the details of CFG-DFG to HDL converter processing controlled by these switches are unimportant. Hence, the only substantive inputs are the two types of input files as discussed here.

An input op-codefile is specified with the "-f" switch. Only one op-code file may be input. This file consists of the data flow graph output of the CFG to CFG-DFG converter converted to CFG-DFG to HDL converter file format by the translator utility called "dfg2grf" described above.

Op-code nodes: An op-code node consists of the name of the node, and lists of input and output pseudo registers. A pseudo register is simply a number, and is used to correlate the flow of data between nodes.

Block information. Indicates how the opcodes are divided into basic blocks. A basic block has the same definition as in a traditional compiler, i.e.: a sequence of instructions with a single entry point and a single exit point.

Constants information. An op-code node may reference a constant value as an input, instead of a pseudo register.

"Scalars" Information. Information about arguments passed to the compiled subroutine function.

Filename information. Used to generate the output filename of the generated Verilog file.

Any number of "CFG-DFG to HDL converter info" files may be input by use of the "-a" switch. A "CFG-DFG to HDL converter info" file consists of "info" file information converted to CFG-DFG to HDL converter file/table format by the "info2grf" utility. The input to "info2grf" consists of an ASCII text "info" file, and is intended to be edited and maintained by developers/users.

The "info" file is the mechanism by which CFG-DFG to HDL converter makes the association between the op-code node names, and the resulting module names that are output in the Verilog language file. It can also be used to input information about a user-defined op-code/module relationship.

Information contained in the input CFG-DFG to HDL converter hardware logic module information file: "info" files contain all information about modules used by the compilation system as a whole. Only the information used by CFG-DFG to HDL converter is mentioned here. The information used by CFG-DFG to HDL converter is:

Name of the op-code node. Name of the module that corresponds to the op-code node. Latency in clocks of the time between inputs and corresponding outputs. A list of inputs, their bit-widths, and their names, in order as the pseudo registers appear in the op-code node in the CFG to CFG-DFG converter-output flow graph. A list of outputs, their bit-widths, and their names, in order as the pseudo registers appear in the op-code node in the The CFG to CFG-DFG converter-output flow graph. Names, bitwidths, and the external signal names to which they connect, of any hardware-related module I/O connections that are required for execution, but do not appear in the flow graph. (This would include, for example, a CLOCK signal, or enable/reset signals that may be implicit in the context of a given node's residence in a block).

CFG-DFG to HDL converter outputs: CFG-DFG to HDL converter output consists of a Verilog language file, which is ASCII text. The filename is generated from information carried in the op-code input file. In general, the filename is the "basename" of the high level language file, suffixed with ".v". For example, a high level language file named "toto.c" results in a Verilog language file named "toto.v".

The Verilog language file has three "include" statements referencing "PREAMBLE.v", "AMBLE.v", and "POSTAMBLE.v" "OBM_DR_SET.v" and "FR_SET.v". These three include statements bracket and divide the declarative and instantitive sections of the generated Verilog code. They allow the generated Verilog code to be used without modification in a variety of execution and simulation environments, by providing different files to resolve the includes.

CFG-DFG to HDL converter Processing Flow: Initialization: Initialization processing of CFG-DFG to HDL converter consists of validating the command line switches, and reading the input files. The data within the input files is read directly into internal CFG-DFG to HDL converter tables.

One of the primary functions is the creation of many internal tables that contain information to be used throughout CFG-DFG to HDL converter processing. The two most primary tables that are created are the EQUIV_IN and EQUIV_OUT tables. These tables contain the essence of the information contained in the "info" files. The entries in these two tables have a one-to-one correspondence, and direct CFG-DFG to HDL converter to convert a given named op-code node in the input flow graph to a given instantiation of a pre-defined hardware module in the output Verilog file. A MODULES table is also created, which has the details of the module connections for the modules indexed by EQUIV_OUT.

Various tables for special purpose processing are also created at initialization. This allows information for target hardware specific processing to be contained in one area of the source code. All special purpose processing specific for the target hardware environment can be controlled, for example, by the various flags and table settings generated in this initialization phase. It is thus possible to re-target CFG-DFG to HDL converter processing for another platform by first, adding such functionality as required elsewhere, and then selecting the initialization processing that would occur to enable this. In theory different execution environments could be supported through the simple use of command-line switches.

Such special case target hardware specific processing includes support for: Lists of global signals that the non-pseudo register-related connections of modules will connect to. Information regarding the memory banks and how memory related op-code nodes will be connected. Information regarding the "MIRROR" modules, which are the SRC mechanism for connecting parameters input to the compiled subroutine to the FPGA instantiated design, and potentially returning an updated value. Connections to "code_block_reset" will actually be connected to the "block_reset" signal of the current block of residence for a given module.

Process raw input to the internal tables: The input table of op-code flow graph nodes is read into the NODE table, and the names of the op-code nodes are searched for in the EQUIV_IN table. When found, the corresponding EQUIV_OUT table entry gives the MODULE index of the predefined hardware module. An index to this module information is placed in the NODE table.

Verify consistency of bit widths between op-code nodes: Now, all op-code nodes in the NODES table have an assigned hardware module. All the pseudo registers are now examined, to verify that there is consistent bit-width matching for pseudo registers marking the output of one module going to the input of another module. While this work is performed, a table containing pseudo register information is built.

Note that CFG-DFG to HDL converter has no information about, or need for, the "type" of the data that flows between modules. Only the bitwidth is important.

Mark certain shift functions for "inlining": The NODES table is examined, and certain modules that represent a "shift" operation are processed. The name convention of the module indicates whether the shift is by a constant amount, and by how much. If the module is such a shift, this fact, and the direction of the shift, is marked in the NODES table entry with flags. The shift count for the module is also extracted and placed in a field of the NODES table entry. This information will be used during output of the generated Verilog code to "inline", or represent directly with Verilog code syntax, the functionality of the module without actually instantiating the module.

Analyze op-code node dependency: The NODES table and associated psuedo registers are now examined to create a table of node dependencies (NODE_DEPS). The NODE_DEPS table indicates which op-code nodes in the NODES table are pre-requisites of (i.e. have data flowing directly to, via a pseudo register) other op-code nodes.

Op-code nodes are issued as follows: The NODE_DEPS table is examined, and a total count of number of predecessors for a given NODE entry is created and stored in the NODE table entry. A "clock counter" in every NODE table entry is zeroed. A table is created (PICT_NODES) that has a list of every NODE entry that has a predecessor count of zero.

Issue op-code nodes as follows: Placement of a NODES table entry's index in the PICT_NODES table is the basic indication that an op-code node has been "issued". When the PICT_NODE entry is made, an entry is also made in a table listing the specific instance of the module. (INSTANCES table) Since there might be many instances of the same module type, it is through the INSTANCES table that unique names are generated for each instance of a given module type.

After an initialization phase as described above, the process of issuance of op-code nodes continues as follows: For all new entries in the PICT_NODES table, examine the NODE_DEPS table and decrement the predecessor count in those NODE table entries who have the issued op-code node as a predecessor. Adjust the clock count of each affected NODE table entry by the latency of the module who was the predecessor. Create an associated INSTANCES table entry for each node newly added to the PICT_NODES table.

Perform "wiring" of outputs of predecessor INSTANCES table entries to the newly created INSTANCES table entries by building up information in the WIRING table. The WIRING table has information regarding source and destination INSTANCES table index, and the argument, or parameter, number.

Now examine the NODES table for op-code nodes whose predecessor count has newly gone to zero. add these entries to the PICT_NODES table, and continue as above. Continue this process until all op-code nodes have been issued.

Output HDL file: Processing has now developed to the point where the output of the HDL file can commence. There is still some processing that occurs during this process including emitting declarative statements for all "wire" connections and wiring to connect the basic blocks to each other.

For all entries in INSTANCES table, first check to see if it has been "inlined". If so, output appropriate HDL syntax. If not, output instance declaration of the appropriate module, and the connections of the module's I/O pins to the various wires etc. as described in the WIRING table.

Bitstream Configuration

A component of the compiling system that does the inclusion of the bitstream file created from the Xilinx tools into a compilable C code that will ultimately be integrated into the user's executable. This component takes as input 1 or 2 FPGA bitstream files which are in a binary files containing programming data only. The result of this compilation phase is a C code that contains two structures, one for each fpga bitstream. Each structure contains the packed representation of the FPGA bitstream contained in an array, described below; a pointer to the internal location for the bitstream; the number of the FPGA this bitstream represents, the length of the bitstream array; the address of the beginning of the bitstream array; and, a pointer to the C version of the MAP routine used for emulation.

The FPGA bitstream files are read into a buffer as 4096 byte quantities. This buffer is then packed into 64-bit words and written out to the bitstream array contained in the appropriate bitstream's structure. The last quantity read from the bitstream file is padded out to be complete 64-bit words and those words are also written out to the array. After completing the entire bitstream file, a check is done to determine if the last word is the last word of the cache line. If not, more padding is done to ensure that the last array words completely fill out the 4 word cache line on the micro-processor system.

After completing the translation of the bitstream file, the remaining information and pointers are inserted into the structure that represents the first FPGA bitstream. The same process is done again to read in and translate the second FPGA bitstream. Either one of these bitstreams may be present, or neither may be present for this compilation phase. The bitstream configurator handles all cases of null or present fpga bitstream files and build the appropriate data structures to reflect that.

Integration into a Unified Executable

As a result of creating object files that will be executed on different and therefore non-homogeneous platforms, the next step in the compilation process must bring these various components together to build what will be referred to as a "unified executable". A unified executable, then, contains both the machine code that will execute on the instruction processor as well as the machine code that will execute on the hardware logic processor.

Since the unified executable resides in the address space of the instruction processor during its execution, the format of the unified executable must be compatible with the application interface accepted by the instruction processor. In order to allow fpga bitstreams to exist within the unified executable, a method was developed to encapsulate the bitstream data into an acceptable format.

Once bitstreams have been generated by the compilation process, they are read into C structures, with one C structure created for each bitstream being accessed in this program. These C structures are unique to each bitstream, as they have been named to match the internal name created during the control flow information file generation phase. Tagging the separate control flow information files with unique names allows the resultant bitstream to also have a unique identifier when built into a C structure. If the bitstream configuration is meant to be used in another compilation process, the C structure could be saved at this point as a binary file.

Bitstream C structures can either reside in the unified executable or on the microprocessor at a location that has been made available during execution. By default, the bitstreams created during the compilation process are embedded in the unified execution and therefore are in the address space at execution time. If there are many bitstream structures being configured for a particular executable, then it is possible to embed only some or none of the bitstream C structures in the unified executable. If not all of the bitstream structures reside in the executable's address space at execution time, then the runtime environment will need to read in the appropriate bitstream structures at the point where the hardware logic configuration for that bitstream is invoked.

After deciding whether to include the bitstream C structures in the unified executable, the available standard linker on the microprocessor can be used to create it from the object files. Since all the object files are of the appropriate binary interface, nothing special must be done to accommodate including both micro processor machine code and hardware logic machine code.

Figure 30:
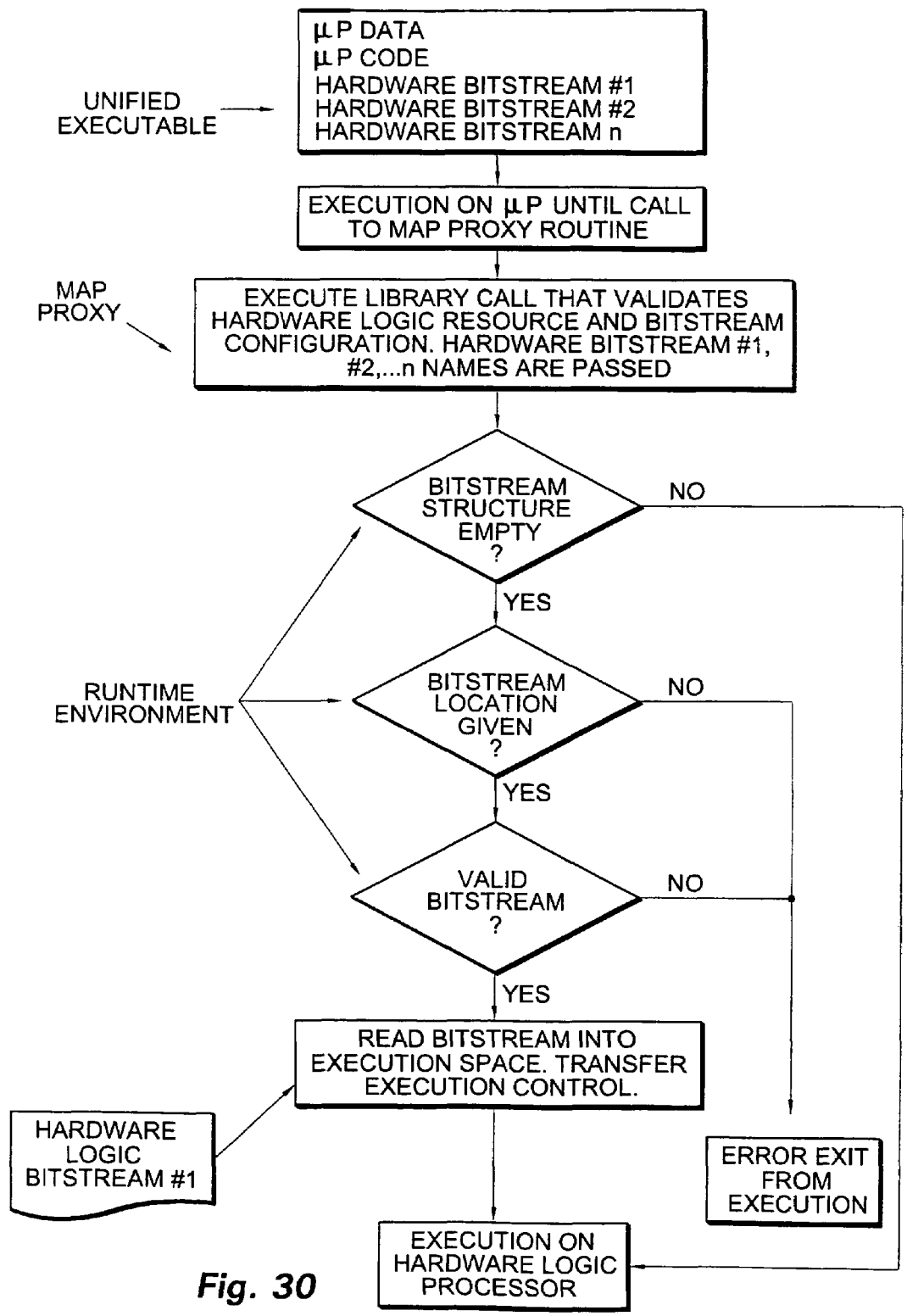
FIG. 30 shows a flowchart for forming a unified executable according to an embodiment of the invention.

As shown in the following diagram, the bitstreams representing the hardware logic configuration to be run at execution time may exist in one of two locations shown in FIG. 30.

Runtime Environment

The runtime environment in which the unified binary executes may be extended beyond the runtime environment in which an instruction processor binary executes. The MAP library may include support routines for emulation and simulation of a dataflow graph. From a user view, there are three categories of routines in the runtime environment: memory management, MAP resource management, and MAP execution.

Memory Management: Hardware limitations may require blocks of memory transferred between the instruction processor environment and the reconfigurable processor environment to start on cache boundaries. Two functions are provided to aid in cache alignment in the event such hardware limitations are present.

The first function, addr32 (or, alternately IADDR32 for Fortran), is a software module including logic instructions for accepting an arbitrary memory address and returning the address of the first cache aligned word of memory which is equal to or greater than the input address argument. An array that is to be aligned may be declared with padding at the beginning and end of the array that approximates the memory of a cache line. A pointer may be declared to point to the cache aligned array. The padded array may be passed as an argument to addr32, and the pointer may be set to the result of the function. References to the aligned array may be made thru the pointer.

The second function, Cache Aligned Allocate (Alternatively CACHE_ALIGNED_ALLOCATE for Fortran) is software module that includes logic instructions for receiving a single integer argument and generating a pointer to the allocated space which begins on a cache aligned boundary. The argument may be the size of the memory allocation request in bytes. This function may be used to declare a pointer. In addition, users may call this function to allocate the required space for an array, and set the pointer to the result of the function. References to the array may be made thru the pointer.

MAP resource management: It is possible to dynamically modify the runtime environment by adding and deleting reconfigurable hardware resources to the job. While executing on the instruction processor, no MAP resources are needed. Prior to executing a MAP procedure, reconfigurable hardware resources must be allocated to the job. This could occur at job start-up time, or anytime prior to MAP execution. After execution of the MAP procedure, execution of the unified binary may not require MAP resources for some time, so it may be desirable to release one or more MAP processors until they are again needed. Similarly, it may be necessary to add additional map resources prior to executing another MAP procedure. Two functions are provided to manage MAP resources.

The first function, map allocate (MAP_ALLOCATE (N, STAT) for Fortran) is a software module that receives a single input argument that indicates the number of MAP resources to be allocated. A zero result value (STAT for Fortran) indicates successful allocation. A non-zero result (STAT) indicates the request was not successfully satisfied.

The second function, map_free (MAP_FREE (N, STAT) for Fortran) is a software module that has a single input argument indicating the number of MAP resources to release from the job. A zero return value (STAT for Fortran) indicates the resources were successfully freed from the job. A non-zero return value (STAT) indicates an error was encountered in trying to release the resources.

MAP resources are identified by a MAP id number. The first MAP allocated to a job has a MAP id of 0. If n resources are allocated to a job at any time, they are identified as 0, 1, . . . n−1. MAP resources with the largest valued MAP id numbers are deallocated first. For example, if seven MAP resources are allocated to a job, they are identified by the integers 0 thru 6. If three are deallocated, MAP ids 0 thru 3 remain allocated to the job. If two are then allocated, the most recently allocated MAP ids are 4 and 5.

MAP execution: The details of configuring the reconfigurable hardware with the logic bitstreams, and the details of transfer of control to the reconfigurable hardware and back to the instruction processor hidden from the user in the runtime environment. The MAP proxy code generated by the HLL converter performs these tasks. The routine MAP_Execute called by the proxy code is discussed here.

MAP_Execute and its various runtime entry points perform the following functions. First, the MAP proxy code has indicated which MAP resources are to be used for execution of the MAP procedure. MAP_Execute locks the resources to prevent other threads of execution (or user jobs) from accessing the resources while the MAP procedure is executing. It checks to see if the resources to be used are correctly configured with the user logic for the MAP procedure to be executed. If not, it locates the appropriate logic bit streams and configures the MAP resources. Execution on the reconfigurable hardware is initiated. MAP_Execute waits for execution to complete, unlocks the resources, and then signals completion to, or transfers control back to the instruction processor.

Emulation in the Runtime Environment

Emulation is a very useful debugging tool as well as a tool that allows performance profiling at the data flow graph level. Emulation capability is built into the run time environment of executables built by the MAP compiling system.

Figure 31:
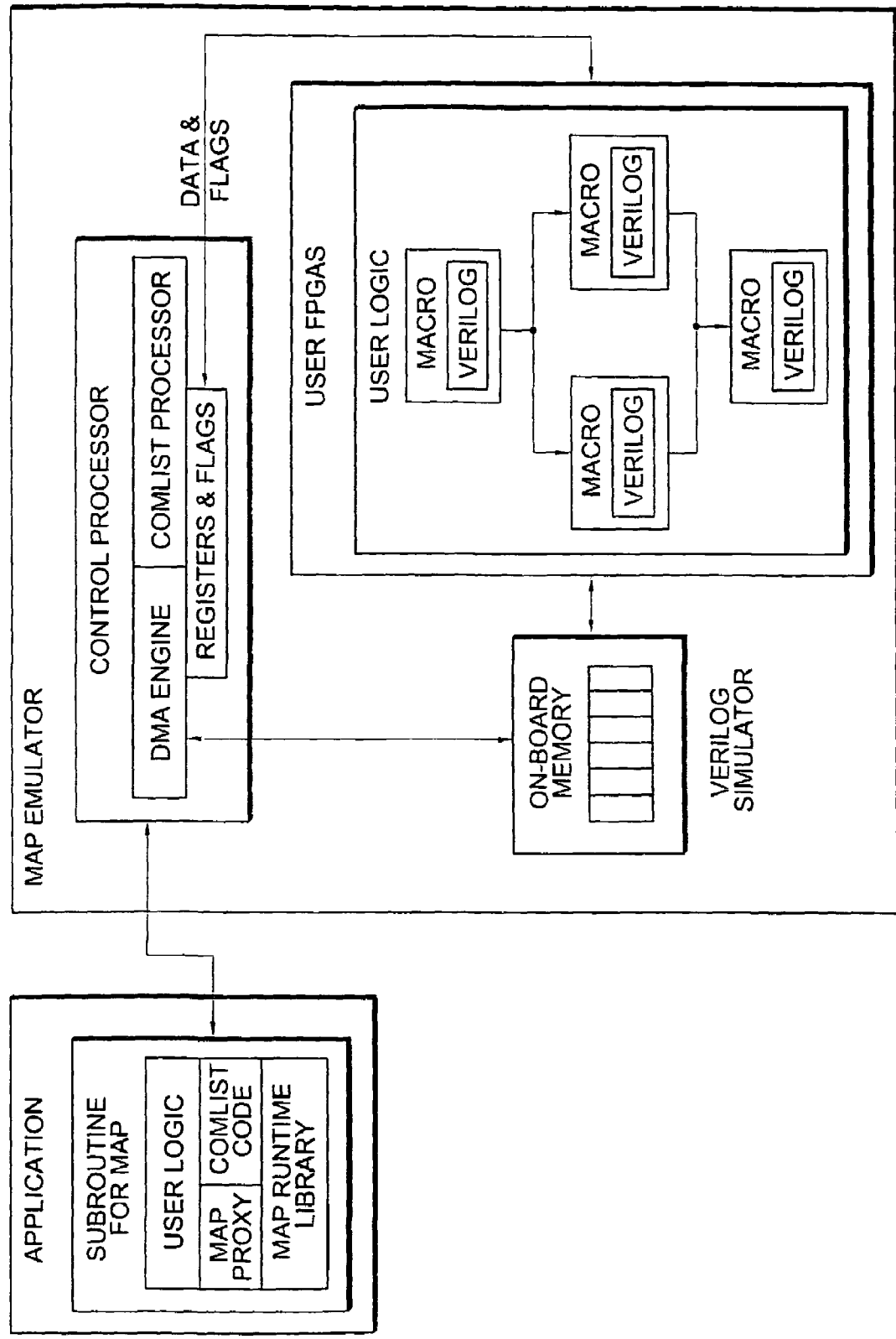
FIG. 31 shows an example MAP emulator system according to an embodiment of the invention.
Figure 32:
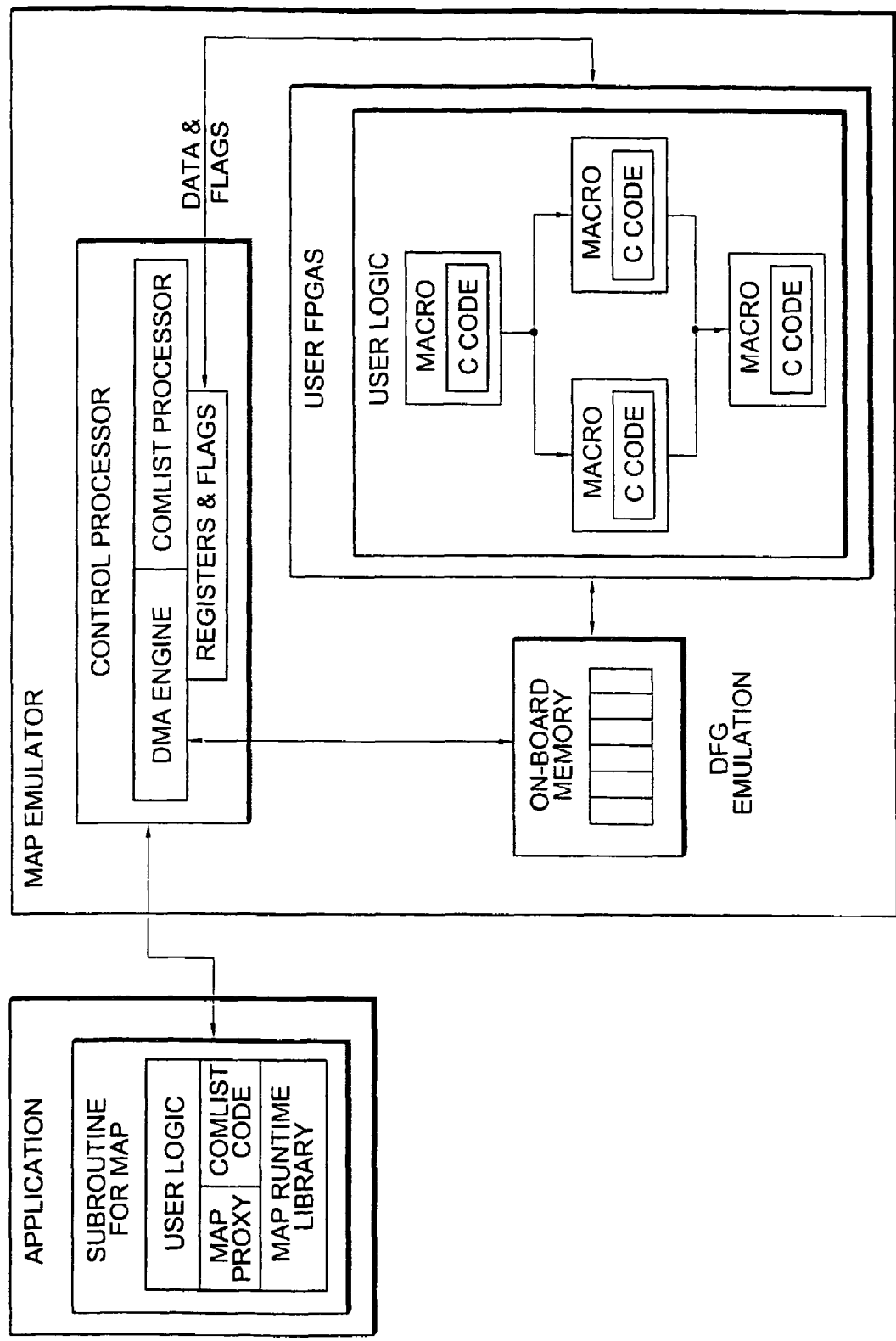
FIG. 32 shows another example of a MAP emulator system according to an embodiment of the invention.

The run-time libraries support three distinct environments: 1) execution with MAP hardware, 2) execution with emulated MAP and dataflow graph emulation, 3) execution with emulated MAP, and simulated user logic. The selection of the particular environment is done at run-time based on environment variable settings:

MAPHW = MAPIII - indicates executing with MAP hardware
MAPHW = EMUIII - indicates executing with the MAP emulator If emulation mode is being used, an additional environment variable determines how the logic for the MAP is handled:

ULOGIC_TYPE = EMU- indicates that data flow graph emulation is to be used
ULOGIC_TYPE = SIM - indicates that user logic will run in a Verilog Simulator When MAPHW=EMUIII is set, the run-time library routines that manage the MAP call MAP emulation routines instead of the MAP hardware support routines. Every executable is capable of running on either hardware or in emulation. The MAP Emulator takes the place of the MAP control processor and its resources: the communication link, the Onboard Memory, Data Registers, and Flag Registers, providing software emulation versions of these resources. FIGS. 31 and 32 show the structure of the MAP emulator.

The MAP Emulator executes as pthreads separate from the instruction processor application code and processes. The emulator threads are started when the run-time routines detect that emulation mode is selected rather than MAP hardware mode. Just as the MAP hardware runs asynchronous to the instruction processor, the emulator also run asynchronously.

The function of the MAP emulator is to emulate the communication and control link to the instruction processor based application, and to provide interfaces to the User Logic running in Data Flow Emulation or as Verilog Simulation.

Data Flow emulation runs also as a separate pthread interfacing to the MAP emulator through the interface routines used to read or write Flag registers, Data Registers, and On-Board Memory.

If the user logic generated by the MAP compiler has been created as Verilog, a Verilog simulator can be used to execute the user logic together with the MAP emulator. The Verilog simulation is run as a separate executable that communicates with the MAP emulator through a shared memory segment. In this case the simulator provides the Onboard memory, Data registers and Flag Registers, while the MAP emulator provides the MAP control processor.

FIG. 31 shows the MAP emulator together with DFG emulation, and FIG. 32 shows the MAP emulator with a Verilog Simulator.

In another embodiment, dataflow graph emulation may be conducted as follows: The CFG to CFG-DFG converter step of the MAP compiler creates two files: a dataflow graph (in text form) of the user's subroutine, and an emulation logic file. The dataflow graph file may be dual purpose: It may be used by the CFG-DFG to HDL converter to produce a Verilog translation of the subroutine, and it also may be read in by the emulation logic routine when emulation is being used to validate the source code or to collect performance data.

In an embodiment, a dataflow graph may include nodes and directed edges, where nodes may be functional units and edges are data connections that carry output values from one node to inputs of other nodes. It may be possible to run a dataflow simulator using the dataflow graph. Simulation can be useful to: 1) validate both the source code and its translation to dataflow form, 2) print trace information for debugging and, 3) gather performance estimations, among other functions.

In an embodiment Dataflow simulation may take place in a token driven simulation mode that may be a loosely coupled, asynchronous simulation where sequencing may be valid but time is not taken into account. In this mode, there is no notion of things happening "simultaneously". Any node can be executed at any time, as long as there are values available on its inputs. The data values are called "tokens", and tokens can queue at the input ports of the nodes. In another embodiment, a clock accurate simulation takes into account the system clock and the execution latencies of the functional units. Here the word "simultaneous" has meaning.

Figure 33:
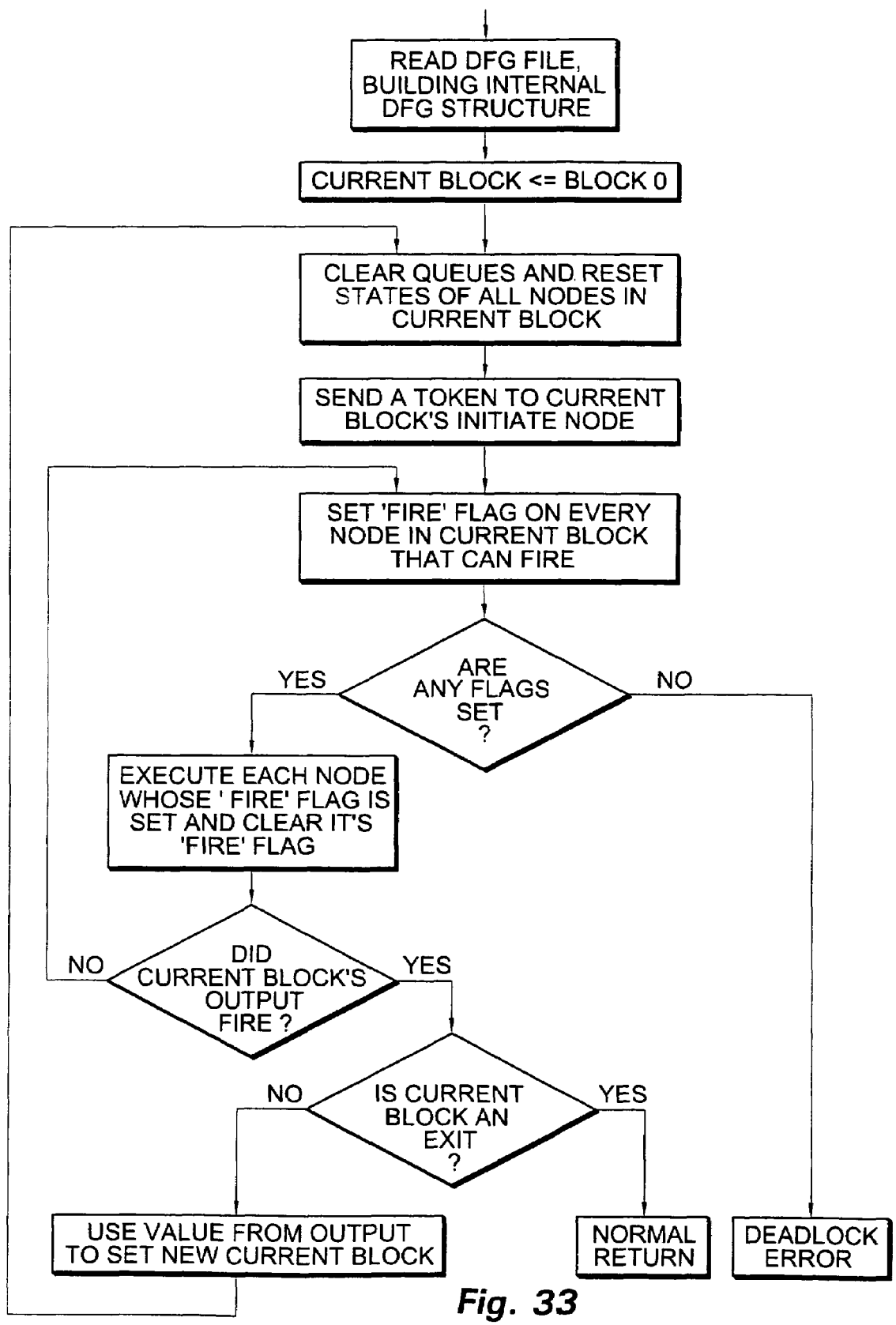
FIG. 33 shows a flowchart of a dataflow simulator according to an embodiment of the invention.

FIG. 33 shows a flow chart of an embodiment of a token driven dataflow simulator. In one example of an embodiment, the routine "dfg_simulate" may be called from the emulation logic file to start the simulator. In this example, the simulator may start by reading the DFG file and building an internal representation. Then it begins the simulation, starting with block zero (by definition, the entrance block). Each time it simulates a code block, it first clears the queues and node states, then triggers the block's execution by sending a single token to the INITIATE node at the top of the block. It then loops, looking for nodes that can fire. In this example, the "firing rule" for most nodes is that the node can fire if there is a token available on every one of its inputs. "Firing" consists of taking a token from each input queue, and using these values to perform the node's particular function. That function produces one or more output values, which are sent out as tokens on the node's outputs. When an output fans out to multiple nodes, a value token may be delivered to each of the queues of the target nodes.

Figure 34:
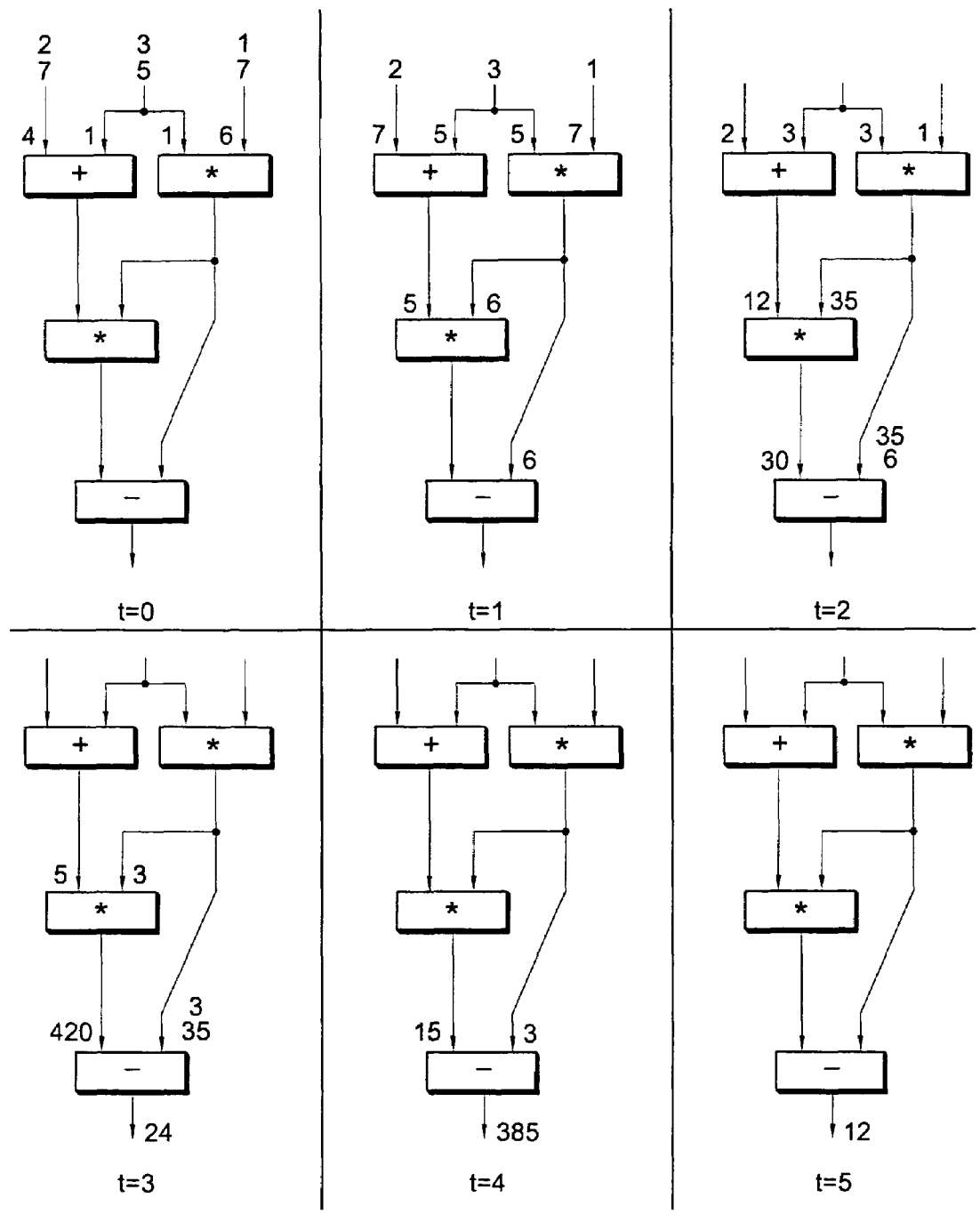
FIG. 34 shows an example of token flow in a dataflow simulation according to an embodiment of the invention.

FIG. 34 shows an example of a DFG fragment according to an embodiment, where the fragment is stepped through each iteration of the simulator's inner loop. Three values are waiting on the input queues at the start. The top two nodes are marked as able to fire. They consume a token from each queue, and send result tokens to the queues of the nodes fed by their outputs. Note that at t=1, the bottom node has a value on its right input, but none on its left input, so it cannot fire. At t=2 there are two tokens in the queue of the right input of the bottom node. After five passes of the simulator's inner loop, this fragment has no more values that can be processed.

There are, in general, many correct firing orders for a dataflow graph. It would have been equally valid, in the above example, to have fired the upper nodes three times before firing any of the other nodes. The fact that tokens arrive in queues in order, ensures that corresponding values on the inputs of each node will "match up" correctly. The node input queues in the simulator are designed to expand as needed: any time a value is sent to a queue and the queue is full, the queue size is increased to accommodate the new value. The processing order shown in the flow chart, where in each sweep across the nodes a node will fire only once even if it had more values it could have processed, may be chosen so as to minimize the necessary queue lengths.

Various node firing orders that may occur during asynchronous dataflow simulation produce equivalent results when the dataflow nodes are "pure functional", that is, when each node's output tokens(s) may depend on the input tokens that have been fetched to compute the outputs. Not all nodes may be pure functional. Some nodes may have "state", i.e. they have some memory of what they have done previously. These nodes may be called "stateful". Some nodes may interact with the surrounding hardware, i.e. they read or write to flag registers, data registers or on-board memory. The dataflow simulator may execute these nodes by making calls to the appropriate MAP emulator functions.

In another embodiment, dataflow simulation may take place in a mode that more closely mimics what happens on reconfigurable hardware. Clock-accurate simulation assumes the existence of a system clock, and the functional units execute synchronously, coordinated by the clock. In the hardware, every functional unit may perform an operation in every clock cycle, regardless of whether there are valid data on its inputs. The dataflow graphs, and the logic circuits that are produced from the graphs, may be produced in such a way that "junk" data from the functional units is ignored.

Clock-accurate simulation may be very wasteful of compute time if it operates in a mode where each node of the graph computes in every clock cycle. In an embodiment, it is possible to simulate in a mode where valid computations are performed by the dataflow nodes, as in token-driven simulation, and the synchronous aspect of the system is captured by attaching "time stamps" to the tokens. The simulation queues up tokens on the inputs, and the node firings and executions may match up values on the queues by their time stamps.

Though clock-accurate simulation may be more complex than asynchronous token-driven simulation, they may more closely reflect the operations and synchronization that occur on reconfigurable hardware. Thus a clock-accurate simulation has the following advantages: 1) Incorrectly-placed delay nodes will produce error indications in a clock-accurate simulation, whereas they will appear to execute correctly in an asynchronous simulation. 2) Clock-accurate simulation can give accurate execution time predictions, since it simulates the system clock. 3) When reads and writes to the same memory bank occur in an asynchronous simulation, the order in which they occur may be unspecified and therefore they may not occur in the same order as they would occur on the reconfigurable hardware. But clock-accurate simulation may produce an execution order that is guaranteed to match what happens on the hardware.

In another embodiment, issues related to the simulation of dataflow graphs produced by the MAP compiler are addressed, including:

Stateful node issues: A stateful node has one or more internal fields in its node structure that it uses to keep track of some aspect of what has occurred in the past. One example of a stateful node is an accumulator that sums up the values of the token stream on its input. An accumulator node needs a place in its node structure to hold the current value of the accumulating sum. Other node types may require more complex state. The dataflow node structure has the field of type "NodeState", which is defined by the struct:

```
typedef struct {
    int initialized;
    void *state;
} NodeState;
```

In an embodiment, whenever a code block is entered, the "initialized" fields of its stateful nodes are set to "false". The node execution routine for stateful nodes will check this field, and if it is false they may perform an initialization, typically by allocating a data structure appropriate for the state of the node type, and setting the "state" pointer to point to it. The fields of that structure are also set to an appropriate initial state. The "initialized" field is then set to "true" so that subsequent firings of the node will not attempt to reinitialize.

Firing and Execution Rules: In an embodiment, each node type in a dataflow graph has two functions associated with it: a "firing rule" and an "execution rule". The firing rule for most nodes may be simple: a node can fire when there may be a data value on every one of its inputs. There may be a few exceptions to this in the case of loop control nodes that manage the pipelined behavior of a loop dataflow graph. The execution rule for a node is the specification of how it uses its input values to create its output values, i.e. the execution rule may be the node's function. When the simulator reads the dataflow graph file and builds the internal node structures, each node has two function pointers that may be used to point to the firing and execution functions for that node.

User Macros: In an embodiment, the MAP compiler allows users to reference their own hardware logic units when compiling codes to reconfigurable hardware. In order to do dataflow simulation of a compiled code, the user supplies an execution function for each unit being referenced. This is the "execution rule" for the node. For user macros, it is assumed that it will obey the "normal" firing rule, i.e., that the node can fire when there is a value on every input. The dataflow simulation routines for user macros are read in from the "info" file and are then handled internally in the same way that the SRC built-in macros are handled: the user's simulation function may be compiled and the associated dataflow nodes are given pointers to the function.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

We claim:

1. A method of forming a unified executable comprising:
   converting a high level language source code into a control flow graph representation;
   converting the control flow graph representation into a control-dataflow graph representation;
   partitioning the control-dataflow graph into an instruction processor portion and a reconfigurable hardware portion;
   converting the reconfigurable hardware portion of the control-dataflow graph into a hardware definition language portion and the instruction processor portion into an instruction processor object file;
   converting the hardware definition language portion into a reconfigurable hardware bitstream;
   converting the reconfigurable hardware bitstream into a bitstream object file that is readable by an instruction processor; and
   integrating the bitstream object file with the instruction processor object file to form the unified executable.

2. A system for forming a unified executable that is executable on a hybrid reconfigurable hardware-instruction processor computer, said system comprising:
   a high-level language converter to convert a high-level language into a control flow graph representation;
   a control flow graph to control-dataflow graph converter to convert the control flow graph representation into a control-dataflow graph representation;
   a partitioner to partition the control-dataflow graph representations into a reconfigurable hardware portion and an instruction processor portion;
   a control-dataflow graph to hardware definition language converter to convert the reconfigurable hardware portion of the control-dataflow graph representations to a hardware definition language file;
   a hardware definition language to bitstream converter to convert the hardware definition language file to a bitstream file;
   a bitstream to object file converter to convert the bitstream file into a bitstream object file; and
   a linker to integrate the bitstream object file into the unified executable.

3. A computer-readable storage medium tangibly embodying a program of instructions executable by a machine wherein said program of instructions comprises a plurality of computer readable program codes for forming a unified executable, said program of instructions comprising:
   computer readable program code for causing a computer to convert a high level language source code into a control-dataflow graph representation;
   computer readable program code for causing a formation of a unified executable, the computer readable program code comprising:
   computer readable program code for causing the computer to partition a control-dataflow graph into an instruction processor portion and a reconfigurable hardware portion;
   computer readable program code for causing the computer to convert the reconfigurable hardware portion of the control-dataflow graph into a hardware definition language portion and the instruction processor portion into an instruction processor object file;
   computer readable program code for causing the computer to convert the hardware definition language portion into a reconfigurable hardware bitstream;
   computer readable program code for causing the computer to convert the reconfigurable hardware bitstream into a bitstream object file that is readable by an instruction processor; and
   computer readable program code for causing the computer to integrate the bitstream object file with the instruction processor object file to form the unified executable.

4. The computer program product of claim 3 further comprising:
   computer readable program code for causing the computer to convert a control flow graph into the control-dataflow graph.

5. The computer program product of claim 4 further comprising:
   computer readable program code for causing a computer to convert the high level language source code into the control flow graph representation.

* * * * *